US012563797B2

(12) United States Patent
Lin et al.

(10) Patent No.: US 12,563,797 B2
(45) Date of Patent: Feb. 24, 2026

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Yu-Ru Lin, Hsinchu (TW); Shu-Han Chen, Hsinchu (TW); Chun-Heng Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 638 days.

(21) Appl. No.: 17/659,700

(22) Filed: Apr. 19, 2022

(65) Prior Publication Data

US 2023/0117889 A1     Apr. 20, 2023

Related U.S. Application Data

(60) Provisional application No. 63/256,196, filed on Oct. 15, 2021.

(51) Int. Cl.
H10D 62/10      (2025.01)
H10D 30/67      (2025.01)
(Continued)

(52) U.S. Cl.
CPC ....... H10D 62/118 (2025.01); H10D 30/6713 (2025.01); H10D 30/6735 (2025.01);
(Continued)

(58) Field of Classification Search
CPC ......... H01L 29/0665; H01L 21/823412; H01L 21/823418; H01L 21/823481;
(Continued)

(56) References Cited

U.S. PATENT DOCUMENTS

| | | | |
|---|---|---|---|
| 9,425,293 B1 * | 8/2016 | Balakrishnan | .... H01L 29/78696 |
| 2007/0287260 A1 * | 12/2007 | Wu | ................... H01L 21/76232 |
| | | | 257/E21.549 |

(Continued)

FOREIGN PATENT DOCUMENTS

TW          202125820 A      7/2021

*Primary Examiner* — Bitew A Dinke
(74) *Attorney, Agent, or Firm* — Slater Matsil, LLP

(57) ABSTRACT

A method for forming a semiconductor device structure includes forming alternating first semiconductor layers and second semiconductor layers stacked over a substrate. The method also includes etching the first semiconductor layers and the second semiconductor layers to form a fin structure. The method also includes oxidizing the first semiconductor layers to form first oxidized portions of the first semiconductor layers and oxidizing the second semiconductor layers to form second oxidized portions of the second semiconductor layers. The method also includes removing the oxides over the sidewalls of the second semiconductor layers. After removing the second oxidized portions, an upper layer of the second semiconductor layers is narrower than a lower layer of the second semiconductor layers. The method also includes removing the first semiconductor layers to form a gate opening between the second semiconductor layers. The method also includes forming a gate structure in the gate opening.

20 Claims, 59 Drawing Sheets

(51) Int. Cl.
H10D 64/01 (2025.01)
H10D 84/01 (2025.01)
H10D 84/03 (2025.01)

(52) U.S. Cl.
CPC ....... H10D 30/6757 (2025.01); H10D 64/017 (2025.01); H10D 84/0128 (2025.01); H10D 84/013 (2025.01); H10D 84/0151 (2025.01); H10D 84/038 (2025.01)

(58) Field of Classification Search
CPC ......... H01L 29/42392; H01L 29/66545; H01L 29/78618; H01L 29/78696; H01L 29/6656; H01L 29/66439; H01L 29/7848; H01L 29/0673; H01L 29/775; H10D 62/118

See application file for complete search history.

(56) References Cited

U.S. PATENT DOCUMENTS

| | | | | |
|---|---|---|---|---|
| 2014/0353574 | A1* | 12/2014 | Li | H10D 62/8503 438/284 |
| 2017/0110595 | A1 | 4/2017 | Sengupta et al. | |
| 2017/0256609 | A1* | 9/2017 | Bhuwalka | H10D 30/43 |
| 2017/0358646 | A1* | 12/2017 | Fung | H01L 29/0684 |
| 2018/0145176 | A1* | 5/2018 | Wei | H01L 29/78654 |
| 2018/0175167 | A1* | 6/2018 | Reboh | H10D 30/797 |
| 2018/0277448 | A1* | 9/2018 | Chen | H01L 29/517 |
| 2019/0096996 | A1* | 3/2019 | Song | H10D 84/834 |
| 2019/0115438 | A1* | 4/2019 | Ching | H01L 27/0924 |
| 2019/0157420 | A1* | 5/2019 | Cheng | H01L 29/0673 |
| 2019/0172751 | A1* | 6/2019 | Smith | H01L 27/0924 |
| 2020/0006333 | A1* | 1/2020 | Noh | H10D 62/116 |
| 2020/0035676 | A1* | 1/2020 | Wang | H01L 29/785 |
| 2020/0035840 | A1* | 1/2020 | Vellianitis | H01L 29/045 |
| 2020/0051870 | A1* | 2/2020 | Chiang | H01L 29/78696 |
| 2020/0098859 | A1* | 3/2020 | Reboh | H01L 29/42392 |
| 2020/0273757 | A1* | 8/2020 | Ng | H01L 29/42392 |
| 2020/0335501 | A1* | 10/2020 | Dewey | H01L 21/84 |
| 2020/0381562 | A1* | 12/2020 | Jung | H10D 30/031 |
| 2020/0411530 | A1* | 12/2020 | Wong | H01L 29/0673 |
| 2021/0043763 | A1* | 2/2021 | Jung | H10D 30/62 |
| 2021/0057535 | A1* | 2/2021 | Chiang | H01L 29/0847 |
| 2021/0066294 | A1* | 3/2021 | Huang | H10D 64/017 |
| 2021/0083054 | A1 | 3/2021 | Liaw | |
| 2021/0098627 | A1* | 4/2021 | Liaw | H10D 30/0243 |
| 2021/0125986 | A1* | 4/2021 | Vellianitis | H01L 29/0649 |
| 2021/0126097 | A1 | 4/2021 | Ju et al. | |
| 2021/0126099 | A1* | 4/2021 | Young | H01L 29/66439 |
| 2021/0135011 | A1* | 5/2021 | Ju | H01L 29/7849 |
| 2021/0167218 | A1* | 6/2021 | Wang | H10D 64/017 |
| 2021/0210349 | A1* | 7/2021 | Xie | H10D 84/0151 |
| 2022/0005946 | A1* | 1/2022 | Kim | H01L 29/42392 |
| 2022/0013521 | A1* | 1/2022 | Zhang | H01L 27/1211 |
| 2022/0157811 | A1* | 5/2022 | You | H10D 64/251 |
| 2022/0173214 | A1* | 6/2022 | Park | H10D 84/017 |
| 2022/0208769 | A1* | 6/2022 | Chou | H01L 21/31116 |
| 2022/0238723 | A1* | 7/2022 | Jeong | H01L 29/0673 |
| 2022/0301936 | A1* | 9/2022 | Merchant | H10D 62/121 |
| 2022/0399463 | A1* | 12/2022 | Kim | H10D 30/6757 |

* cited by examiner

10a

110

108-1
106t-1
104t-1
106m-1 ← 106-1
104m-1 ← 104-1
106b-1
104b-1

111

109
102

106t-1
104t-1
106m-1 ← 106-1
104m-1 ← 104-1
106b-1
104b-1
137t
137m
111
137b
109
102
137

106b-1
104b-1
137b
102
111
109

10d

124

126

128
106t-1 106-1

106m-1

106b-1

126

111

109
102

10d 123  125    126  128   114a  114b 124   114

118
119

121

106t-1

117

116

106m-1

116

106b-1

102

110

108-2
106t-2
104t-2
106m-2 ← 106-2
104m-2 ← 104-2
106b-2
104b-2

111

109
102

110

108-2
106t-2
104t-2
106m-2 ← 106-2
104m-2 ← 104-2
106b-2
104b-2
111
109
102

104-2
104t-2
104m-2
104b-2

108-2  106-2
106t-2
106m-2
106b-2
102

110

108-2
106t-2
104t-2
106m-2 ← 106-2
104m-2 ← 104-2
106b-2
104b-2

111

109
102

10g

SEMICONDUCTOR DEVICE STRUCTURE AND METHOD FOR FORMING THE SAME

CROSS REFERENCE TO RELATED APPLICATIONS

This application claims the benefit of U.S. Provisional Application No. 63/256,196, filed on Oct. 15, 2021, the entirety of which is/are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2B-1, 2B-2, 2C-1, 2C-2, 2D-1, 2D-2, 2E-1, 2E-2, 2F-1, 2F-2, 2G-1, 2G-2, 2H-1, 2H-2, 2I-1 and 2I-2 are cross-sectional representations of various stages of forming a semiconductor device structure, in accordance with some embodiments of the disclosure.

FIGS. 2A-3, 2B-3, 2C-3 and 2D-3 are perspective representations of various stages of forming a semiconductor device structure, in accordance with some embodiments of the disclosure.

FIG. 2C-4 is an enlarged cross-sectional representation of forming a semiconductor device structure, in accordance with some embodiments of the disclosure.

FIGS. 3A-1, 3A-2, 3B-1, 3B-2, 3C-1, 3C-2, 3D-1, 3D-2, 3E-1, 3E-2, 3F-1 and 3F-2 are cross-sectional representations of various stages of forming a semiconductor device structure, in accordance with some embodiments of the disclosure.

FIGS. 3A-3 and 3B-3 are perspective representations of various stages of forming a semiconductor device structure, in accordance with some embodiments of the disclosure.

FIGS. 4A-1, 4A-2, 4B-1, 4B-2, 4C-1, 4C-2, 4D-1 and 4D-2 are cross-sectional representations of various stages of forming a semiconductor device structure, in accordance with some embodiments of the disclosure.

FIGS. 4A-3, 4B-3 and 4C-3 are perspective representations of various stages of forming a semiconductor device structure, in accordance with some embodiments of the disclosure.

FIGS. 5A-1, 5A-2, 5B-1, 5B-2, 5C-1, 5C-2, 5D-1, 5D-2, 5E-1, 5E-2, 5F-1, 5F-2, 5G-1, 5G-2, 5H-1, 5H-2 are cross-sectional representations of various stages of forming a semiconductor device structure, in accordance with some embodiments of the disclosure.

FIGS. 5A-3, 5B-3 and 5C-3 are perspective representations of various stages of forming a semiconductor device structure, in accordance with some embodiments of the disclosure.

FIGS. 6A-1, 6A-2, 6B-1, 6B-2, 6C-1, 6C-2, 6D-1, 6D-2, 6E-1, 6E-2, 6F-1 and 6F-2 are a cross-sectional representation of a semiconductor device structure, in accordance with some embodiments of the disclosure.

FIGS. 6A-3, 6B-3, 6C-3 and 6D-3 are perspective representations of various stages of forming a semiconductor device structure, in accordance with some embodiments of the disclosure.

FIGS. 7A-1, 7A-2, 7B-1, 7B-2, 7C-1, 7C-2, 7D-1, 7D-2, 7E-1 and 7E-2 are cross-sectional representations of various stages of forming a semiconductor device structure, in accordance with some embodiments of the disclosure.

FIGS. 7A-3, 7B-3 and 7C-3 are perspective representations of various stages of forming a semiconductor device structure, in accordance with some embodiments of the disclosure.

FIGS. 8-1 and 8-2 are a cross-sectional representation of a semiconductor device structure, in accordance with some embodiments of the disclosure.

DETAILED DESCRIPTION

Figure 1:
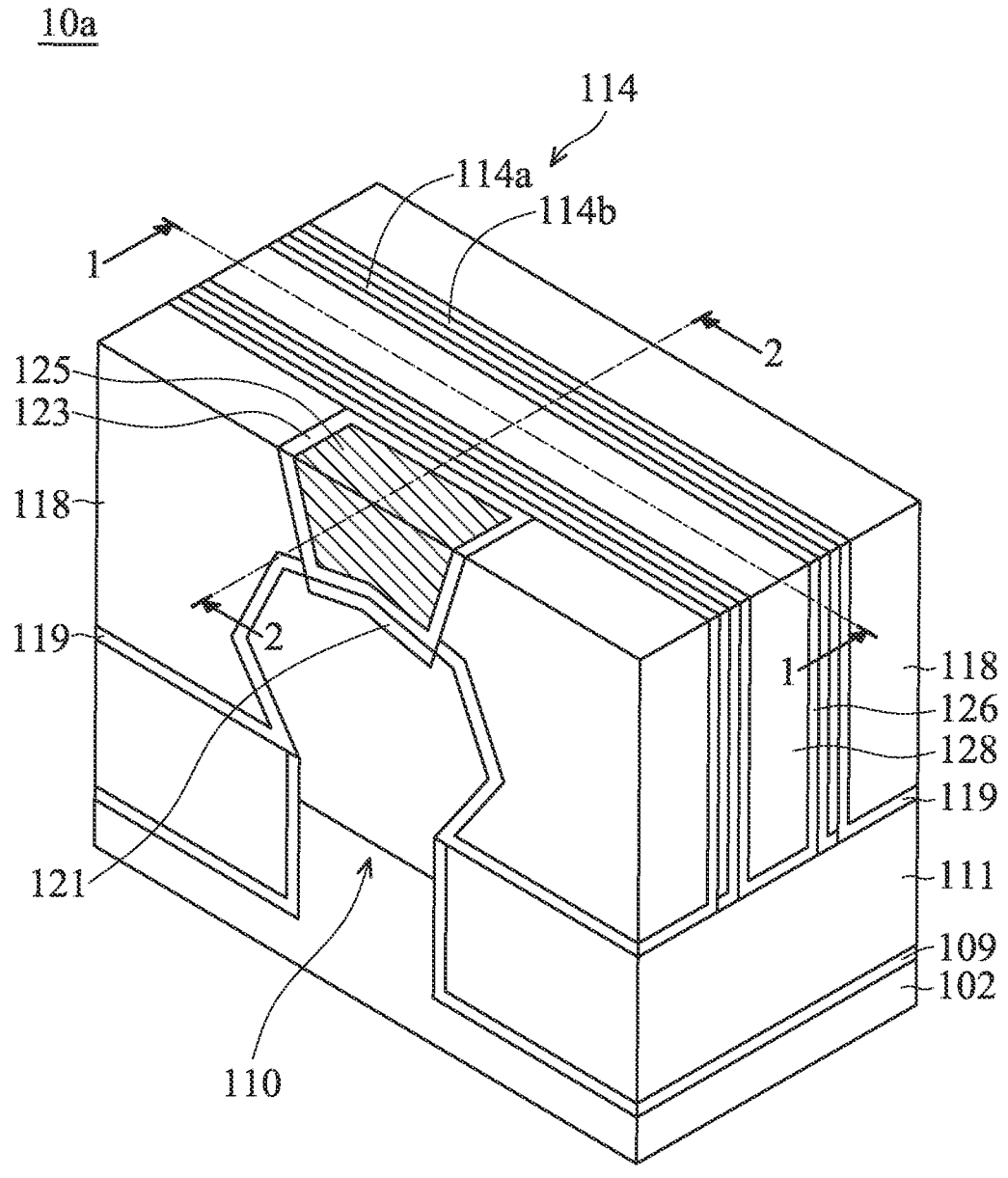
FIG. 1 is a perspective representation of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor device structure are provided. The method for forming the semiconductor device structure may include forming a fin structure with wider bottom nanostructures and narrower top nanostructures. Therefore, higher drive current and lower total resistance may be achieved with little or no increase in device area.

FIG. 1 is a perspective representation of a semiconductor device structure 10a, in accordance with some embodiments of the disclosure. The semiconductor device structure 10a is a nanostructure transistor (e.g. nanosheet transistor, nanowire transistor, multi-bridge channel, nano-ribbon FET, gate all around (GAA) transistor structures). FIGS. 2A-1, 2A-2, 2B-1, 2B-2, 2C-1, 2C-2, 2D-1, 2D-2, 2E-1, 2E-2, 2F-1, 2F-2, 2G-1, 2G-2, 2H-1, 2H-2, 2I-1 and 2I-2 are cross-sectional representations of various stages of forming the semiconductor device structure 10a, in accordance with some embodiments of the disclosure. FIGS. 2A-1, 2B-1, 2C-1, 2D-1, 2E-1, 2F-1, 2G-1, 2H-1 and 2I-1 show cross-sectional representations taken along line 1-1 in FIG. 1. FIGS. 2A-2, 2B-2, 2C-2, 2D-2, 2E-2, 2F-2, 2G-2, 2H-2 and 2I-2 show cross-sectional representations taken along line 2-2 in FIG. 1. FIGS. 2A-3, 2B-3, 2C-3 and 2D-3 are perspective representations of various stages of forming the semiconductor device structure 10a at the stages of the processes shown in FIGS. 2A-1, 2B-1, 2C-1, and 2D-1 respectively, in accordance with some embodiments of the disclosure.

A substrate 102 is provided as shown in FIGS. 1, 2A-1, 2A-2 and 2A-3 in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a semiconductor stack including first semiconductor layers 104-1 and second semiconductor layers 106-1 are alternatingly stacked over the substrate 102. The first semiconductor layers 104-1 may include a bottom first semiconductor layer 104b-1, a middle first semiconductor layer 104m-1, and a top first semiconductor layer 104t-1. The second semiconductor layers 106-1 may include a bottom second semiconductor layer 106b-1, a middle second semiconductor layer 106m-1, and a top second semiconductor layer 106t-1.

The first semiconductor layers 104-1 and the second semiconductor layers 106-1 may include Si, Ge, SiGe, GaAs, InSb, GaP, GaSb, InAlAs, InGaAs, GaSbP, GaAsSb, or InP. The first semiconductor layers 104-1 and second semiconductor layers 106-1 may be made of different materials with different etching rates. In some embodiments, the first semiconductor layers 104-1 include SiGe and the second semiconductor layers 106-1 include Si.

The first semiconductor layers 104-1 and second semiconductor layers 106-1 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor layers 104b-1/104m-1/104t-1 and three layers of the second semiconductor layers 106b-1/106m-1/106t-1 shown in FIGS. 1, 2A-1, 2A-2 and 2A-3, the number of the first semiconductor layers 104-1 and second semiconductor layers 106-1 are not limited herein and may include fewer or more layers, depending on the demand of performance and process.

Next, a pad layer 108-1 is blankety formed over the first semiconductor layers 104-1 and second semiconductor layers 106-1 in accordance with some embodiments as shown in FIGS. 2A-1, 2A-2 and 2A-3. The pad layer 108-1 may be formed over the topmost second semiconductor layer 106-1. The pad layer 108-1 may be made of silicon nitride, silicon oxide, silicon oxynitride, or another applicable material. The pad layer 108-1 may be formed by deposition processes, such as a chemical vapor deposition (CVD) process, a high-density plasma chemical vapor deposition (HDPCVD) process, a spin-on process, a sputtering process, or another applicable process.

Afterwards, a masking layer (not shown), such as a photoresist layer, may be formed over the pad layer 108-1. The photoresist layer may be patterned in a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer 108-1 may be obtained as shown in FIGS. 2A-1, 2A-2 and 2A-3. Afterwards, the patterned photoresist layer may be removed.

Afterwards, an etching process is performed on the first semiconductor layers 104-1 and second semiconductor layers 106-1 to form a fin structure 110 by using the pad layer 108-1 as a mask, as shown in FIGS. 1, 2A-1, 2A-2 and 2A-3 in accordance with some embodiments. In some embodiments, the first semiconductor layers 104-1 and second semiconductor layers 106-1 are etched by a dry etching process. For example, the etching process may be performed under a pressure in a range of about 1 mtorr to about 8000 mtorr. The etching process may be performed under a temperature in a range of about 20° C. to about 300° C. The etching process may be performed with a power in a range of 100 W to about 1000 W. If the pressure, the temperature, and the power of the etching process are too high, the channel regions may be over-etched. If the pressure, the temperature, and the power of the etching process are too low, the channel regions may be insufficiently etched. The etching process may include multiple etching processes etching the first semiconductor layers 104-1 and second semiconductor layers 106-1 separately.

In some embodiments, the top portion of the fin structure 110 and the bottom portion of the fin structure 110 have substantially the same width such that the fin structure 110 has a rectangular shape in the cross-sectional view.

Other processes may be used to pattern the fin structures 110. For example, the structures may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor (e.g. nanosheet transistor, nanowire transistor, multi-bridge channel, nano-ribbon FET, gate all around (GAA) transistor structures).

After the fin structures 110 are formed, isolation regions may be formed in the trenches between the fin structures 110, as shown in FIGS. 1, 2A-1 and 2A-3 in accordance with some embodiments. The isolation regions may include a liner layer 109 and an isolation structure 111. The liner layer 109 is formed in the trenches between the fin structures 110. The liner layer 109 may be conformally formed over the substrate 102 and the fin structure 110. The liner layer 109 may be used to protect the fin structure 110 from being damaged in the following processes (such as an anneal process or an etching process). The liner layer 109 may be made of silicon nitride. The liner layer 109 may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, a fill material (e.g., the material of the isolation structure 111) is formed over the liner layer 109 in the trenches between the fin structures 110. The fill material may be made of silicon oxide, silicon nitride, silicon oxynitride, fluoride-doped silicate glass (FSG), or another low-k dielectric material. The fill material may be deposited by a deposition process, such as a chemical vapor deposition (CVD) process, a spin-on-glass process, or another applicable process.

Next, an etching process may be performed on the fill material and the liner layer 109 to form the liner layer 109 and the isolation structure 111 as illustrated in FIGS. 2A-1 and 2A-3. The etching process may be used to remove a top portion of the liner layer 109 and a top portion of the isolation structure 111. As a result, the first semiconductor layers 104-1 and the second semiconductor layers 106-1 may be exposed and the remaining isolation structure 111 and the liner layer 109 may surround the base portion of the fin structure 110. The remaining portions of the liner layer 109 and the isolation structure 111 may be a shallow trench isolation (STI) structure surrounding the base portion of the fin structure 110. The isolation structure 111 and the liner layer 109 may be configured to prevent electrical interference or crosstalk. Therefore, trenches may be formed between the fin structures 110.

Afterwards, an oxidation process 134 is performed to form silicon oxides 136 over sidewalls of the second semiconductor layers 106-1 and to form silicon germanium oxides 137 over sidewalls of the first semiconductor layers 104-1, as shown in FIGS. 2B-1, 2B-2 and 2B-3 in accordance with some embodiments.

The oxidation process 134 may be a thermal oxidation process performed in a furnace. The oxidation process 134 may use an oxidant including oxygen. The oxidation process 134 may include using $O_2$ radical, $O_2$ plasma, $O_2$ implantation, $O_3$, or a combination thereof.

By modifying the location of the oxidant, the top portion of the fin structure 110 may be oxidized more than the bottom portion of the fin structure 110. For example, by orientational oxidation such as $O_2$ implantation or $O_2$ plasma process, there may be more oxidant at the top portion of the fin structure 110 than the bottom of the fin structure 110.

The oxidation process 134 may be performed under a pressure in a range of about 1 mtorr to about 12000 mtorr. The oxidation process 134 may be performed under a temperature in a range of from room temperature to about 450° C. If the temperature of the oxidation process 134 is higher, the oxidation process 134 may be faster.

After the oxidation process 134 is performed, a top silicon oxide 136t, a middle silicon oxide 136m, and a bottom silicon oxide 136b may be formed over the sidewalls of the top second semiconductor layers 106t-1, the middle second semiconductor layers 106m-1, and the bottom second semiconductor layers 106b-1, respectively. In addition, a top silicon germanium oxide 137t, a middle silicon germanium oxide 137m, and a bottom silicon germanium oxide 137b may be formed over the sidewalls of the top first semiconductor layers 104t-1, the middle first semiconductor layers 104m-1, and the bottom first semiconductor layers 104b-1.

Since the oxidation process 134 may be an orientational oxidation process, the silicon oxides 136 formed over the sidewalls of the second semiconductor layers 106-1 at different heights may have different widths. In some embodiments, the top silicon oxide 136t (e.g. wider in the cross-sectional view) is thicker than the middle silicon oxide 136m, and the middle silicon oxide 136m is thicker than the bottom silicon oxide 136b. In some embodiments, the pad layer 108-1 is wider than the top second semiconductor layer 106t-1 after the oxidation process 134 is performed.

Similarly, the silicon germanium oxides 137 formed over the sidewalls of the first semiconductor layers 104-1 at different heights may have different thicknesses. In some embodiments, the top silicon germanium oxides 137t is thicker (e.g. wider in the cross-sectional view) than the middle silicon germanium oxides 137m, and the middle silicon germanium oxides 137m is thicker than the bottom silicon germanium oxides 137b. In some embodiments, the pad layer 108-1 is wider than the top first semiconductor layers 104t-1 after the oxidation process 134 is performed.

In some embodiments, the silicon in the second semiconductor layers 106-1 is oxidized more than the silicon germanium in the first semiconductor layers 104-1. Therefore, the silicon oxides 136 may be thicker (e.g. wider in the cross-sectional view) than the silicon germanium oxides 137 at similar height of the fin structure 110. For example, the top silicon oxide 136t may be thicker than the top silicon germanium oxide 137t.

Afterwards, the silicon oxides 136 over the sidewalls of the second semiconductor layers 106-1 and the pad layer 108-1 are removed, as shown in FIGS. 2C-1, 2C-2 and 2C-3 in accordance with some embodiments. In some embodiments, since the silicon germanium oxides 137 over the sidewalls of the first semiconductor layers 104-1 remains, the silicon germanium oxides 137 protrudes from the sidewalls of the fin structure 110. In some embodiments, each of the second semiconductor layers 106-1 has vertical sidewalls after removing the silicon oxides 136.

The pad layer 108-1 may be removed by an etching process. The etching process may be a dry etching process or a wet etching process. The silicon oxides 136 may be removed by a dry etching process or a wet etching process, and/or other suitable etching processes. In some embodiments, the silicon oxides 136 are removed by a wet etching process. The wet etching process may include using dilute HF (dHF) as etchant. The wet etching process may be performed under a temperature in a range of from room temperature to about 80° C. The silicon germanium oxides 137 and the isolation structure 111 may also be slightly removed during the wet etching process for removing the silicon oxides 136.

Figures 1, 2A:
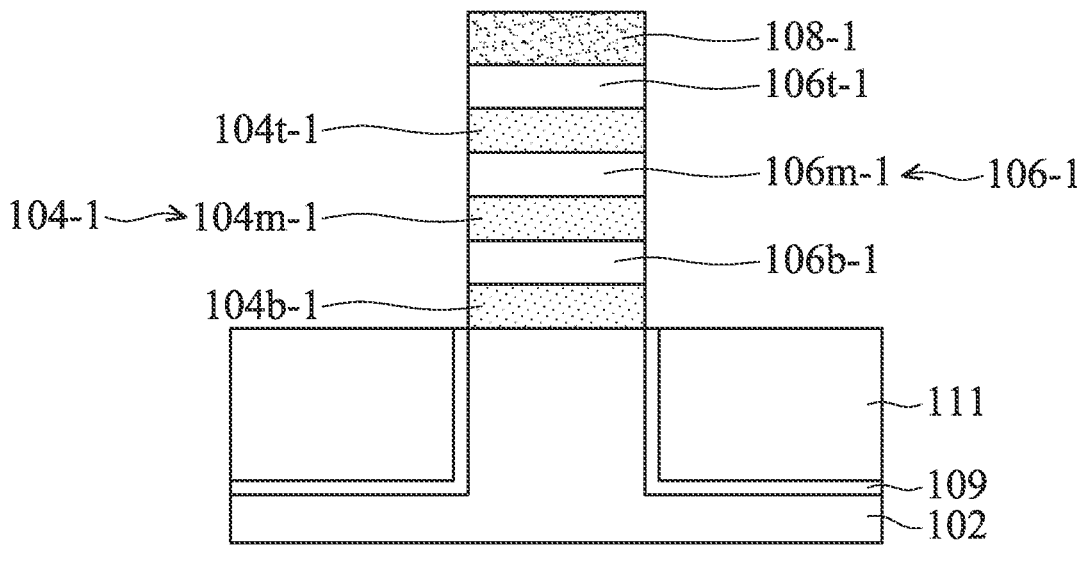
Figures 2, 2A:
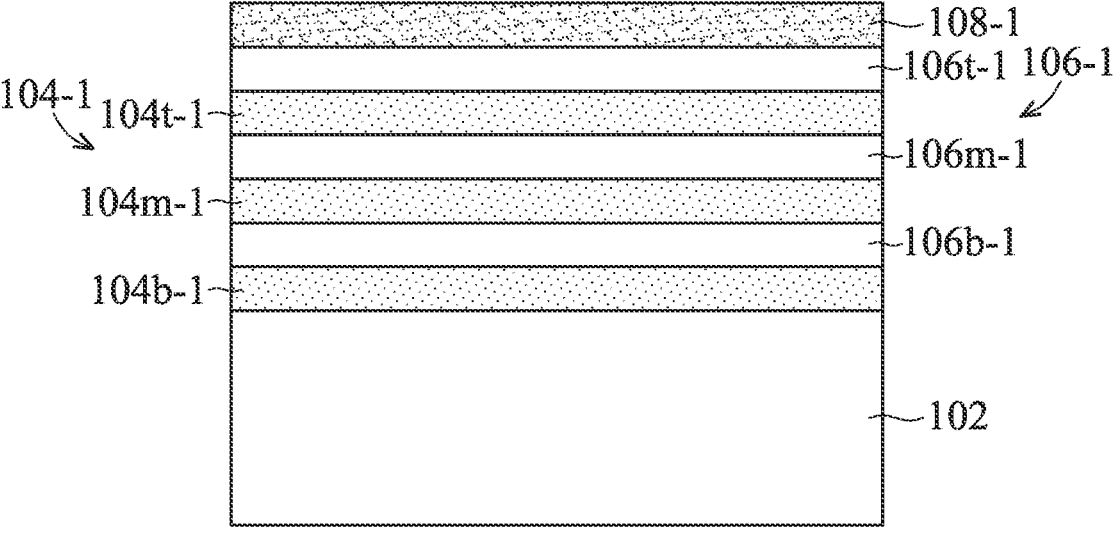
Figures 2, 2A, 3:
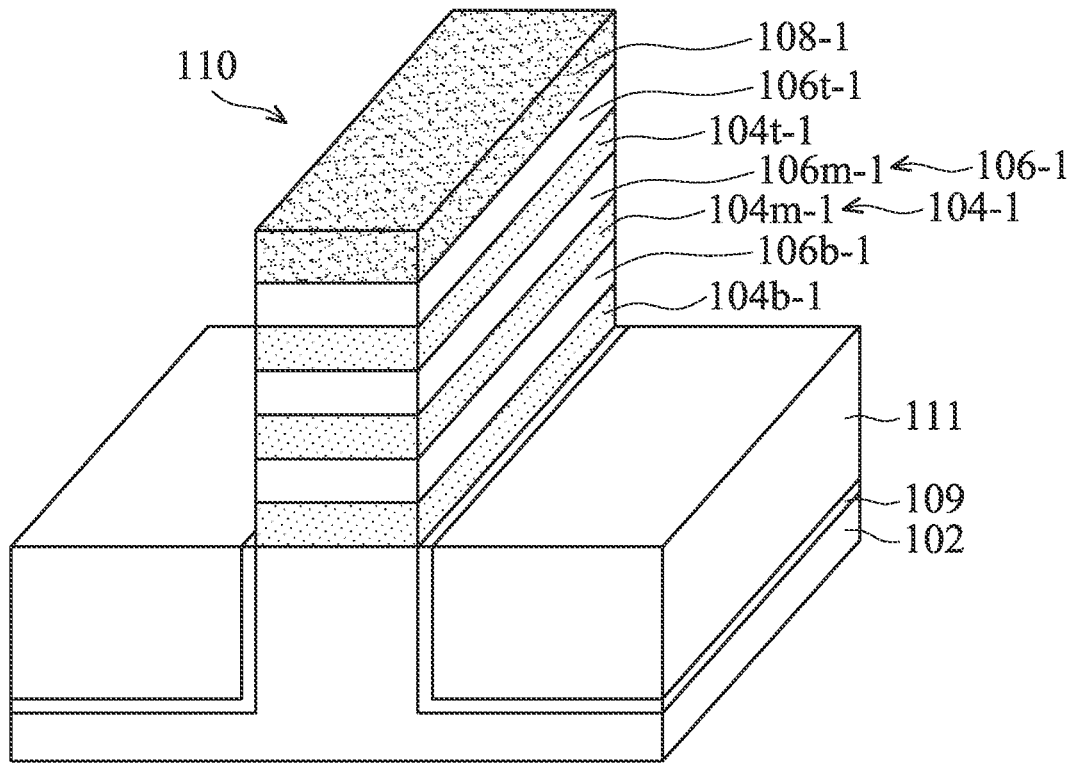
Figures 1, 2B:
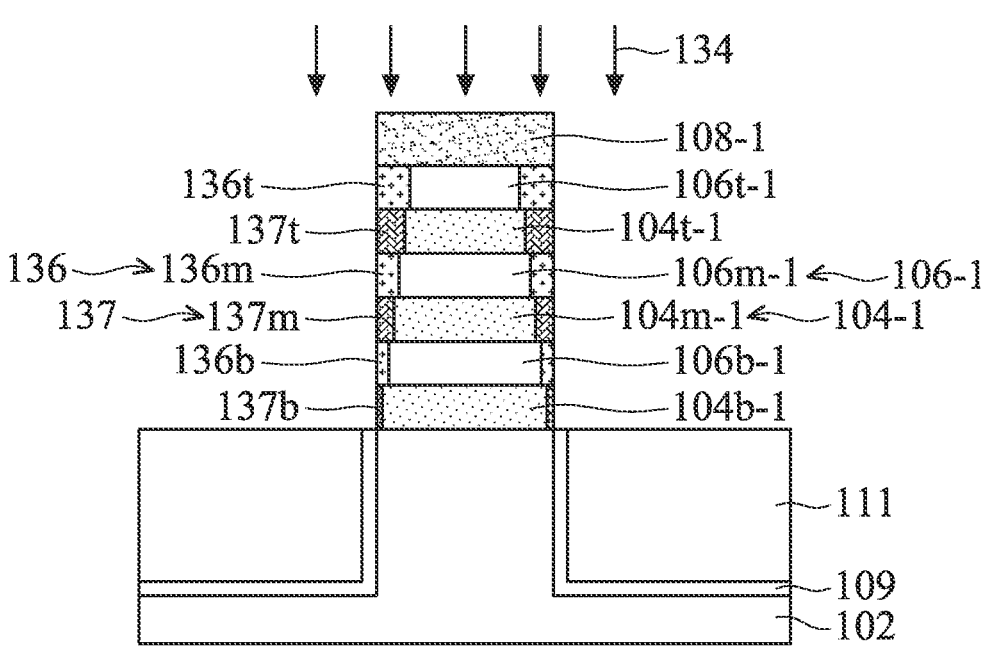
Figures 2, 2B:
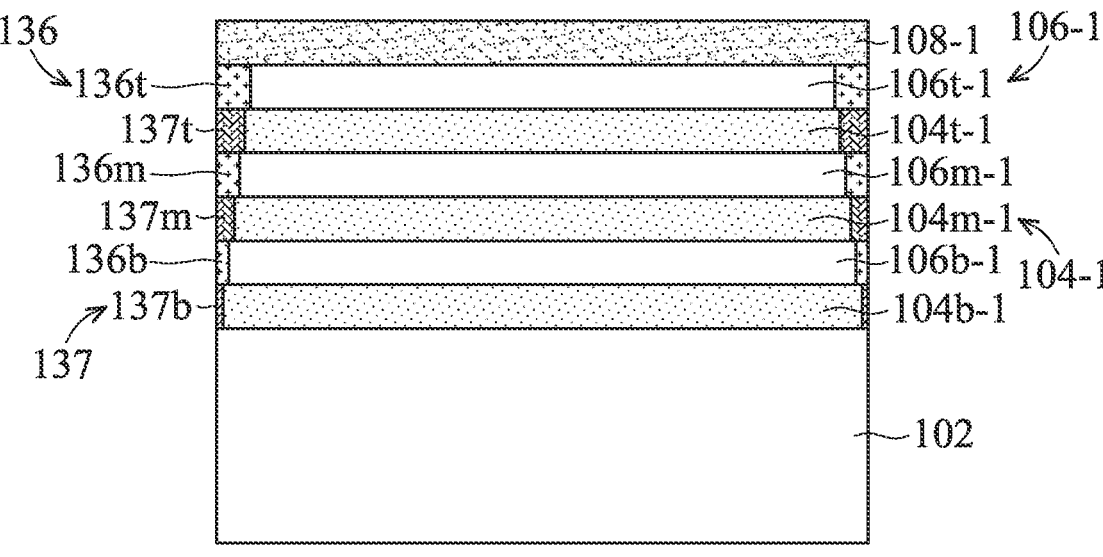
Figures 2, 2B, 3:
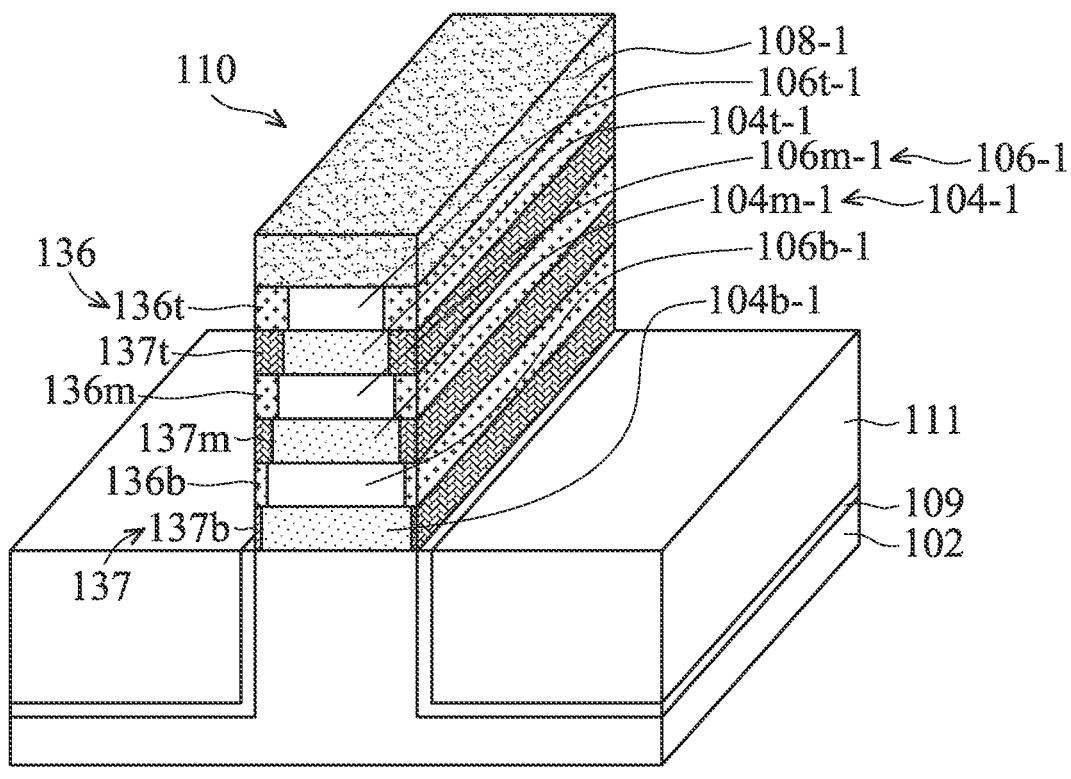
Figures 1, 2C:
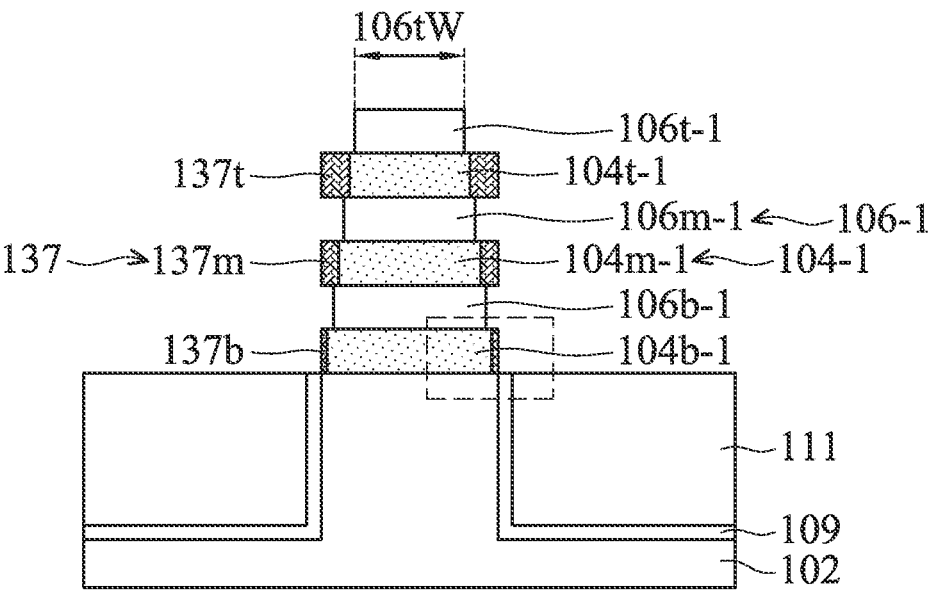
Figures 2, 2C:
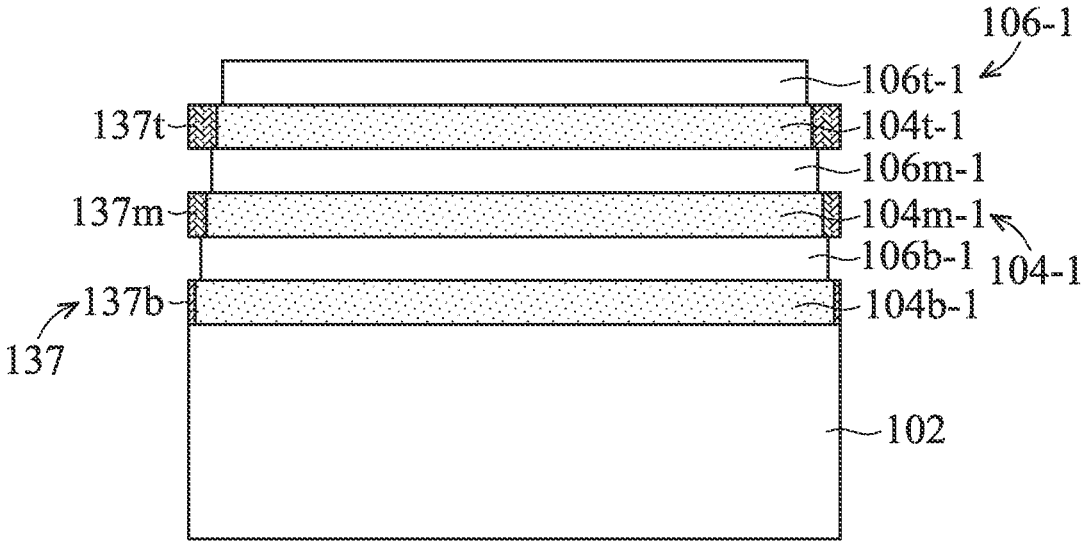
Figures 2, 2C, 3:
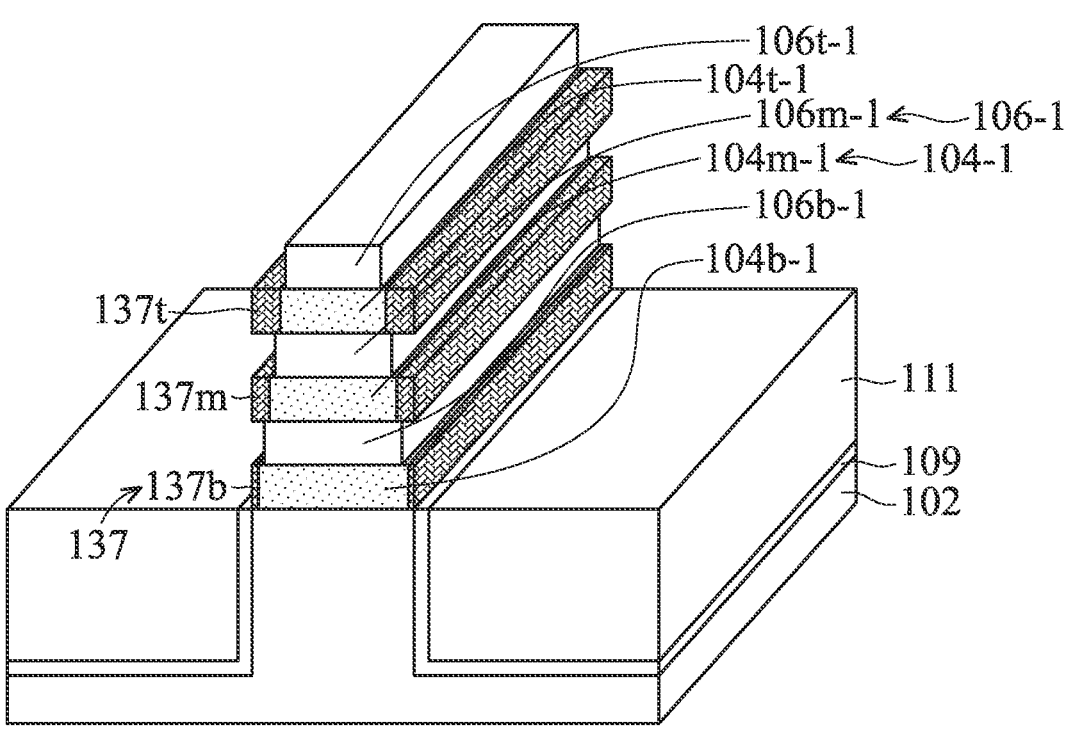
Figures 2, 2C, 3, 4:
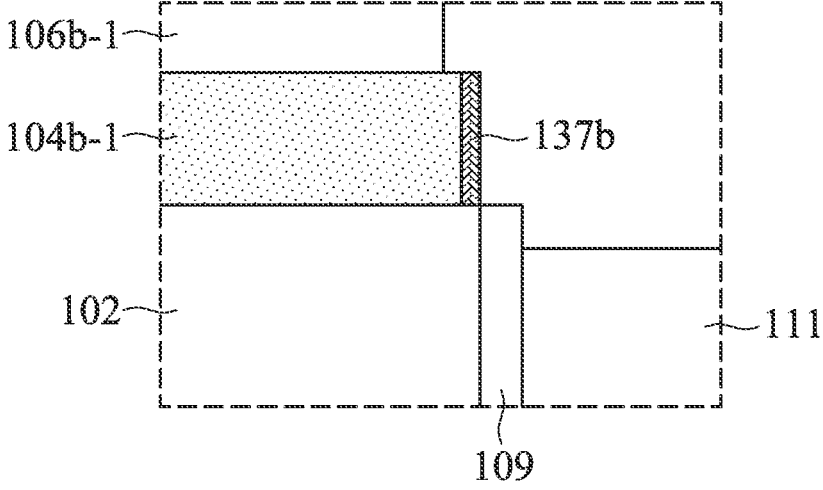

FIG. 2C-4 is an enlarged cross-sectional representation of the dashed box shown in FIG. 2C-1, in accordance with some embodiments of the disclosure. The isolation structure 111 may be slightly removed during the wet etching process. Therefore, the top surface of the isolation structure 111 may be lower than the top surfaces of the substrate 102 and the liner layer 109.

Since the top silicon oxide 136t is thicker than the middle silicon oxide 136m and the middle silicon oxide 136m is thicker than the bottom silicon oxide 136b, the top second semiconductor layer 106t-1, the middle second semiconductor layer 106m-1, and the bottom second semiconductor layer 106b-1 after the removal of the top silicon oxide 136t, the middle silicon oxide 136m and the bottom silicon oxide 136b have different widths. In some embodiments, the bottom second semiconductor layer 106b-1 is wider than the middle second semiconductor layer 106m-1, and the middle second semiconductor layer 106m-1 is wider than the top second semiconductor layer 106t-1. As shown in FIG. 2C-1, the top second semiconductor layer 106t-1 has a top width 106tW.

Next, a dummy gate structure 213a is formed over and across the fin structures 110, as shown in FIGS. 2D-1, 2D-2 and 2D-3 in accordance with some embodiments. Since the silicon germanium oxides 137 are not removed, the dummy gate structure 213a is formed over and in direct contact with the silicon germanium oxides 137 in accordance with some embodiments. In some embodiments, the dummy gate structure 213a has extending portions vertically sandwiched between the silicon germanium oxides 137. That is, the interfaces between the sidewalls of the second semiconductor layers 106-1 and the dummy gate structure 213a are not aligned with the interfaces between the sidewalls of the silicon germanium oxides 137 and the dummy gate structure 213a.

The dummy gate structure 213a may include a dummy gate dielectric layer 127 and a dummy gate electrode layer 112. The dummy gate dielectric layer 127 and the dummy gate electrode layer 112 may be replaced in subsequent steps to form a conductive gate structure with, for example, a high-k dielectric layer and a metal gate electrode layer.

The dummy gate dielectric layer 127 may include a silicon oxide layer. The silicon oxide layer may be formed by an oxidation process (e.g., a dry oxidation process, or a wet oxidation process), a chemical vapor deposition process, other applicable processes, or a combination thereof. In some embodiments, the silicon oxide layer covers both the second semiconductor layers 106-1 and the silicon germanium oxides 137, and the portions of the silicon oxide layer formed over the silicon germanium oxides 137 are thicker than the portions of the silicon oxide layer formed over the second semiconductor layers 106-1. Alternatively, the dummy gate dielectric layer 127 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 112 may include polycrystalline-silicon (poly-Si), poly-crystalline silicon-germanium (poly-SiGe), other applicable materials, or a combination thereof. The dummy gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer 127 and the dummy gate electrode layer 112 to form the dummy gate structure 213a by using a patterned photoresist layer as a mask (not shown). The etching process may be a dry etching process or a wet etching process. After the etching process, the first semiconductor layers 104-1 and the second semiconductor layers 106-1 are exposed on opposite sides of the dummy gate structure 112, as shown in FIGS. 1, 2D-2 and 2D-3 in accordance with some embodiments.

Figures 1, 2D:
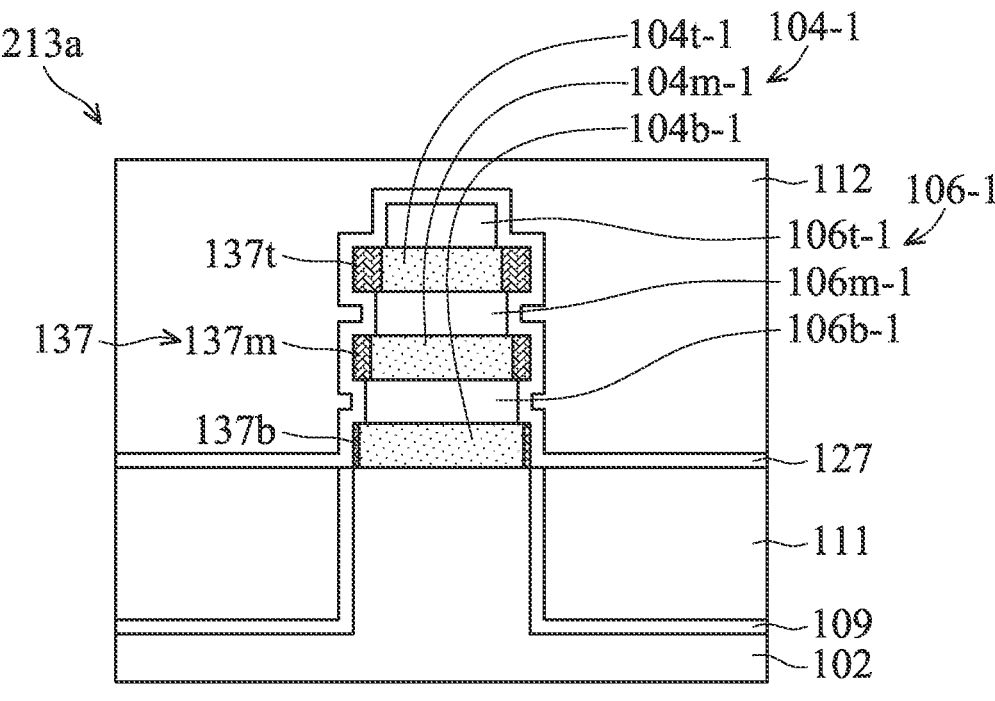
Figures 2, 2D:
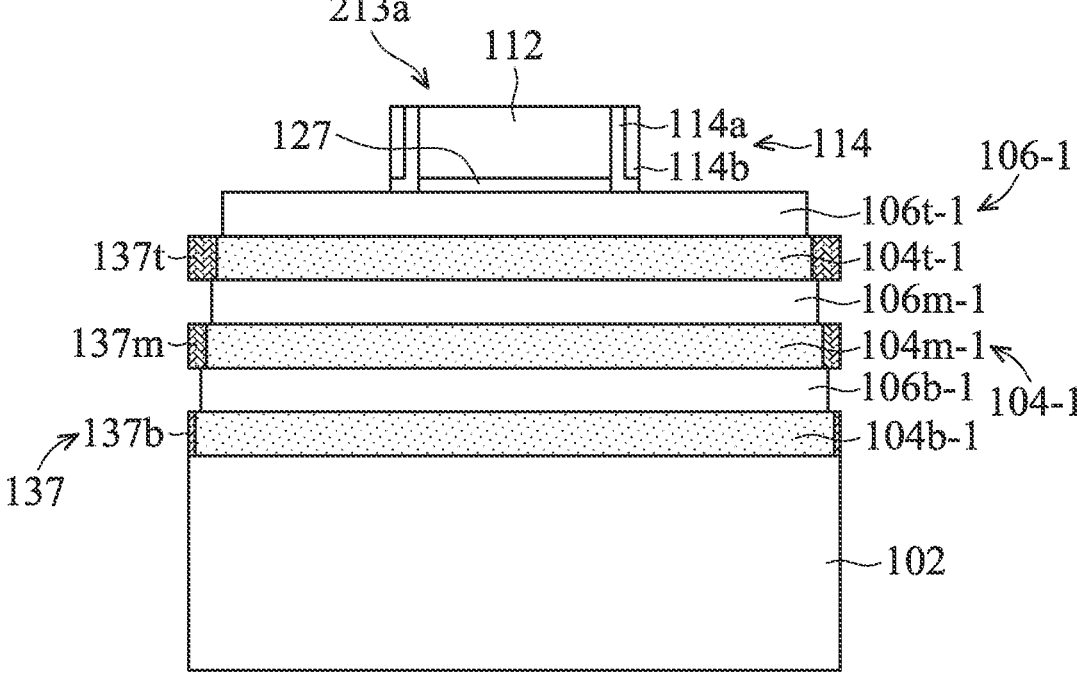
Figures 2, 2D, 3:
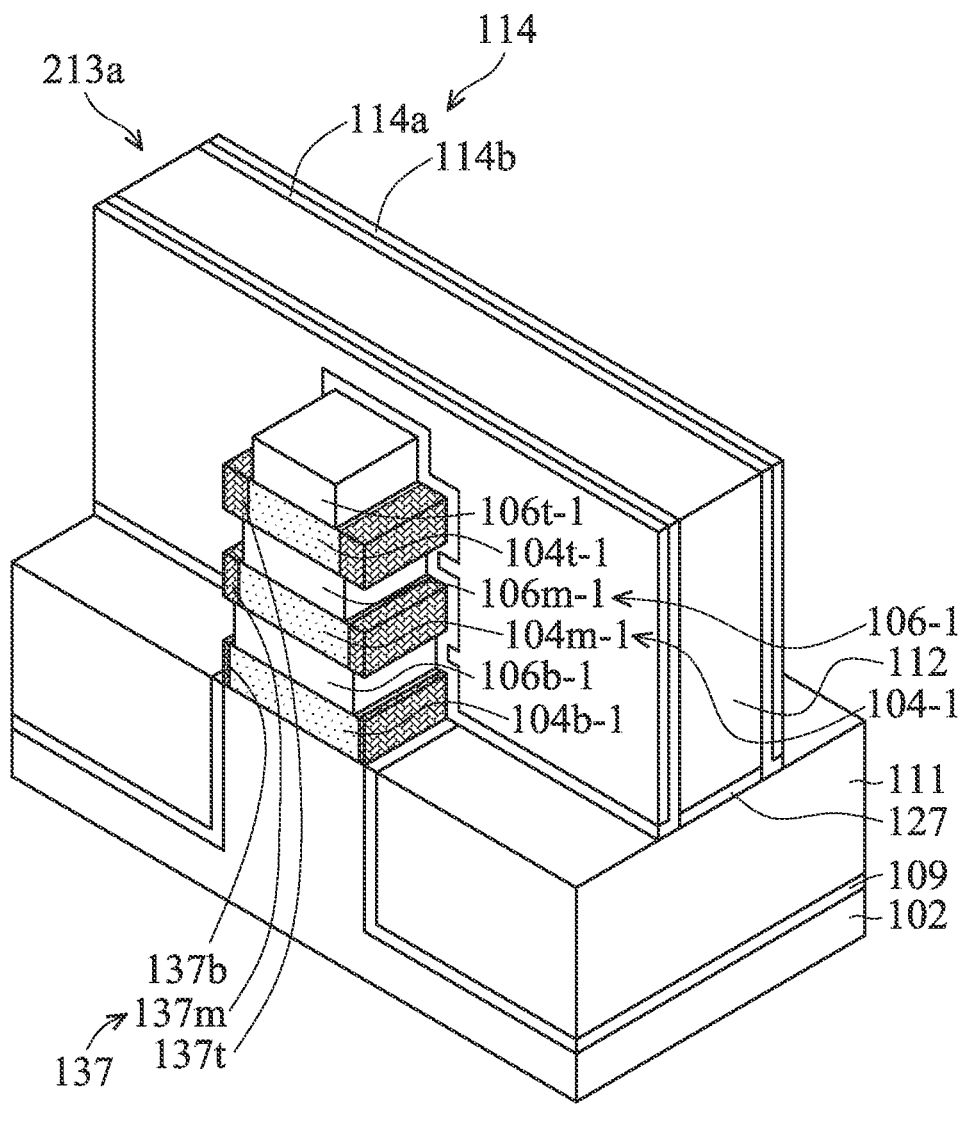
Figures 1, 2E:
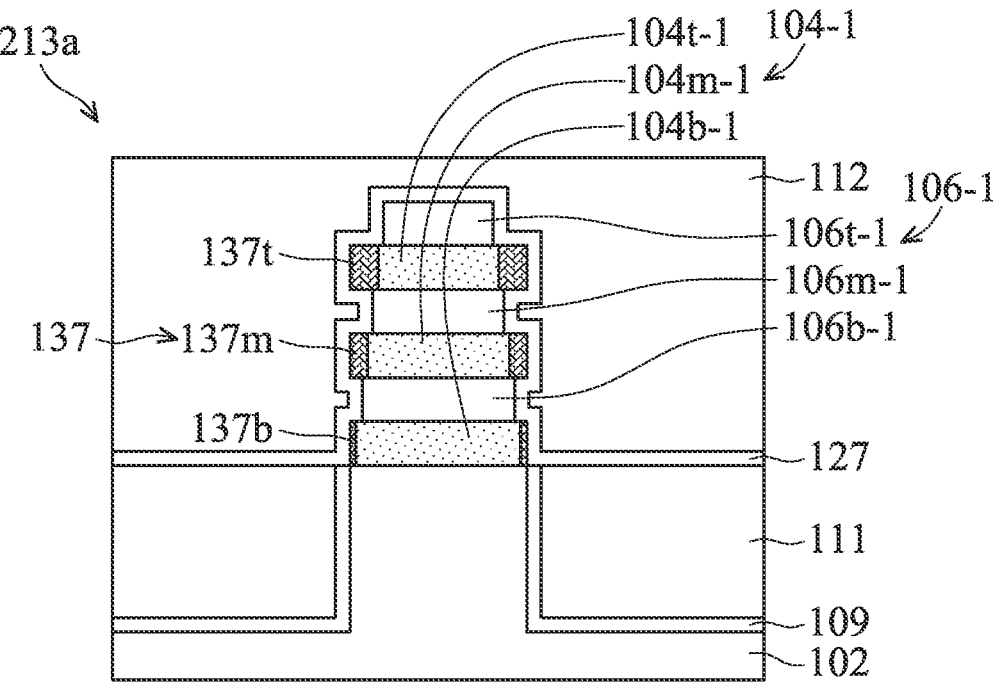
Figures 2, 2E:
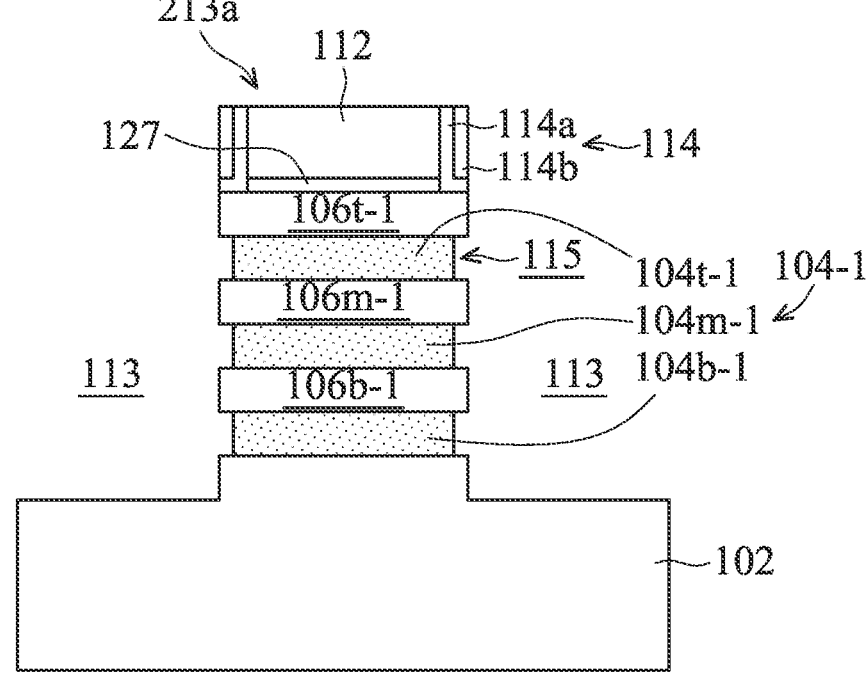

Next, spacers 114 are formed on opposite sidewalls of the dummy gate structure 213a, as shown in FIGS. 1, 2D-2 and 2D-3 in accordance with some embodiments. The spacer layers 114 may comprise one or more spacers, such as a dual layer structure including spacer layers 114a and 114b illustrated in FIGS. 2D-2 and 2D-3. The spacer layers 114a may be conformally formed over the sidewalls of the dummy gate structures 112 first, and the spacer layers 114b may be formed over the spacer layers 114a. The spacer layers 114a have an L-shape in the cross-sectional view as shown in FIGS. 2D-2 and 2D-3. The spacer layers 114a and 114b may include different materials. The spacer layers 114a and 114b may be made of silicon oxide, silicon nitride, silicon oxynitride, and/or dielectric materials. The spacer layers 114 may be formed by a chemical vapor deposition (CVD) process, a spin-on-glass process, or another applicable process. Afterwards, the first semiconductor layers 104-1 and the second semiconductor layers 106-1 of the fin structure 110 exposed on opposite sides of the dummy gate structure 213a may be removed in one or more etching processes to form source/drain recesses 113, as shown in FIGS. 2E-1 and 2E-2 in accordance with some embodiments. The etching processes may be a dry etching processes or a wet etching processes, or a combination thereof. The fin structures 110 may be etched by a dry etching process.

Next, the first semiconductor layers 104-1 are laterally etched from the source/drain recesses 113 to form recesses 115 at opposite sides of the first semiconductor layers 104-1, as shown in FIG. 2E-2 in accordance with some embodiments. The outer portions of the first semiconductor layers 104-1 may be removed, and the inner portions of the first semiconductor layers 104-1 under the dummy gate structure 213a or the spacer layers 114 may remain. The lateral etching of the first semiconductor layers 104-1 may be a dry etching process, a wet etching process, or a combination thereof. After the lateral etching, the sidewalls of the etched first semiconductor layers 104-1 may be not aligned with the sidewalls of the second semiconductor layers 106-1. The etched first semiconductor layers 104-1 may have straight sidewalls or curved sidewalls, depending on the etching process.

Figures 1, 2F:
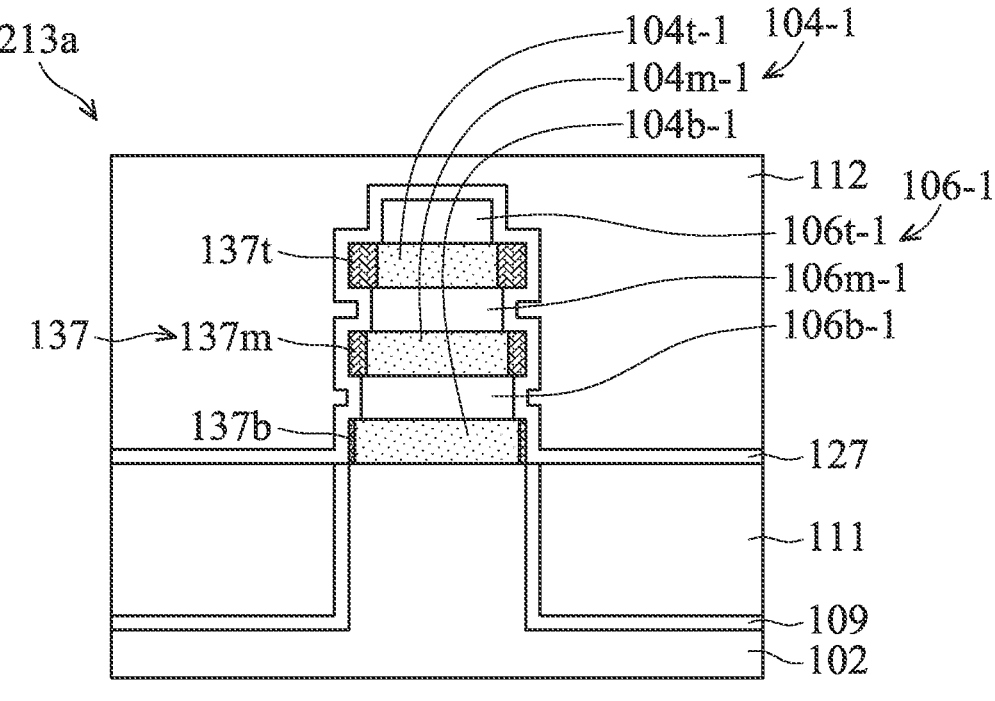
Figures 2, 2F:
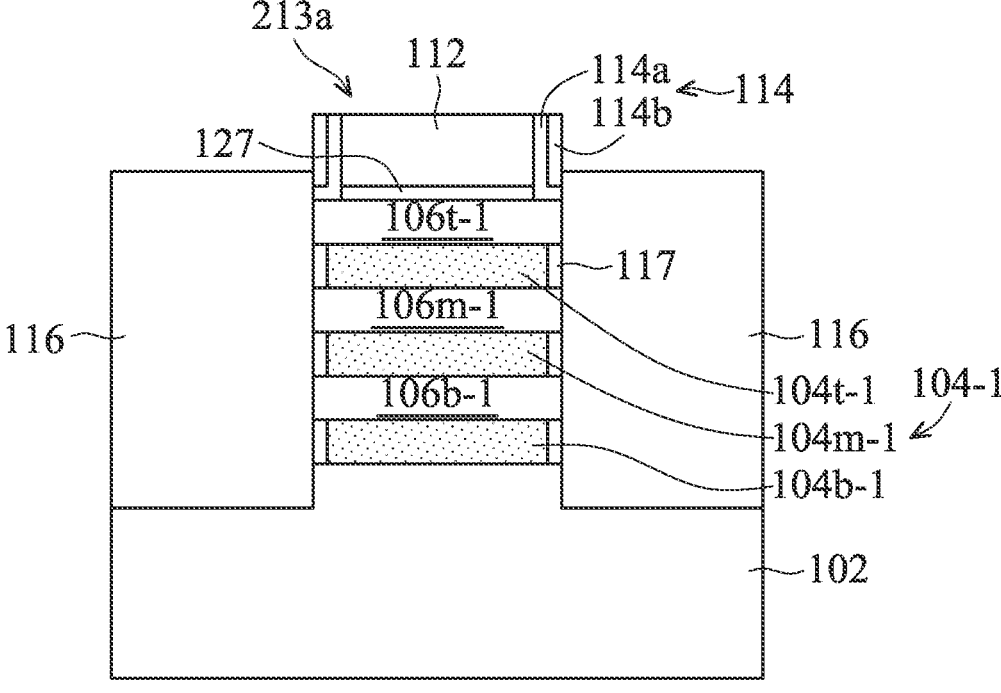

Next, an inner spacer 117 is formed in the recesses 113, as shown in FIGS. 2F-1 and 2F-2 in accordance with some embodiments. The inner spacer 117 may provide a barrier between subsequently formed source/drain epitaxial structures and gate structure. The inner spacer 117 may be made of silicon oxide, silicon nitride, silicon carbon nitride (SiCN), silicon oxide carbonitride (SiOCN), or a combination thereof. The inner spacer 117 may be formed by a deposition process and an etch-back process. The deposition process may include a CVD process (such as LPCVD, PECVD, SACVD, or FCVD), an ALD process, another applicable method, or a combination thereof. The etch-back process may include a dry etching process or a wet etching process.

Next, a source/drain epitaxial structure 116 is formed in the source/drain recesses 113, as shown in FIGS. 1 and 2F-2 in accordance with some embodiments. The source/drain epitaxial structure 116 may be formed over opposite sides of the fin structure 110.

A strained material may be grown in the source/drain recesses 113 by an epitaxial (epi) process to form the source/drain epitaxial structure 116, as shown in FIGS. 1 and 2F-2 in accordance with some embodiments. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. The source/drain epitaxial structure 116 may be doped with one or more dopants. For example, source/drain epitaxial structure 116 may be silicon germanium (SiGe) doped with boron (B) or another applicable dopant.

Figures 1, 2G:
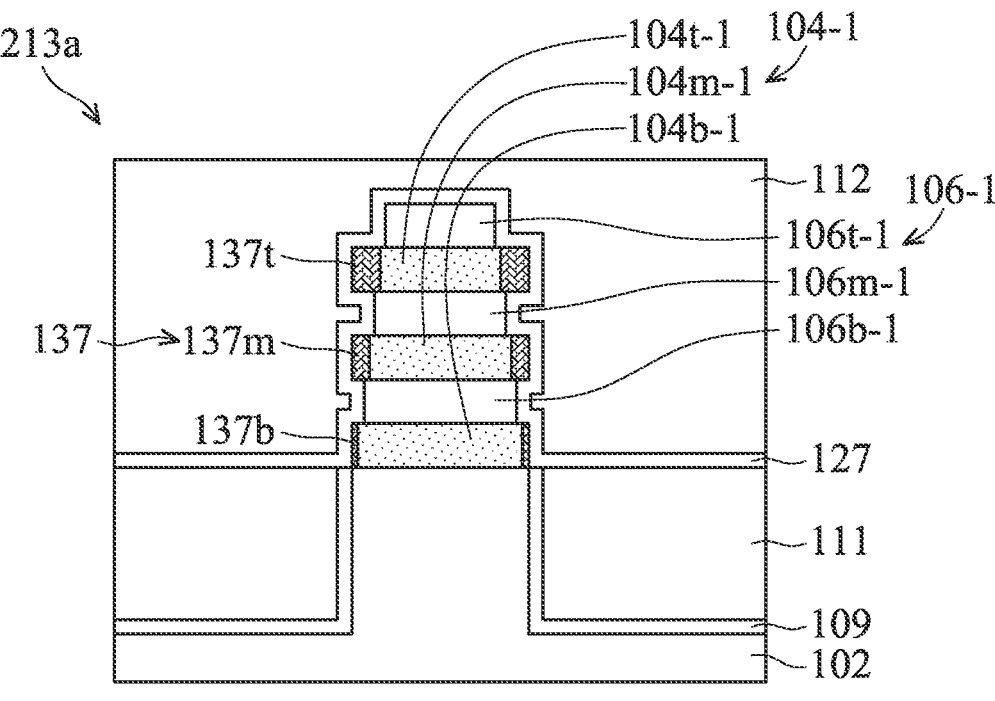
Figures 2, 2G:
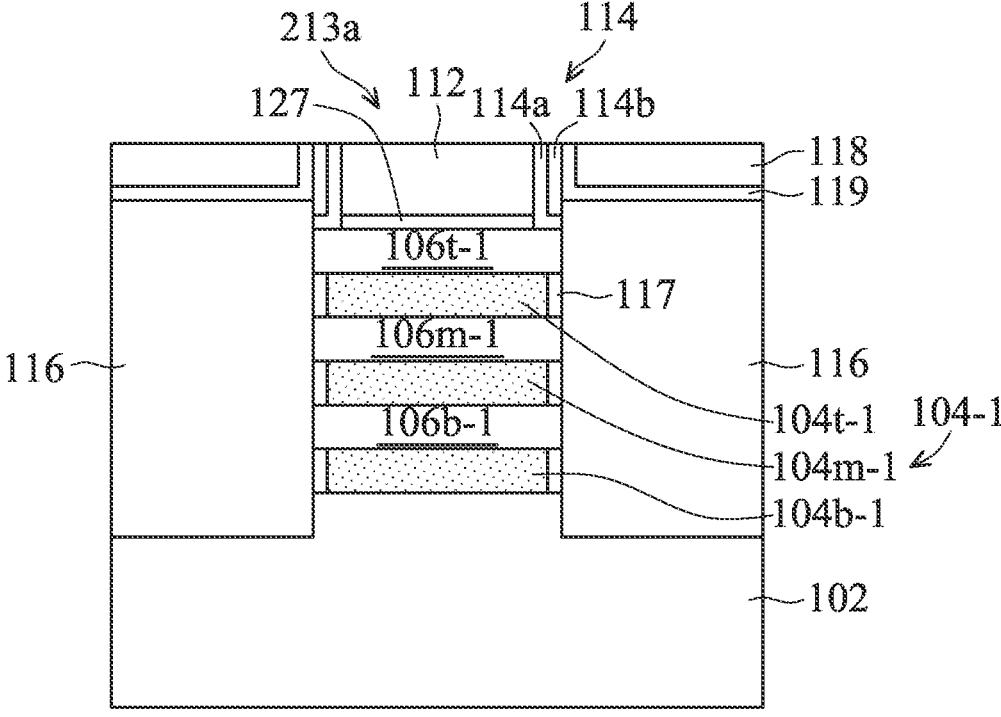

Next, an etch stop layer 119 is formed over the source/drain epitaxial structure 116, as shown in FIGS. 2G-1 and 2G-2 in accordance with some embodiments. The etch stop layer 119 may include silicon nitride, silicon oxide, silicon oxynitride (SiON), other applicable materials, or a combination thereof. The etch stop layer 119 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the source/drain epitaxial structure 116 and the etch stop layer 119 are formed, an inter-layer dielectric (ILD)

structure 118 is formed over the etch stop layer 119, as shown in FIGS. 1 and 2G-2 in accordance with some embodiments. The ILD structure 118 may include one or more layers of dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 118 may be formed by chemical vapor deposition (CVD), spin-on coating, or other applicable processes.

Afterwards, a planarizing process is performed on the ILD structure 118 until the top surface of the dummy gate structure 213a is exposed, as shown in FIG. 2G-2 in accordance with some embodiments. After the planarizing process, the top surface of the dummy gate structure 213a may be substantially level with the top surfaces of the spacer layers 114 and the ILD structure 118. The planarizing process may include a grinding process, a chemical mechanical polishing (CMP) process, an etching process, other applicable processes, or a combination thereof.

Figures 1, 2H:
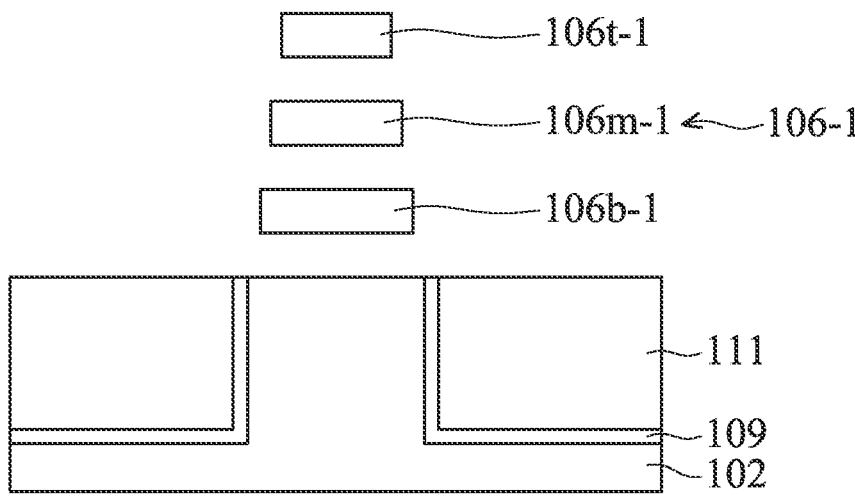
Figures 2, 2H:
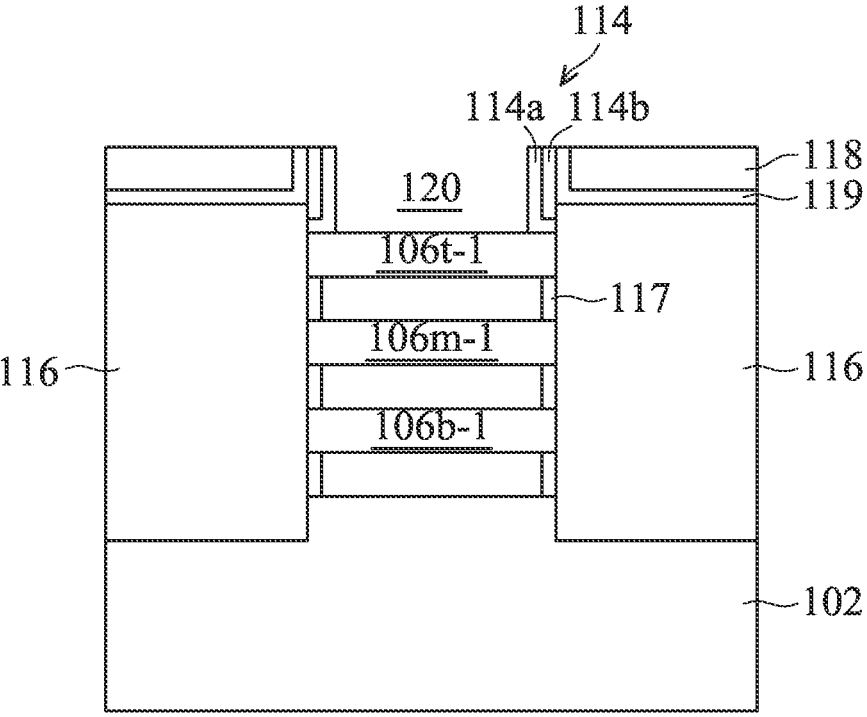

Next, the dummy gate structure 213a including the dummy gate dielectric layer 127 and the dummy gate electrode layer 112 is removed, as shown in FIGS. 1, 2H-1 and 2H-2 in accordance with some embodiments. Therefore, a trench 120 is formed between the spacer layers 114 over the fin structure 110, and the fin structure 110 is exposed from the trench 120. The dummy gate structure 213a may be removed by a dry etching process or a wet etching process.

After the trench 120 is formed, the first semiconductor layers 104-1 and the silicon germanium oxides 137 formed over the sidewalls of the first semiconductor layers 104-1 are removed to expose the second semiconductor layers 106-1, as shown in FIGS. 1, 2H-1 and 2H-2 in accordance with some embodiments, wherein remaining portions of the second semiconductor layers 106-1 form nanostructures extending between the source/drain epitaxial structure 116. The second semiconductor layers 106-1 are also referred to as nanostructures 106-1. More specifically, the first semiconductor layers 104-1 and the silicon germanium oxides 137 are removed to form openings between the second semiconductor layers 106-1, such that the nanostructures 106-1 are formed with the remaining second semiconductor layers 106-1. The removal process may include a selective etching process. The selective etching process may remove the first semiconductor layers 104-1 while the second semiconductor layers 106-1 remain as channel regions of the semiconductor device structure 10a, in accordance with some embodiments.

The selective etching process of removing the first semiconductor layers 104-1 may include a wet etch process, a dry etch process, or a combination thereof. The selective etching process may be a plasma-free dry chemical etching process. The etchant of the dry chemical etching process may include radicals such as HF, $NF_3$, $NH_3$, $H_2$, or a combination thereof.

In some embodiments, the bottom nanostructure 106b-1 is wider than the middle nanostructure 106m-1, and the middle nanostructure 106m-1 is wider than the top nanostructure 106t-1. In some embodiments, the base portion of the fin structure 110 under the bottom nanostructure 106b-1 is wider than the bottom nanostructure 106b-1. In some embodiments, the bottom surface area of the bottom nanostructure 106b-1, the middle nanostructure 106m-1, and the top nanostructure 106t-1 is substantially equal to the top surface area of the bottom nanostructure 106b-1, the middle nanostructure 106m-1, and the top nanostructure 106t-1, respectively.

Figures 1, 2I:
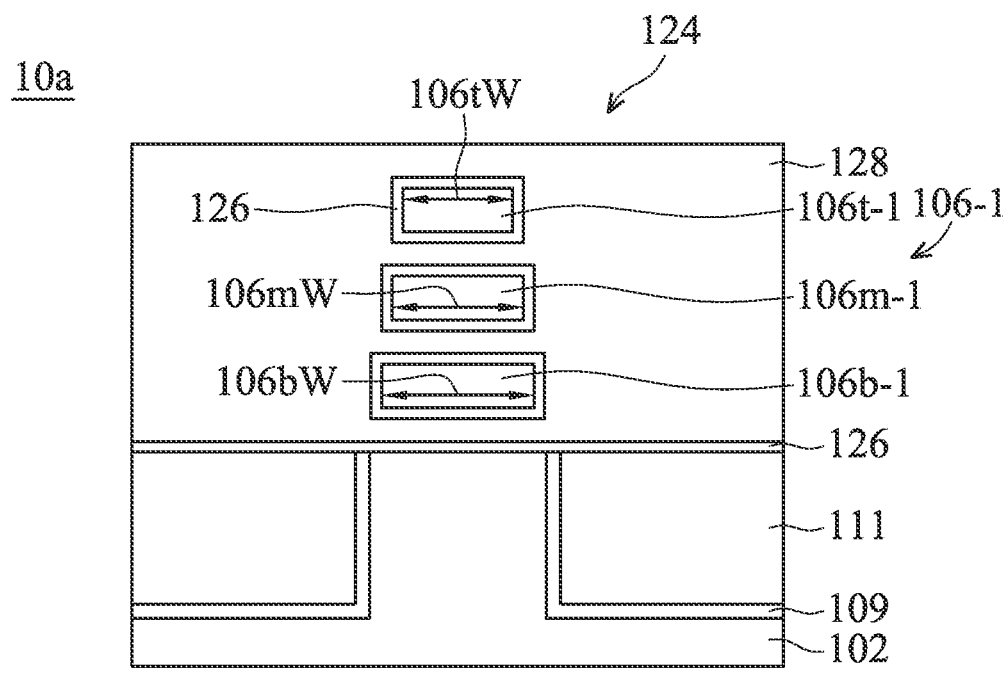
Figures 2, 2I:
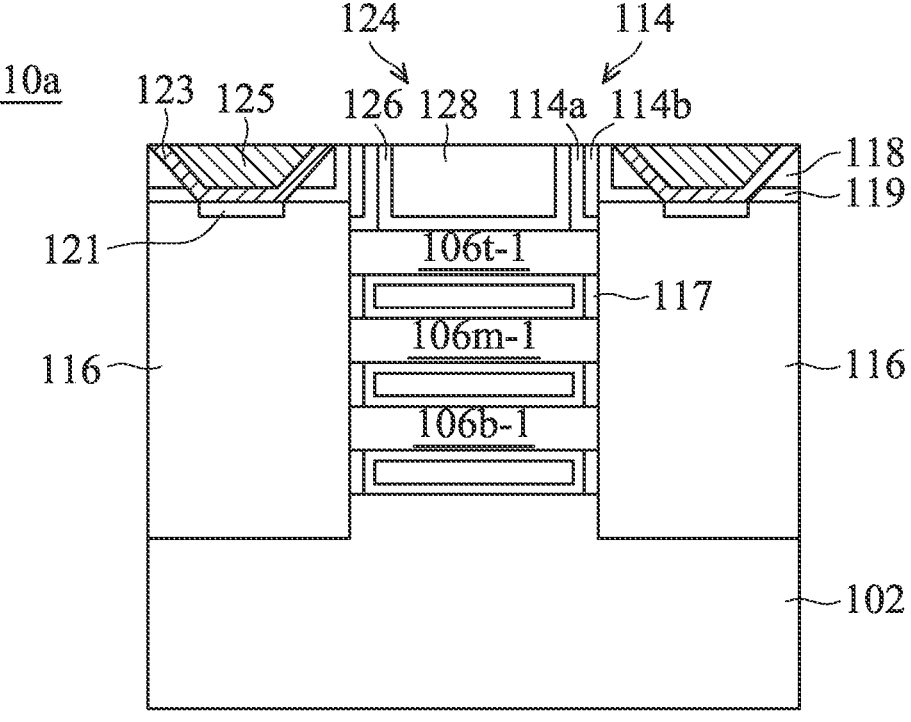

After the nanostructures 106-1 are formed, gate structures 124 are formed surrounding the nanostructures 106-1, as shown in FIGS. 2I-1 and 2I-2 in accordance with some embodiments. The gate structures 124 may be multi-layered structures. Each of the gate structures 124 may include a dielectric layer 126, which may include an interfacial layer and a high-k gate dielectric layer (not individually shown). A gate electrode 128 may include one or more conductive layers, such as one or more work function layers and a conductive fill layer (not individually shown). The nanostructures 106-1 may be surrounded and in direct contact with the interfacial layer, and the interfacial layers may be surrounded by the high-k gate dielectric layers. In addition, the high-k gate dielectric layers may be surrounded by the one or more work function layer, and the work function layers may be surrounded by the conductive fill layer.

The interfacial layers may be made of silicon oxide, and the interfacial layers may be formed by thermal oxidation. The high-k gate dielectric layer may include dielectric material, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other applicable high-k dielectric materials, or a combination thereof. The high-k gate dielectric layers may be formed by using CVD, ALD, other applicable methods, or a combination thereof.

The work function layers may be made of metal materials, and the metal materials may include N-work-function metal and/or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The P-work-function metal may include titanium nitride (TiN), tungsten nitride (WN), tantalum nitride (TaN), ruthenium (Ru) or a combination thereof. The work function layers may be formed by using CVD, ALD, other applicable methods, or a combination thereof.

The conductive fill layer may be made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another applicable material, or a combination thereof. The conductive fill layer may be formed by using CVD, ALD, electroplating, another applicable method, or a combination thereof.

In some embodiments, the gate structure 124 surrounds the nanostructures 106, which may enhance gate control ability. With wider bottom nanostructure 106b-1, the drive current may be higher, and the total resistance may be lowered.

Next, contacts are formed through the ILD structure 118 and the etch stop layer 119 to the source/drain epitaxial structure 116. The contacts may be formed by forming an opening through the ILD structure 118 and the etch stop layer 119 to expose the source/drain epitaxial structure 116. A metal semiconductor compound layer 121 may be formed over the source/drain epitaxial structure 116, as shown in FIG. 2I-2 in accordance with some embodiments. The metal semiconductor compound layer 121 may reduce the contact resistance between the source/drain epitaxial structure 116 and the subsequently formed contact structure 125 over the source/drain epitaxial structure 116. The metal semiconductor compound layer 121 may be made of titanium silicide (TiSi$_2$), nickel silicide (NiSi), cobalt silicide (CoSi), or other suitable low-resistance materials. The metal semiconductor compound layer 121 may be formed over the source/drain epitaxial structure 116 by forming a metal layer over the source/drain epitaxial structure 116 first. The metal layer may react with the source/drain epitaxial structure 116 in an annealing process and a metal semiconductor compound layer 121 may be produced. Afterwards, the unreacted metal layer may be removed in an etching process and the metal semiconductor compound layer 121 may be left.

Next, the contacts may include one or more layers. For example, in some embodiments a barrier layer 123 may be conformally formed over the bottom surface and the sidewalls of the source/drain openings and a contact structure 125 is formed over the barrier layer 123, as shown in FIG. 2I-2 in accordance with some embodiments. The barrier layer 123 may be formed before filling the conductive material in the source/drain opening 113 to prevent the conductive material from diffusing out. The barrier layer 123 may also serve as an adhesive or glue layer. The material of the barrier layer 123 may be TiN, Ti, other applicable materials, or a combination thereof. The barrier layer 123 may be formed by depositing the barrier layer 123 materials by a physical vapor deposition process (PVD) (e.g., evaporation or sputtering), an atomic layer deposition process (ALD), an electroplating process, other applicable processes, or a combination thereof.

The contact structure 125 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 125 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 125, and then a planarization process such as a chemical mechanical polishing (CMP) process or an etch back process is optionally performed to remove excess conductive materials of the contact structure 125 and the barrier layer 123. After the planarization process, the top surface of the contact structure 125 may be level with the top surface of gate structure 124 and the spacer layers 114.

It should be noted that, although there are three nanostructures 106b-1/106m-1/106t-1 shown in FIGS. 2I-1 and 2I-2, the number of the nanostructures 106-1 are not limited herein. For example, there may be a second middle nanostructure formed between the bottom nanostructure 106b-1 and the middle nanostructure 106m-1. In some embodiments wherein the bottom nanostructure 106b-1 is wider than or has a width substantially equal to the second middle nanostructure, and the second middle nanostructure is wider than or has an width substantially equal to the middle nanostructure 106m-1, and the bottom nanostructure 106b-1 and the top nanostructure 106t-1 have different widths, better device performance may be achieved.

In some embodiments, the top nanostructure 106t-1 has an average width 106tW, the middle nanostructure 106t-1 has an average width 106mW, and the bottom nanostructure 106b-1 has an average width 106bW. The ratio of the average width 106bW of the bottom nanostructure 106b-1 to the average width 106tW of the top nanostructure 106t-1 is in a range of about 1.1 to about 5. If the ratio of the average width 106bW to the average width 106tW is too great, the cell area may be too great and the device density may be too low. If the ratio of the average width 106bW and the average width 106tW is too small, the top nanostructure 106t-1 may be disappear, and the current may be too low.

With wider bottom nanostructure 106b-1 and narrower top nanostructure 106t-1, the drive current may be higher and the total resistance may be lower while the device area remains. The fin structure 110 with nanostructures 106-1 with different widths may be achieved by process compatible to conventional process flow. The nanostructures 106-1 profile may be achieved by an oxidation process and a wet etching process. Since the silicon oxides 136 formed over the sidewalls of different second semiconductor layers 106-1 have different thickness (e.g. widths), different nanostructures 106-1 may have different widths.

Figures 1, 3A:
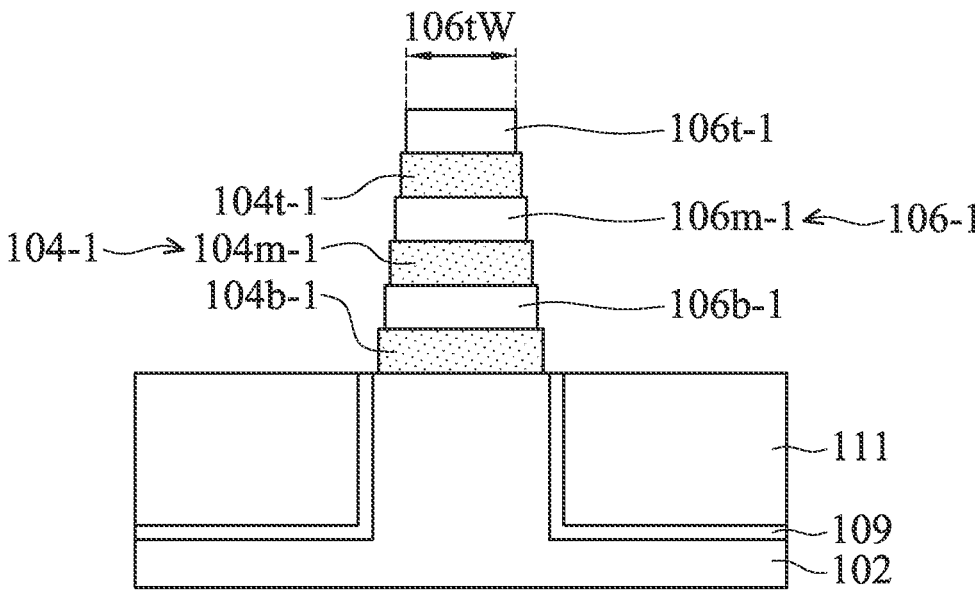
Figures 2, 3A:
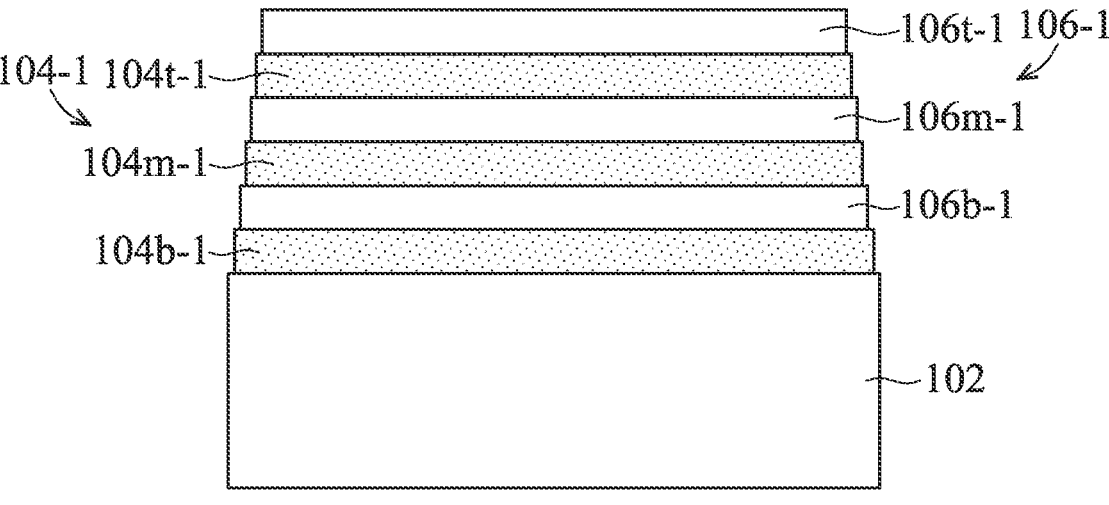
Figures 3, 3A:
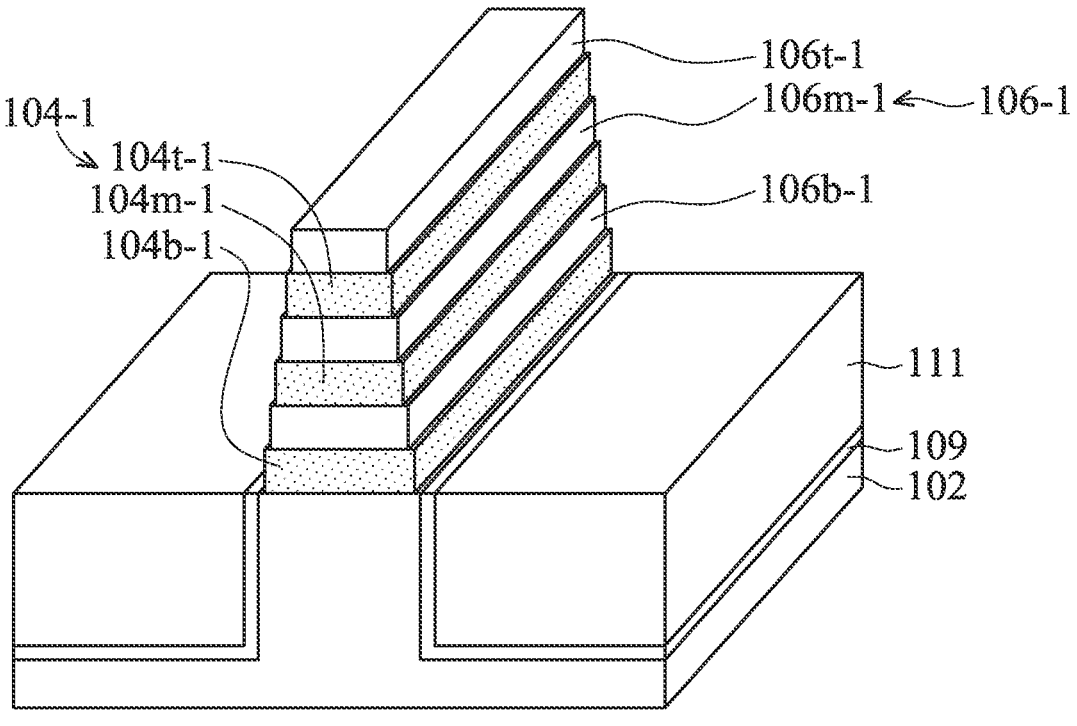
Figures 1, 3B:
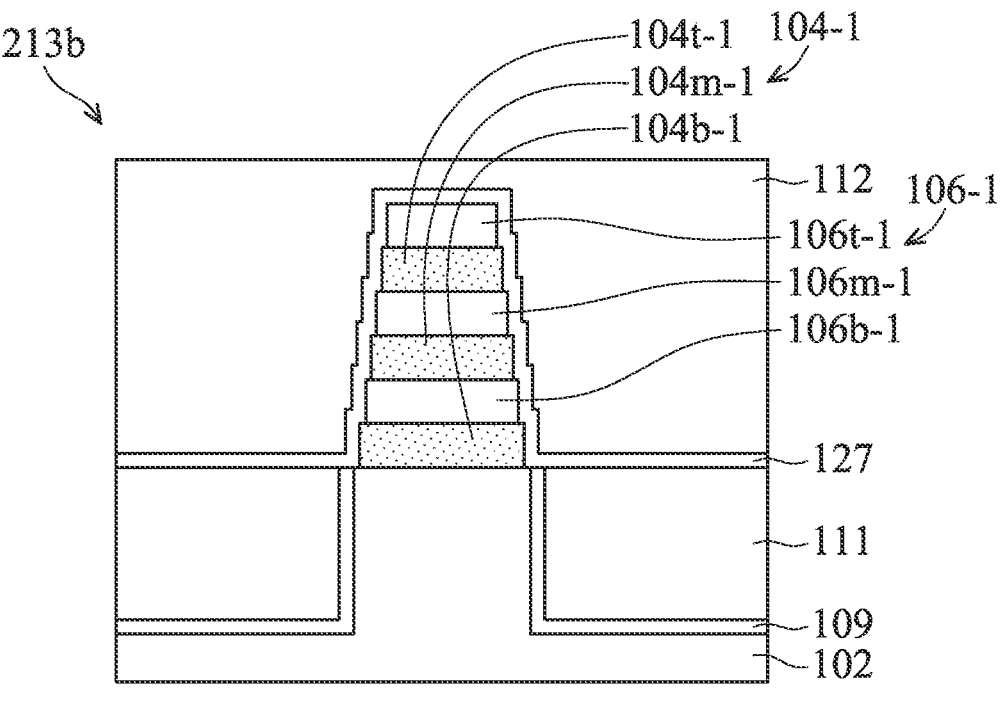
Figures 2, 3B:
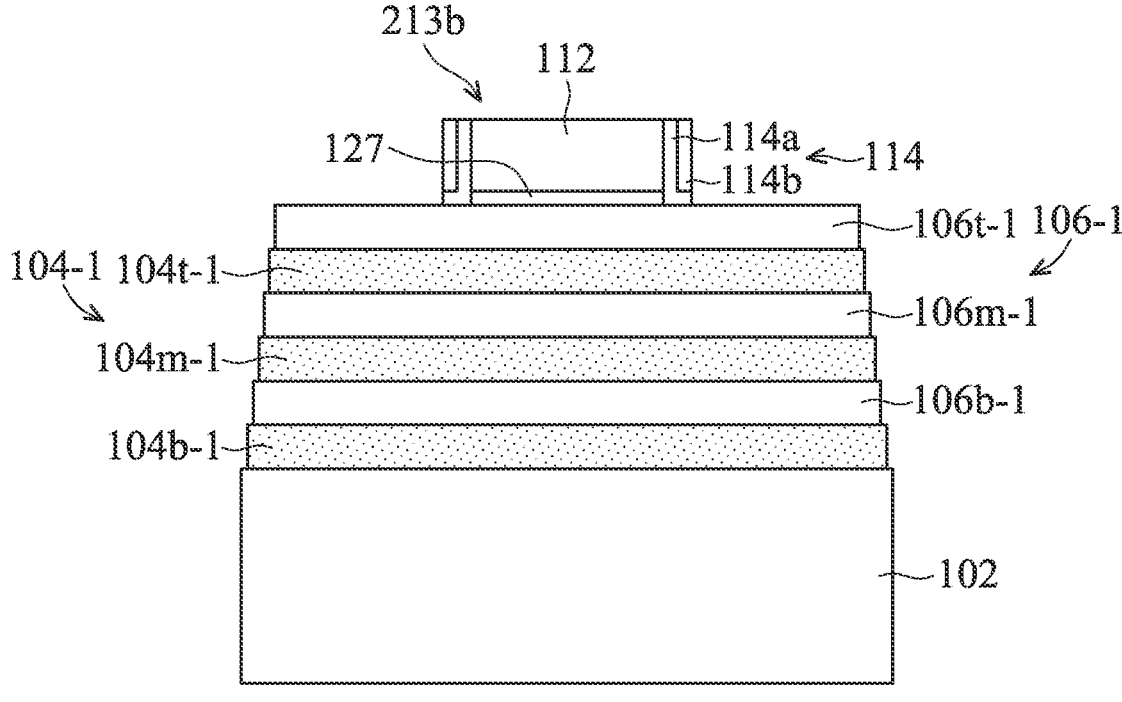
Figures 3, 3B:
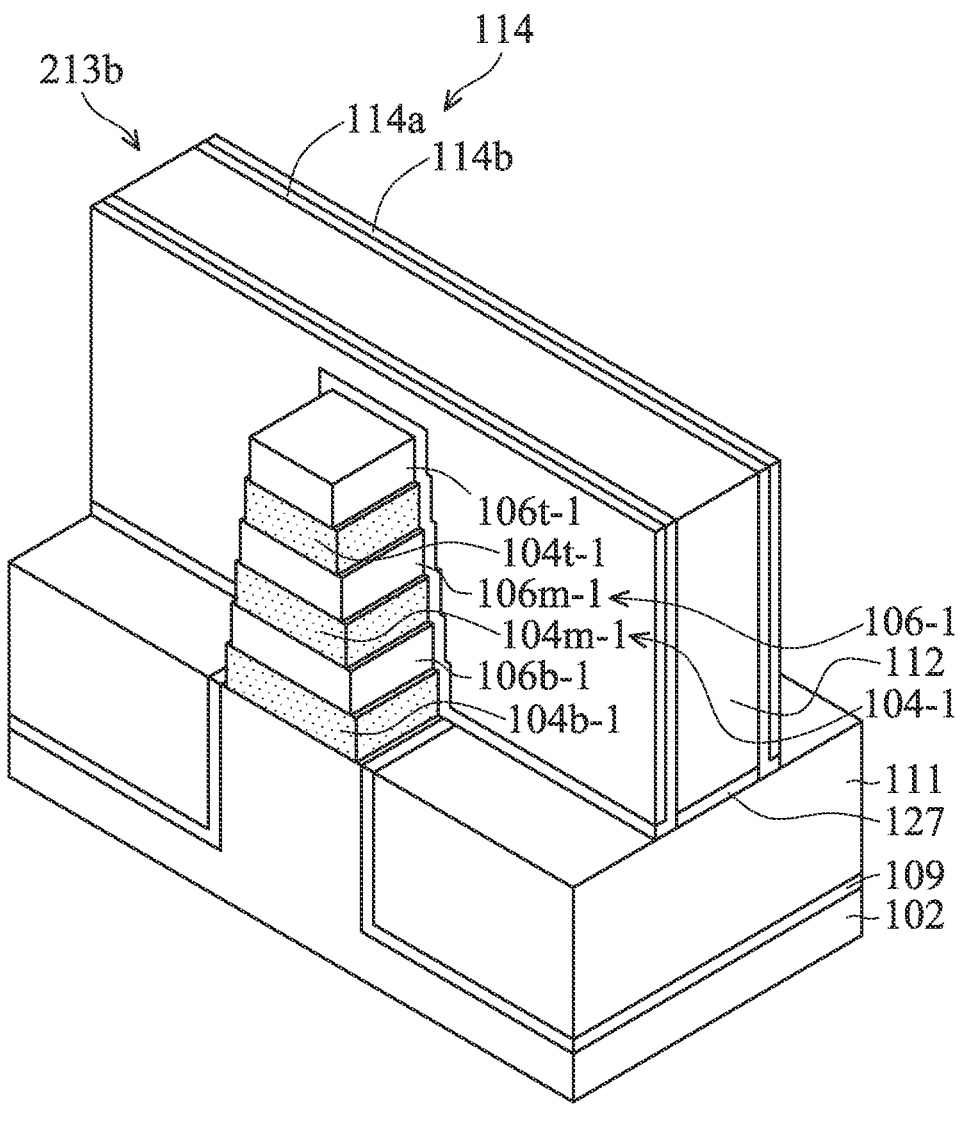

Many variations and/or modifications may be made to the embodiments of the disclosure. FIGS. 3A-1, 3A-2, 3B-1, 3B-2, 3C-1, 3C-2, 3D-1, 3D-2, 3E-1, 3E-2, 3F-1 and 3F-2 are cross-sectional representations of various stages of forming a semiconductor device structure 10b, in accordance with some embodiments of the disclosure. FIGS. 3A-3 and 3B-3 are perspective representations of various stages of forming the semiconductor device structure 10b, in accordance with some embodiments of the disclosure. Some processes or devices are the same as, or similar to, those described in the embodiments above, and therefore the descriptions of these processes and devices are not repeated herein. FIGS. 3A-1, 3A-2, and 3A-3 assume a structure such as that discussed above with reference to FIGS. 2B-1, 2B-2, and 2B-3 has been formed, wherein like reference numerals refer to like elements. FIGS. 3A-1, 3A-2, and 3A-3 further illustrate that, in accordance with some embodiments, the silicon oxides 136 formed over the sidewalls of the second semiconductor layers 106-1 and the silicon germanium oxides 137 formed over the sidewalls of the first semiconductor layers 104-1 are completely removed before forming the dummy gate structure 213b. As described previously, the silicon oxides 136 and the silicon germanium oxides 137 may have different thicknesses (e.g. widths) at different level, and after removing the silicon oxides 136 and the silicon germanium oxides 137, the exposed sidewalls of the second semiconductor layers 106-1 and the sidewalls of the first semiconductor layers 104-1 of the fin structure 110 may have a stair shape in the cross-sectional view.

The silicon oxides 136 and the silicon germanium oxides 137 may be removed by a dry etching process or a wet etching process, and/or other suitable etching processes. In some embodiments, the silicon oxides 136 and the silicon germanium oxides 137 are removed by a wet etching process. The wet etching process may be performed under a temperature in a range of from room temperature to about 80° C.

In some embodiments, the silicon oxides 136 and the silicon germanium oxides 137 are removed by the same etchant such as dilute HF. For example, dilute HF may etch the silicon oxides 136 at a faster rate than the silicon germanium oxides 137. As such, the etchant used in the etching process performed to remove both the silicon oxides 136 and the silicon germanium oxides 137 may be the same as that used in the etching process performed to remove the silicon oxides 136 described previously (e.g. shown in FIGS. 2A-1 to 2I-1), but the etching process is performed for a longer time to remove both the silicon oxides 136 and the silicon germanium oxides 137.

Afterwards, a dummy gate structure 213b including the dummy gate dielectric layer 127 and the dummy gate electrode layer 112 is formed over and across the fin structures 110, as shown in FIGS. 3B-1, 3B-2 and 3B-3 in accordance with some embodiments. That is, the dummy gate structure 213b is formed over the step shaped sidewalls of the fin structures 110 in accordance with some embodiments. In some embodiments, the dummy gate structure 213b covers the top surface of the top second semiconductor layer 106t-1 and also partially covers the top surfaces of the middle second semiconductor layer 106m-1, the bottom second semiconductor layer 106b-1, the top first semiconductor layer 104t-1, the middle first semiconductor layer 104m-1 and the bottom first semiconductor layer 104b-1. In some embodiments, the dummy gate dielectric layer 127 is in contact with the sidewalls and the top surfaces of both the second semiconductor layers 106-1 and the first semiconductor layers 104-1. The dummy gate structure 213b may be formed using similar processes/materials as the dummy gate structure 213a discussed above with reference to FIGS. 2D-1, 2D-2, and 2D-3.

Figures 1, 3C:
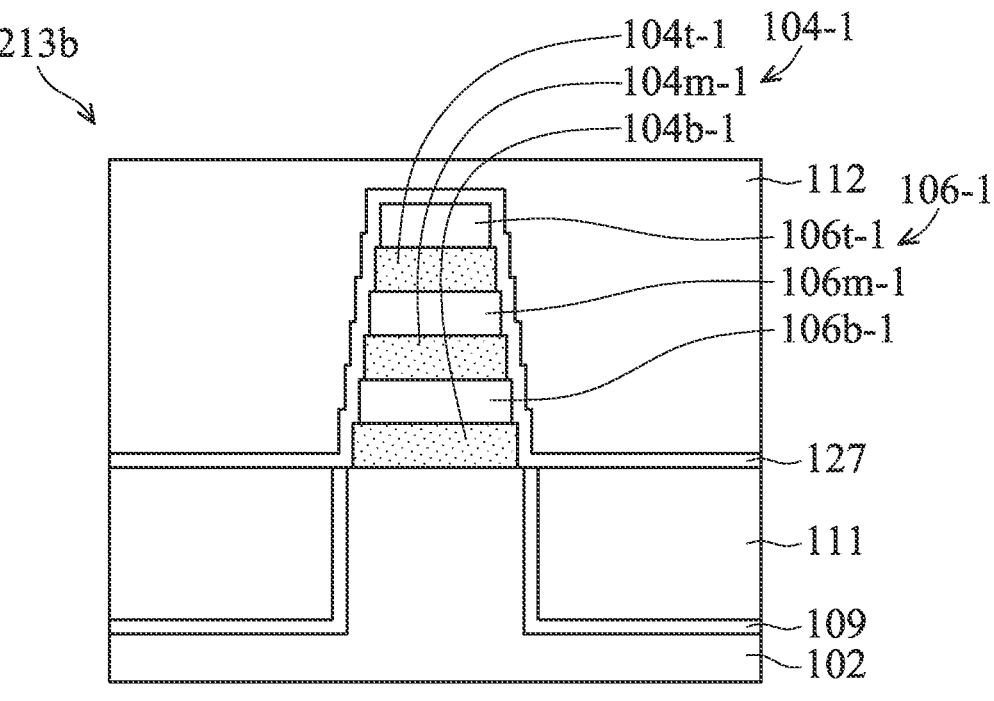
Figures 2, 3C:
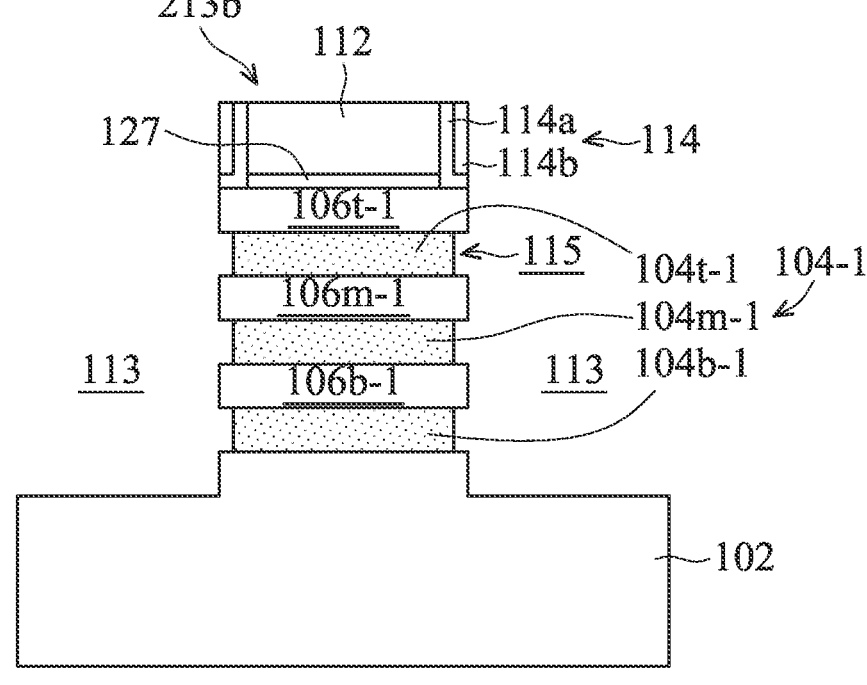
Figures 1, 3D:
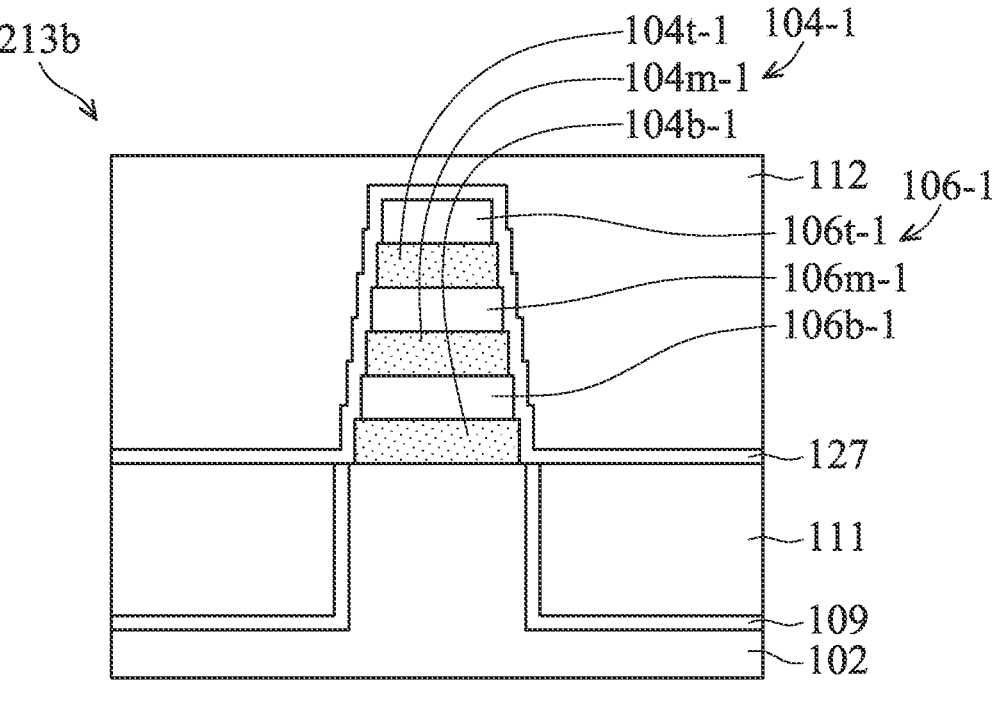
Figures 2, 3D:
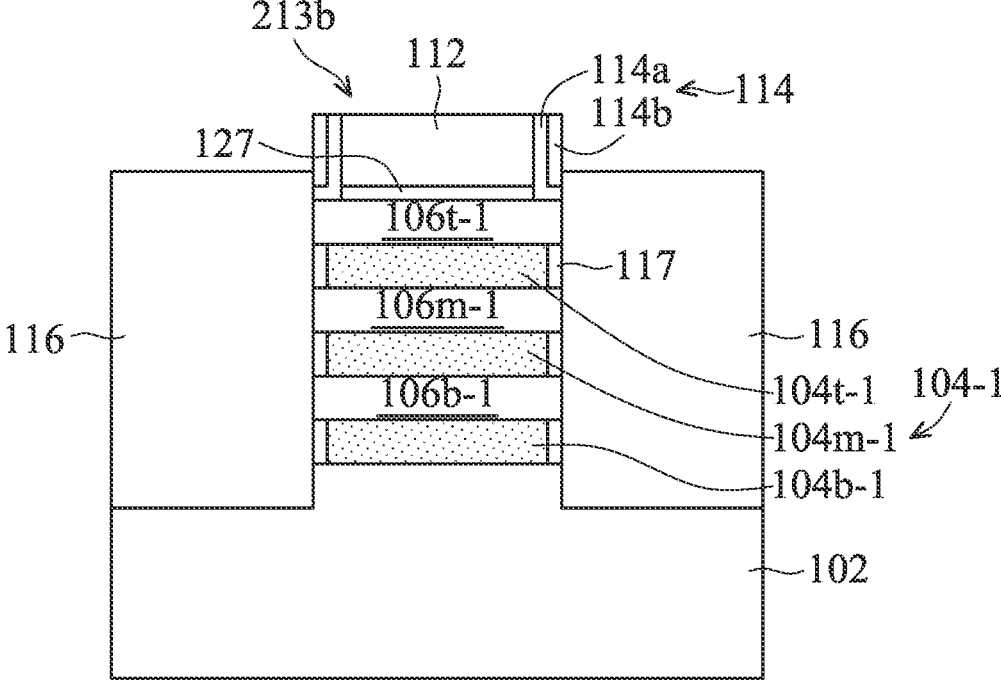

Next, source/drain recesses 113 are formed on opposite sides of the dummy gate structure 213b, and recesses 115 are formed at opposite sides of the first semiconductor layers 104-1, as shown in FIGS. 3C-1 and 3C-2 in accordance with some embodiments. Afterwards, inner spacers 117 are formed in the recesses 115, and the source/drain epitaxial structures 116 are formed in the source/drain recesses 113, as shown in FIGS. 3D-1 and 3D-2 in accordance with some embodiments. The recesses 113 and 115, the inner spacers 117, and the source/drain epitaxial structures 116 may be formed using similar processes/materials as discussed above.

Figures 1, 3E:
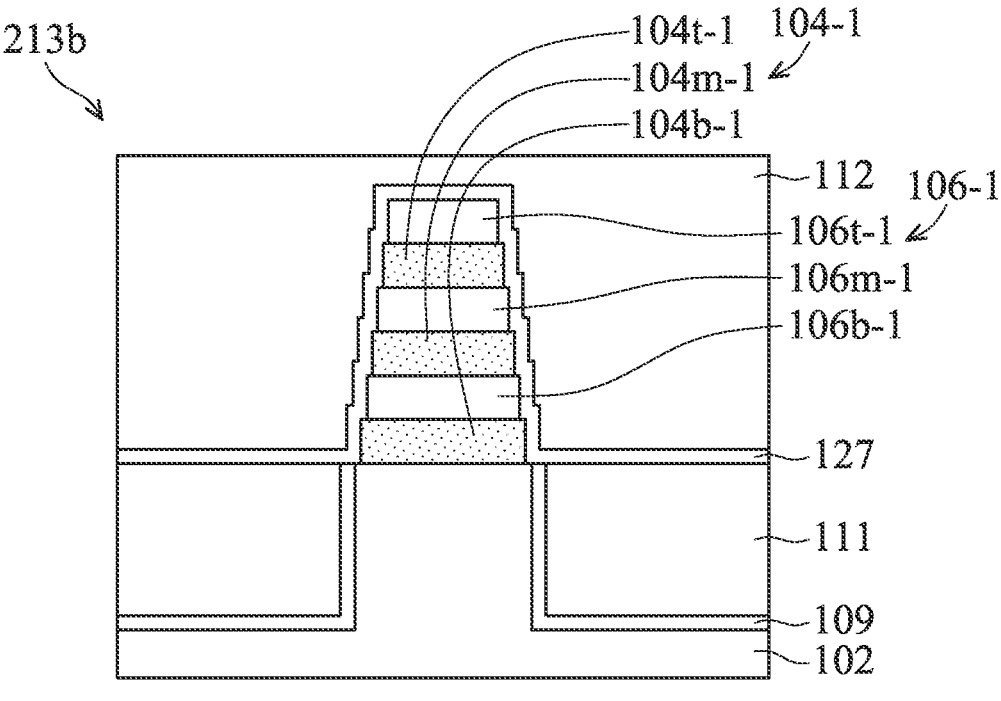
Figures 2, 3E:
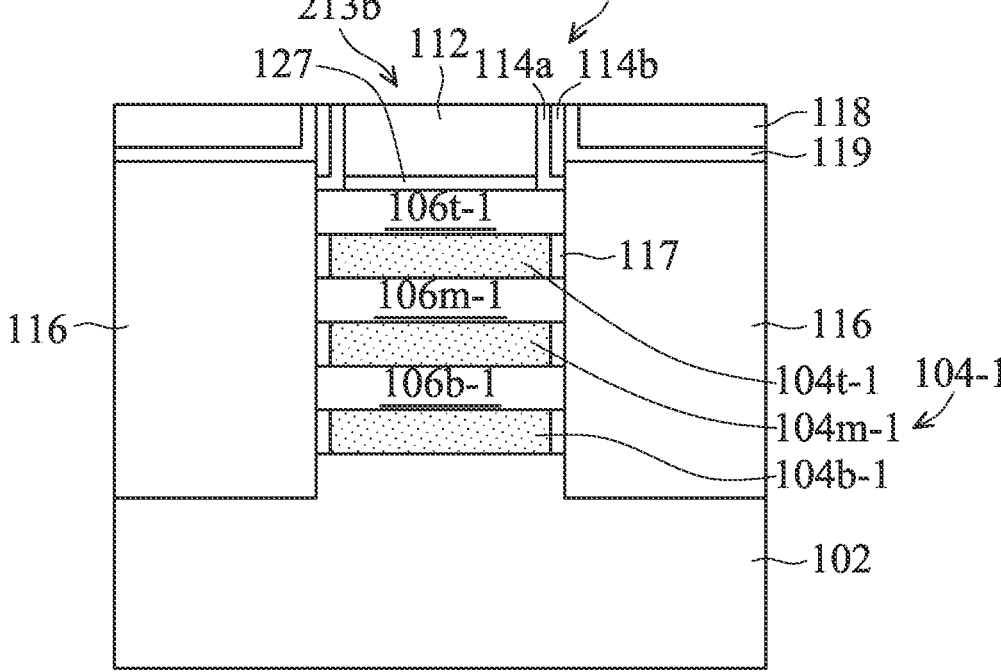

Afterwards, an etch stop layer 119 is formed over the source/drain epitaxial structure 116, and an ILD structure 118 is formed over the etch stop layer 119, as shown in FIGS. 3E-1 and 3E-2 in accordance with some embodiments. The etch stop layer 119 and the ILD structure 118 may be formed using similar processes/materials as discussed above.

Figures 1, 3F:
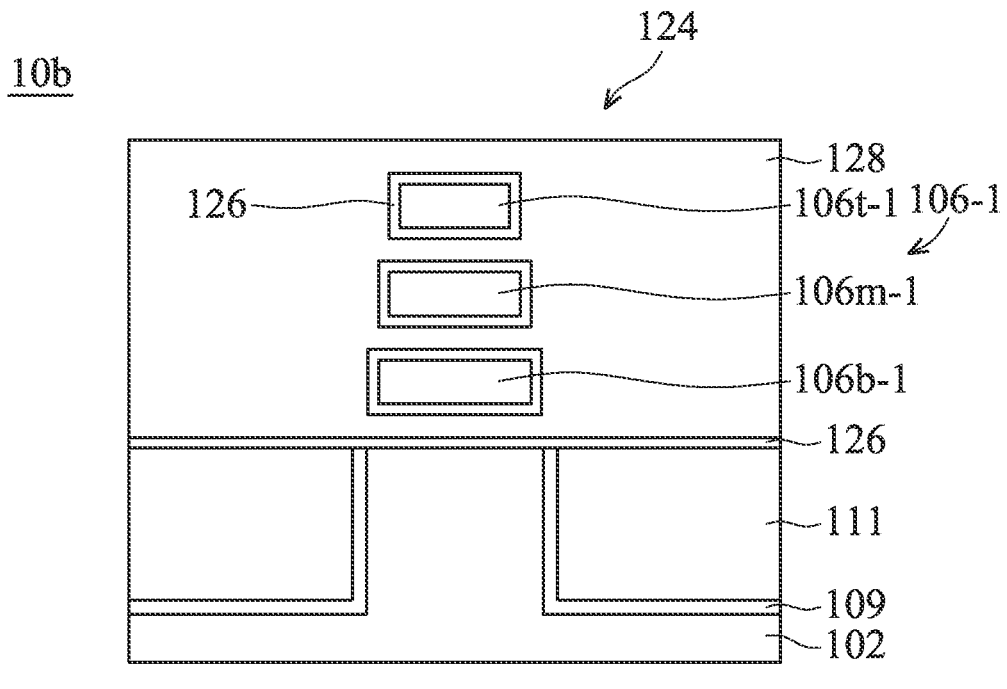
Figures 2, 3F:
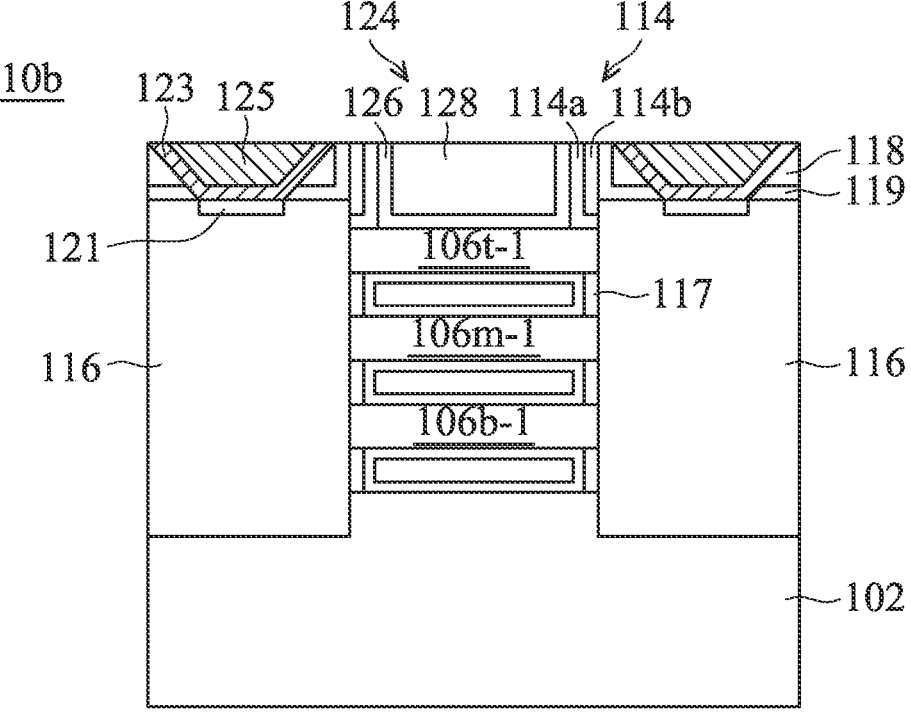

Next, the first semiconductor layers 104-1 are removed to form the nanostructures 106-1 with the second semiconductor layers 106-1, and a gate structure 124 including an interfacial layer and a high-k dielectric layer 126, and a gate electrode 128 is formed surrounding the nanostructures 106-1, as shown in FIGS. 3F-1 and 3F-2 in accordance with some embodiments, using similar processes/materials as discussed above. In addition, the contact structure 125 is over the source/drain epitaxial structure 116, as shown in FIG. 3F-2 in accordance with some embodiments, using similar processes/materials as discussed above.

With wider bottom nanostructure 106b-1 and narrower top nanostructure 106t-1, the drive current may be higher and the total resistance may be lower while the device area remains. The nanostructures 106-1 profile may be achieved by an oxidation process and a wet etching process. Since the silicon oxides 136 formed over the sidewalls of the second semiconductor layers 106-1 have different thickness, the nanostructures 106-1 may have different width. The profile of nanostructures 106-1 may be achieved by an oxidation process and a wet etching process. Since the silicon oxides 136 formed over the sidewalls of the second semiconductor layers 106-1 have different thicknesses, the nanostructures 106-1 may have different widths. The silicon germanium oxides 137 formed over the sidewalls of the first semiconductor layers 104-1 may be removed before forming the dummy gate structure 213b.

Figures 1, 2, 4A:
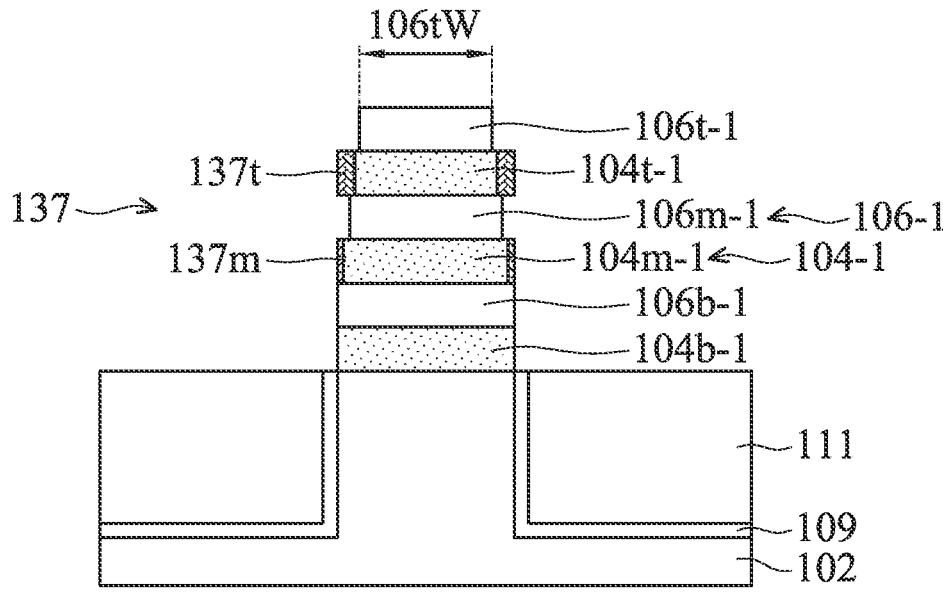
Figures 3, 4A:
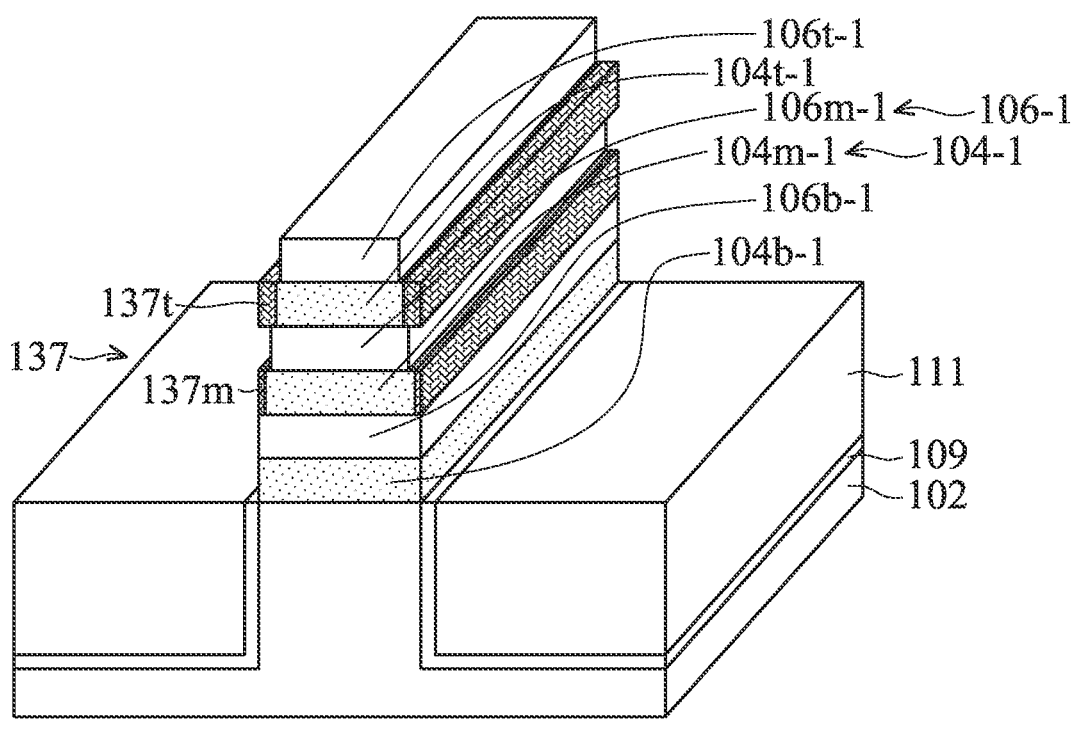
Figures 1, 4B:
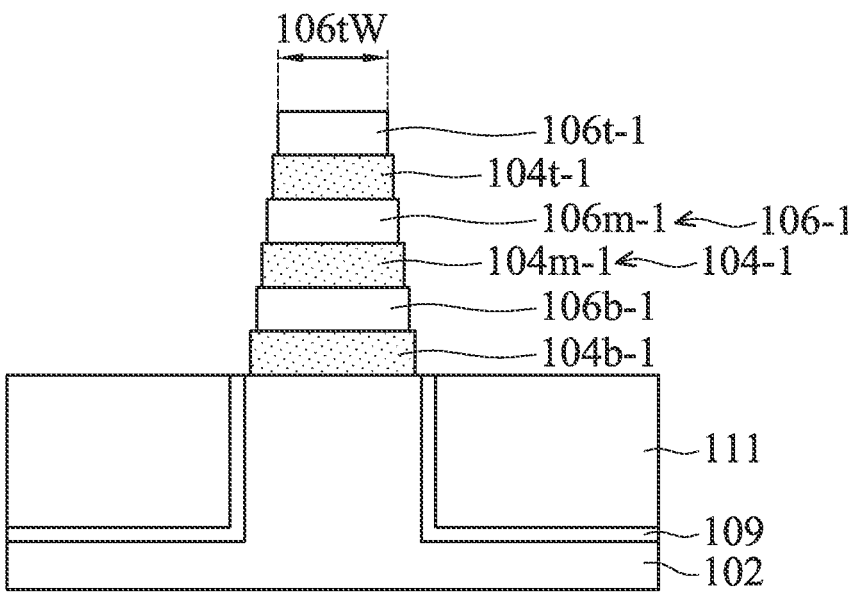
Figures 2, 4B:
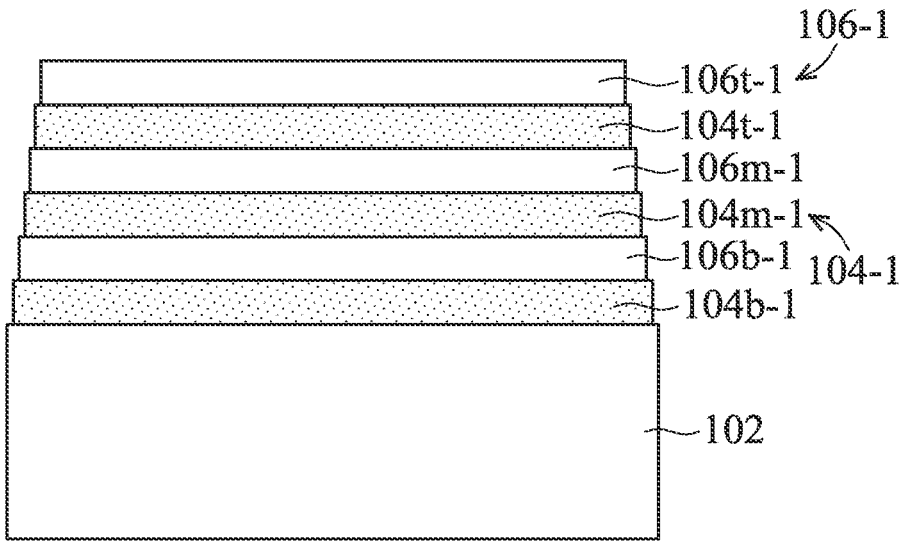
Figures 3, 4B:
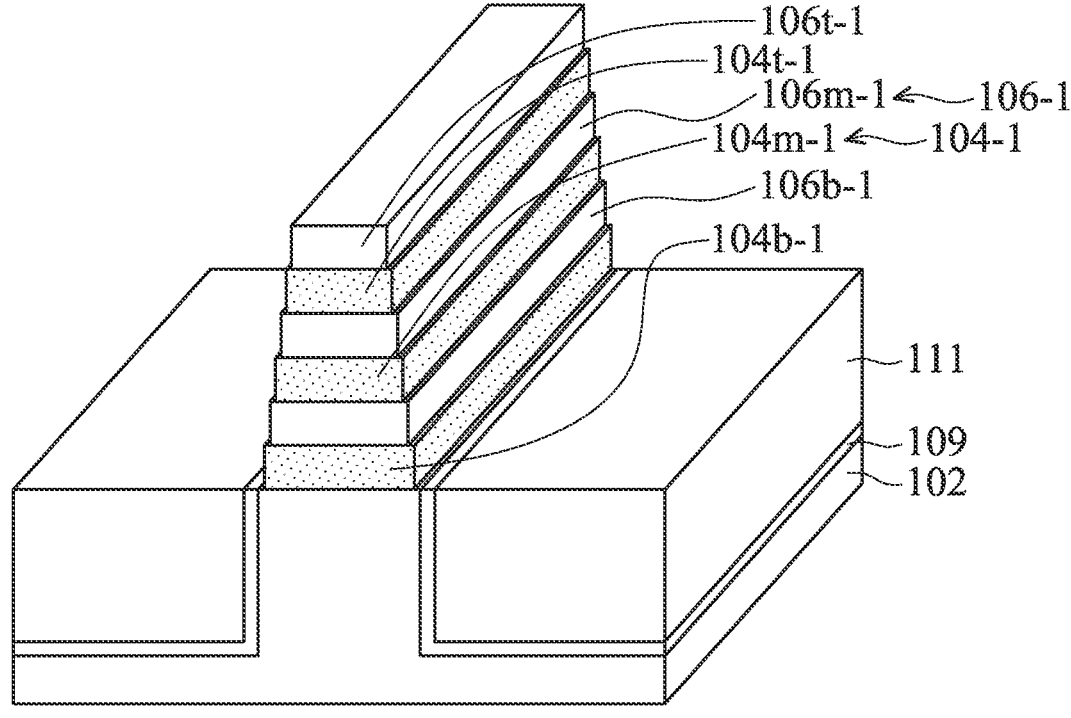
Figures 1, 2, 4C:
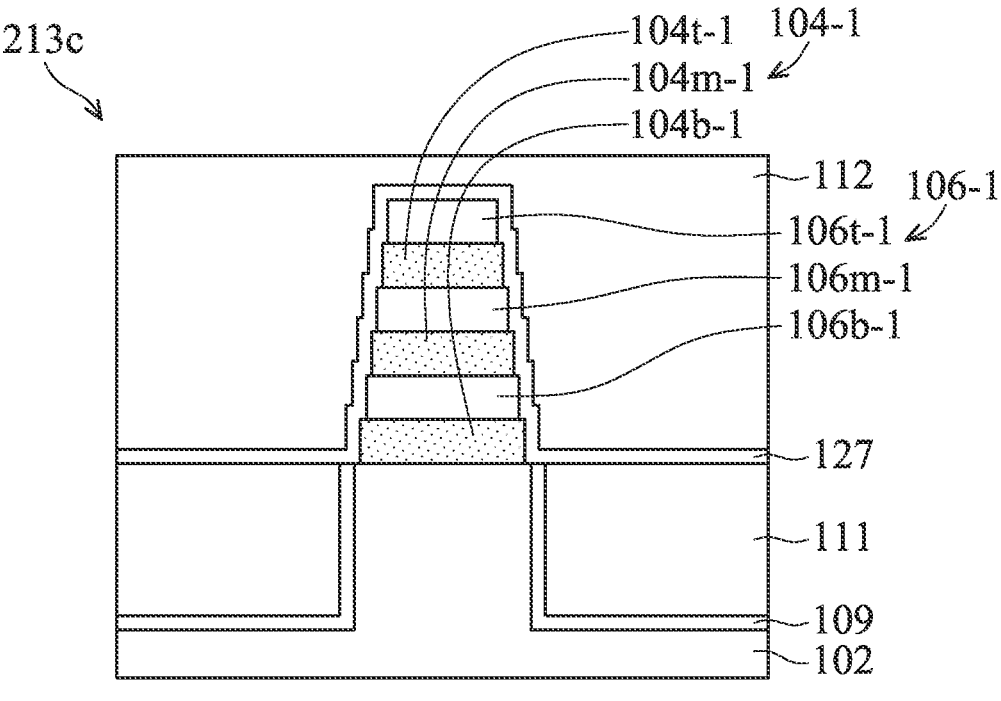
Figures 3, 4C:
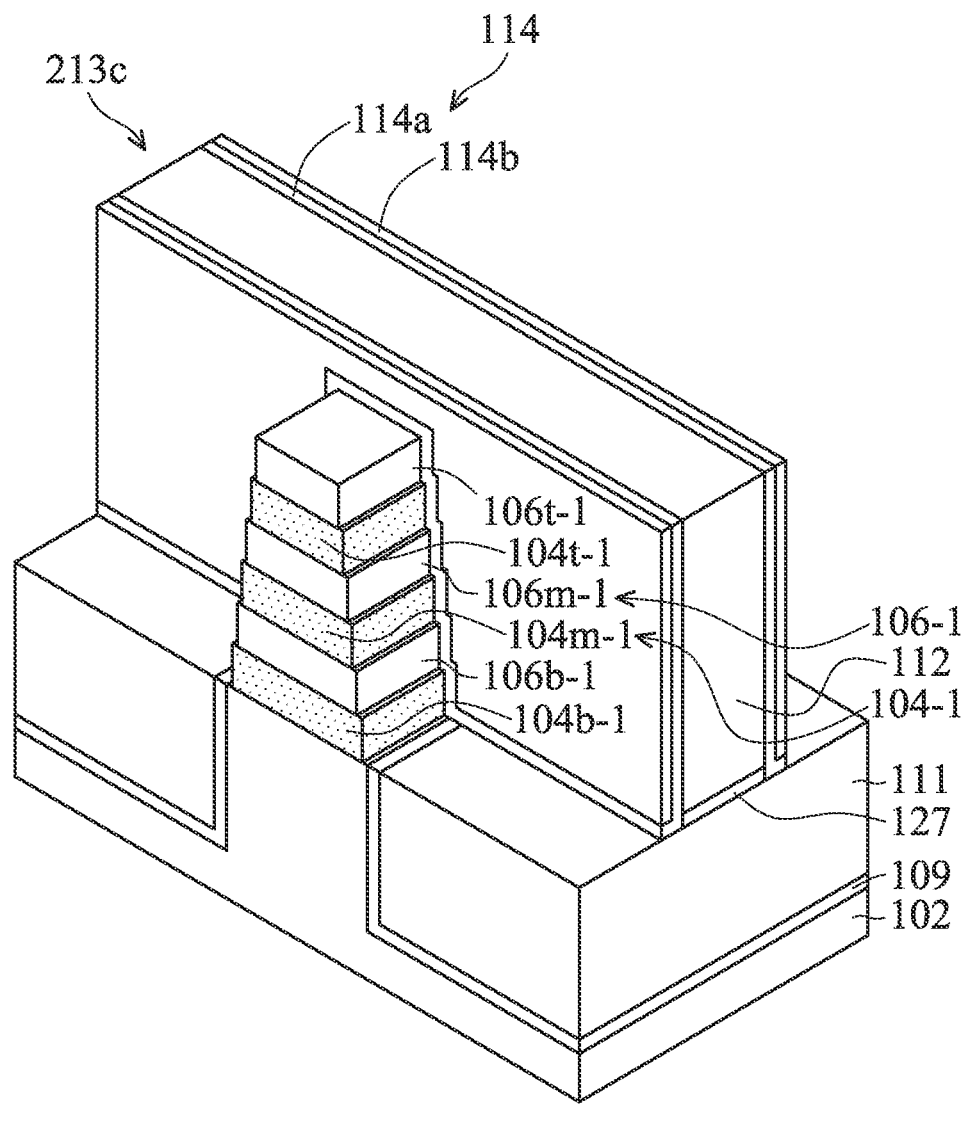

Many variations and/or modifications may be made to the embodiments of the disclosure. FIGS. 4A-1, 4A-2, 4B-1, 4B-2, 4C-1, 4C-2, 4D-1 and 4D-2 are cross-sectional representations of various stages of forming a semiconductor device structure 10c, in accordance with some embodiments of the disclosure. FIGS. 4A-3 and 4B-3 are perspective representations of various stages of forming a semiconductor device structure 10c and assume a structure such as that discussed above with reference to FIGS. 2B-1, 2B-2, and 2B-3 has been formed, wherein like reference numerals refer to like elements.

After the processes discussed above with reference to FIGS. 2A-1, 2A-2, 2A-3, 2B-1, 2B-2 and 2B-3 is performed to form the silicon oxides 136 over sidewalls of the second semiconductor layers 106-1 and the silicon germanium oxides 137 over sidewalls of the first semiconductor layers 104-1, the silicon oxides 136 over sidewalls of the second semiconductor layers 106-1 and the bottom silicon germanium oxide 137b are completely removed, while the middle silicon germanium oxide 137m and the top silicon germanium oxide 137t are only partially removed. The silicon oxides 136 and the silicon germanium oxides 137 may be removed by an etching process using dHF as etchants. Since the etching rate of the silicon oxides 136 and the silicon germanium oxides 137 are different, the silicon germanium oxides 137 may be only partially removed while the silicon oxides 136 are completely removed. The amount of remaining silicon germanium oxide 137 may be controlled by modifying the etching time and the amount of etchant in the etching process.

That is, only the middle silicon germanium oxide 137m and the top silicon germanium oxide 137t remain and protrude from the sidewalls of the fin structure 110. In some embodiments, the sidewalls of the bottom first semiconductor layer 104b-1 are exposed. The sidewalls of the second semiconductor layers 106-1 are also exposed.

Next, the middle silicon germanium oxides 137m and top silicon germanium oxides 137t formed over the sidewalls of the first semiconductor layers 104-1 may be removed, as shown in FIGS. 4B-1, 4B-2 and 4B-3 in accordance with some embodiments. The middle silicon germanium oxides 137m and top silicon germanium oxides 137t may be removed by performing an additional etching process. The etching process may also use dHF as etchants, but the concentration of the dHF may be higher than that used in the previous etching process. In some embodiments, the sidewalls of the first semiconductor layers 104-1 and the second semiconductor layers 106-1 are exposed.

Afterwards, a dummy gate structure 213c including the dummy gate dielectric layer 127 and the dummy gate electrode layer 112 is formed over and across the fin structures 110, as shown in FIGS. 4C-1, 4C-2 and 4C-3 in accordance with some embodiments. The dummy gate dielectric layer 127 and the dummy gate electrode layer 112 may covers the step shaped sidewalls of the second semiconductor layers 106-1 and the sidewalls of the first semiconductor layers 104-1, similar to the dummy gate structure 213b. In some embodiments, the dummy gate dielectric layer 127 is in contact with the sidewalls and the top surfaces of the second semiconductor layers 106-1 and the sidewalls of the first semiconductor layers 104-1.

Figures 1, 4D:
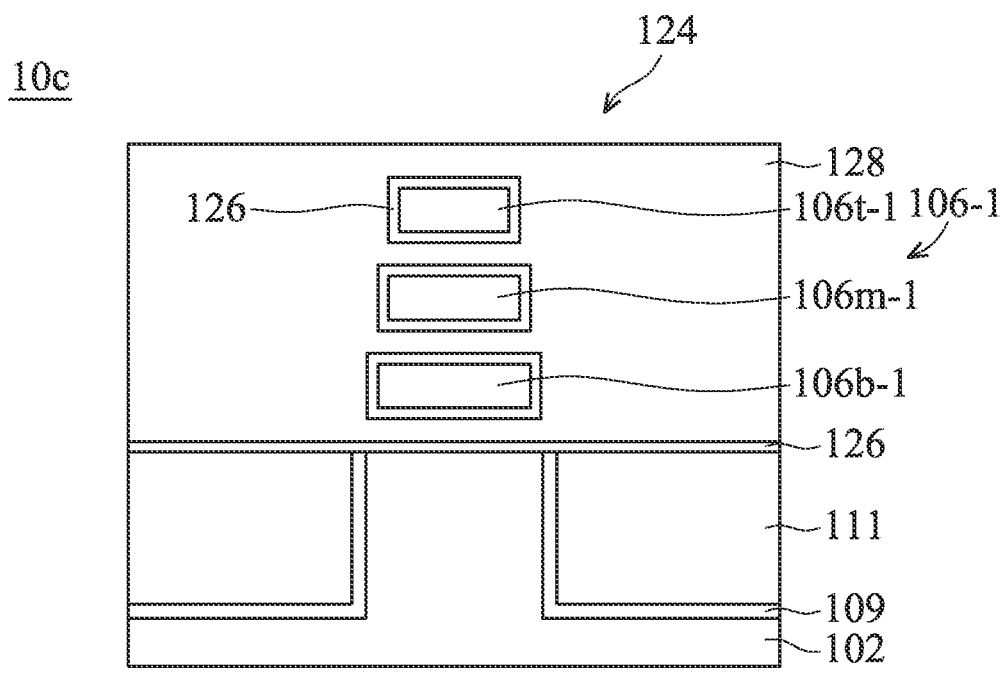
Figures 2, 4D:
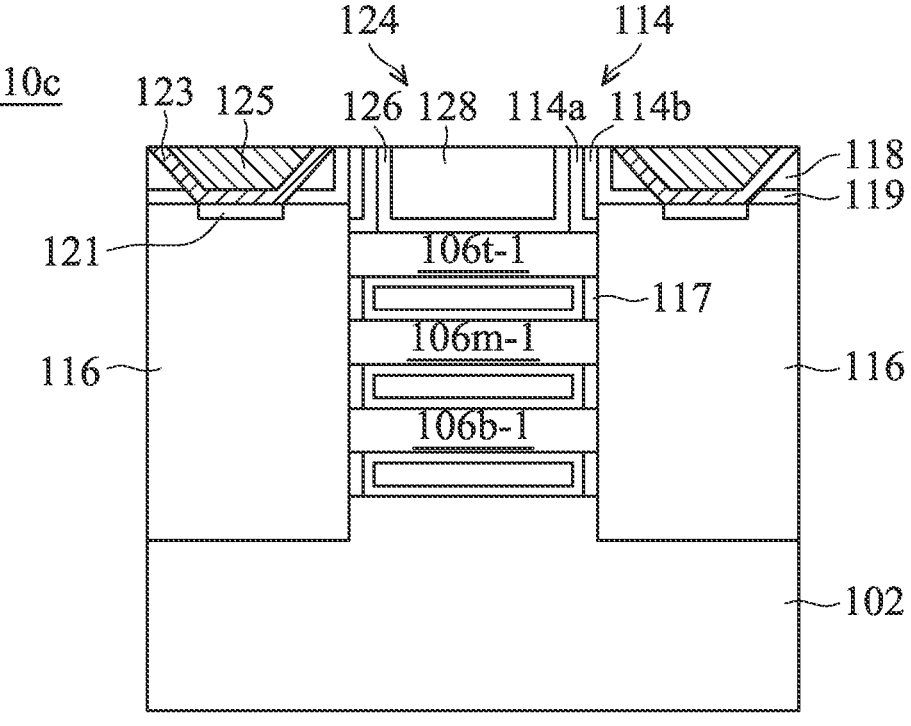

Afterwards, inner spacers 117 are formed on the opposite sides of the first semiconductor layers 104-1, and the source/drain epitaxial structures 116 are formed on the opposite sides of the dummy gate structure 213c, as shown in FIGS. 4D-1 and 4D-2 in accordance with some embodiments. Next, an etch stop layer 119 is formed over the source/drain epitaxial structure 116, and an ILD structure 118 is formed over the etch stop layer 119, as shown in FIG. 4D-2 in accordance with some embodiments.

Next, a gate structure 124 including an interfacial layer and a high-k dielectric layer 126, and a gate electrode 128 is formed surrounding the nanostructures 106, as shown in FIGS. 4D-1 and 4D-2 in accordance with some embodiments. In addition, the contact structure 125 is over the source/drain epitaxial structure 116, as shown in FIGS. 4D-2 in accordance with some embodiments.

The processes and materials for forming the dummy gate structure 213c, the inner spacers 117, the source/drain epitaxial structures 116, the etch stop layer 119, the ILD structure 118, the gate structure 124, the gate electrode 128, and the contact structure 125 as shown in FIGS. 4C-1, 4C-2, 4C-3, 4D-1 and 4D-2 may be the same as, or similar to, those used to form the dummy gate structure 213a, the inner spacers 117, the source/drain epitaxial structures 116, the etch stop layer 119, the ILD structure 118, the gate structure 124, the gate electrode 128, and the contact structure 125 in the previous embodiments. For the purpose of brevity, the descriptions of these processes are not repeated herein.

With wider bottom nanostructure 106b-1 and narrower top nanostructure 106t-1, the drive current may be higher and the total resistance may be lower while the device area remains. The nanostructures 106-1 profile may be achieved by an oxidation process and a wet etching process. Since the silicon oxides 136 formed over the sidewalls of the second semiconductor layers 106-1 have different thickness, the nanostructures 106-1 may have different width. The nanostructures 106-1 profile may be achieved by an oxidation process and a wet etching process. Since the silicon oxides 136 formed over the sidewalls of the second semiconductor layers 106-1 have different thickness, the nanostructures 106-1 may have different width. The silicon germanium oxides 137 formed over the sidewalls of the first semiconductor layers 104-1 may be partially removed when removing the silicon oxides 136 formed over the sidewalls of the second semiconductor layers 106-1 and the silicon germanium oxides 137 may be completely removed before forming the dummy gate structure.

Many variations and/or modifications may be made to the embodiments of the disclosure. FIGS. 5A-1, 5A-2, 5B-1, 5B-2, 5C-1, 5C-2, 5D-1, 5D-2, 5E-1, 5E-2, 5F-1, 5F-2, 5G-1, 5G-2, 5H-1 and 5H-2 are cross-sectional representations of various stages of forming a semiconductor device structure 10d, in accordance with some embodiments of the disclosure. FIGS. 5A-3, 5B-3 and 5C-3 are perspective representations of various stages of forming the semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 5A-1 and 5A-3 in accordance with some embodiments, the fin structure 110 has tapered sidewalls.

More specifically, the first semiconductor layers 104-1 and second semiconductor layers 106-1 may be alternating stacked over the substrate 102 and the pad layer 108-1 may be formed over the semiconductor stack. Next, the pad layer 108-1 and the semiconductor stack may be patterned to form a fin structure 110 having the tapered sidewalls, as shown in FIGS. 5A-1, 5A-2 and 5A-3 in accordance with some embodiments. The fin structure 110 having the tapered sidewalls may be formed by forming a photoresist layer in a trapezoid shape and patterning the semiconductor stack to form the fin structure 110 with the same slope of the photoresist layer. The photoresist may be formed using a suitable energy source such as a flood exposure to wideband light, thermal reflow treatments, or lifting the exposure focus.

Afterwards, the oxidation process 134 is performed, and the silicon oxides 136 may be formed over the tapered sidewalls of the second semiconductor layers 106-1. In addition, silicon germanium oxides 137 may be formed over the sidewalls of the first semiconductor layers 104-1. Since the original fin structure 110 has tapered sidewalls, the silicon oxides 136 and the silicon germanium oxides 137 may also have tapered sidewalls. In addition, the un-oxidized portion of the second semiconductor layers 106-1 and the first semiconductor layers 104-1 may also have tapered sidewalls.

Afterwards, the silicon oxides 136 over the sidewalls of the second semiconductor layers 106-1 and the pad layer 108-1 are removed, as shown in FIGS. 5B-1, 5B-2 and 5B-3 in accordance with some embodiments. In some embodiments, since the silicon germanium oxides 137 over the sidewalls of the first semiconductor layers 104-1 remains, the silicon germanium oxides 137 protrudes from the sidewalls of the fin structure 110. In some embodiments, the sidewalls of the second semiconductor layers 106-1 are exposed. Each of the exposed second semiconductor layers 106-1 may have tapered sidewalls.

Afterwards, a dummy gate structure 213d including the dummy gate dielectric layer 127 and the dummy gate electrode layer 112 is formed over and across the fin structures 110, as shown in FIGS. 5C-1, 5C-2 and 5C-3 in accordance with some embodiments. More specifically, the dummy gate structure 213d is formed over the tapered sidewalls of the second semiconductor layers 106-1 and the tapered sidewalls of the silicon germanium oxides 137 in accordance with some embodiments. In addition, the dummy gate structure 213d has extending portions sandwiched between the protruding silicon germanium oxides 137 in accordance with some embodiments.

The dummy gate dielectric layer 127 and the dummy gate electrode layer 112 may cover the sidewalls of the second semiconductor layers 106-1 and the sidewalls of the first semiconductor layers 104-1. In some embodiments, the dummy gate dielectric layer 127 is in contact with the sidewalls of the second semiconductor layers 106-1 and the silicon germanium oxides 137.

Figures 1, 5A:
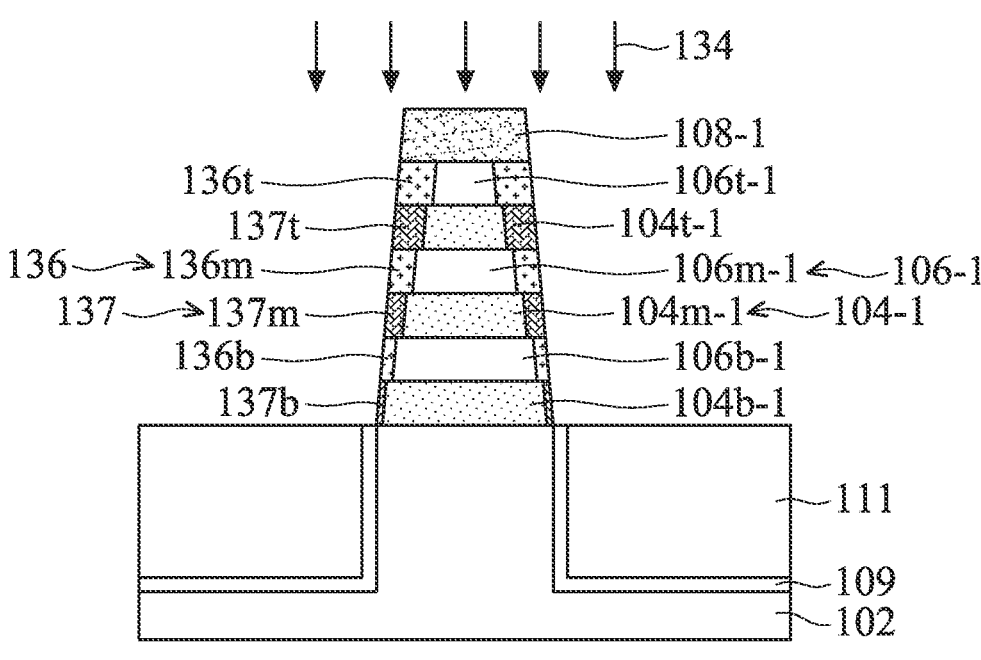
Figures 2, 5A:
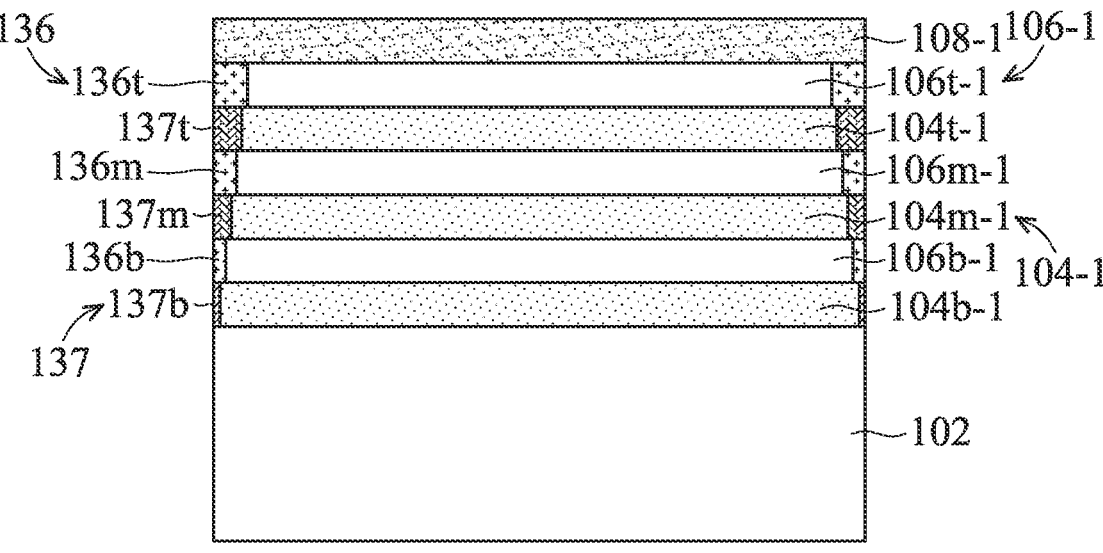
Figures 3, 5A:
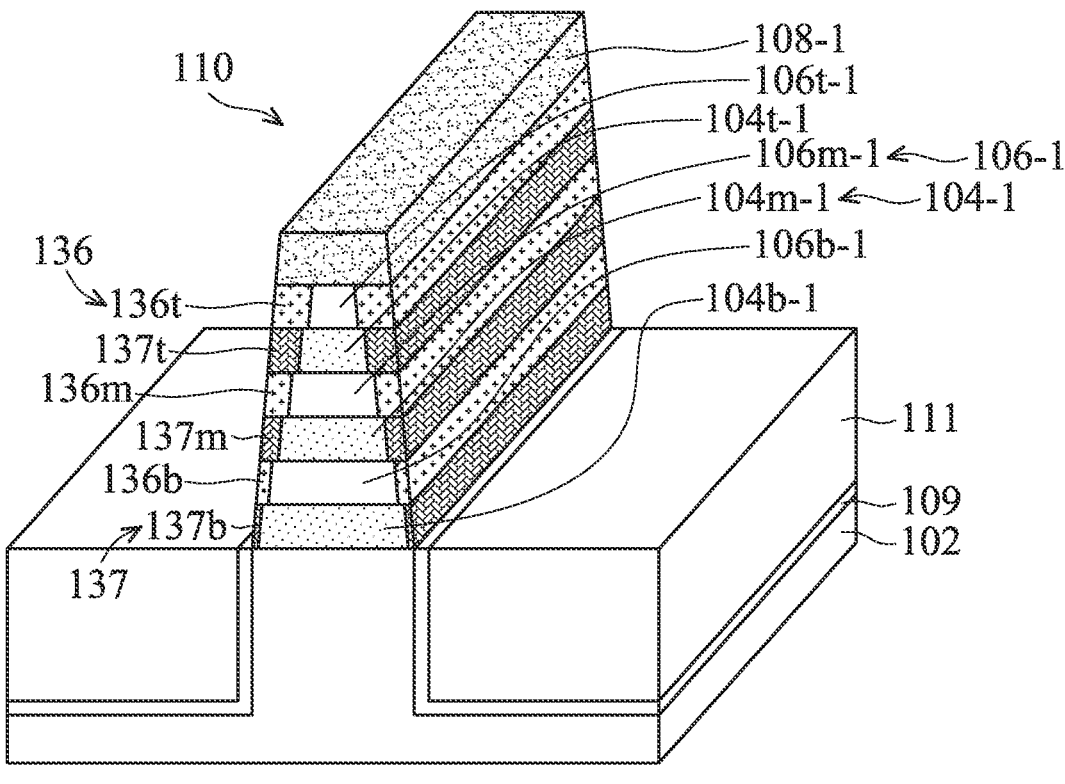
Figures 1, 5B:
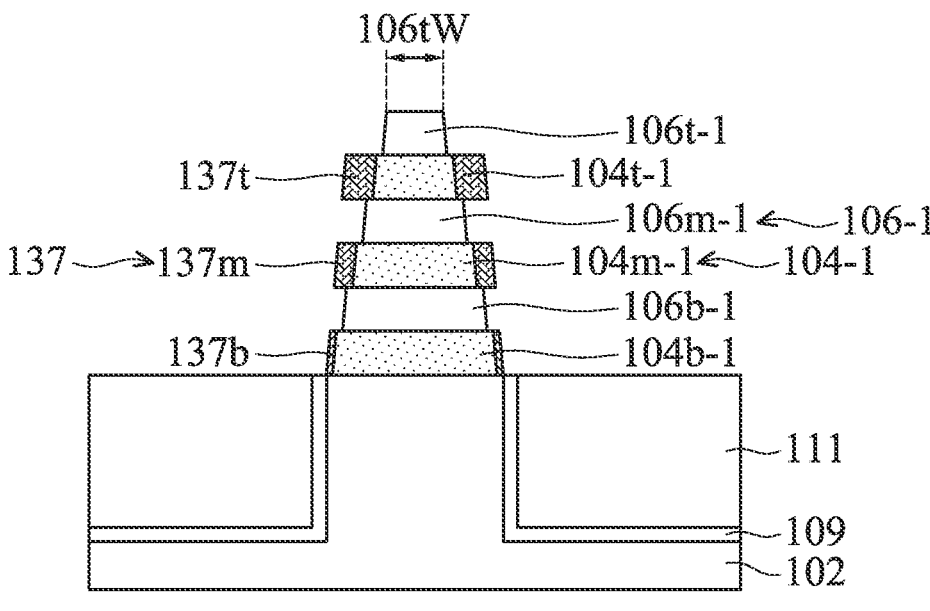
Figures 2, 5B:
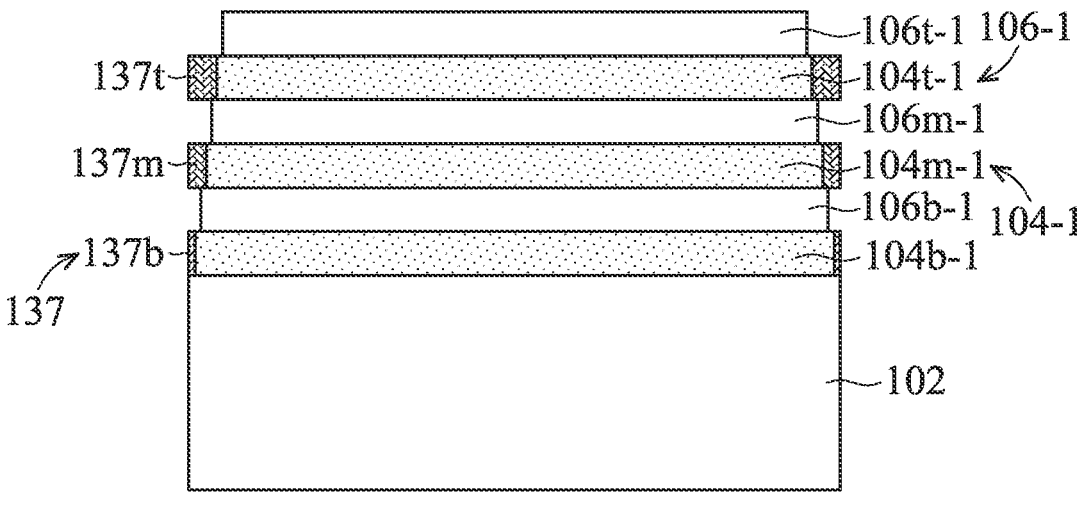
Figures 3, 5B:
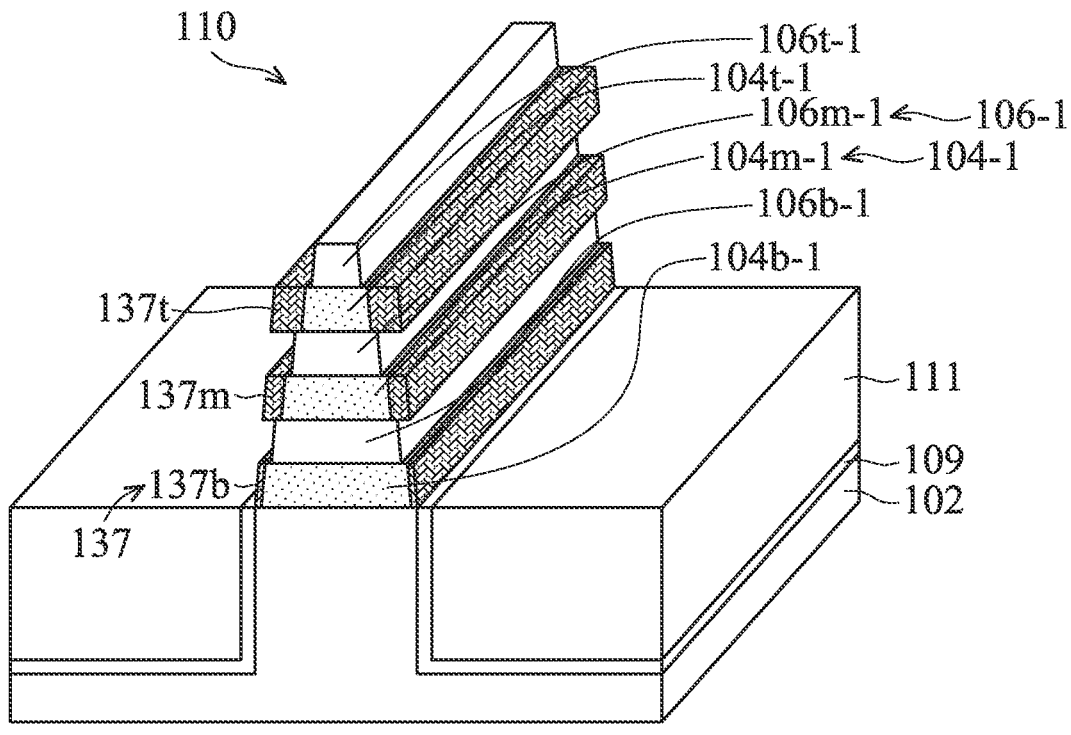
Figures 1, 5C:
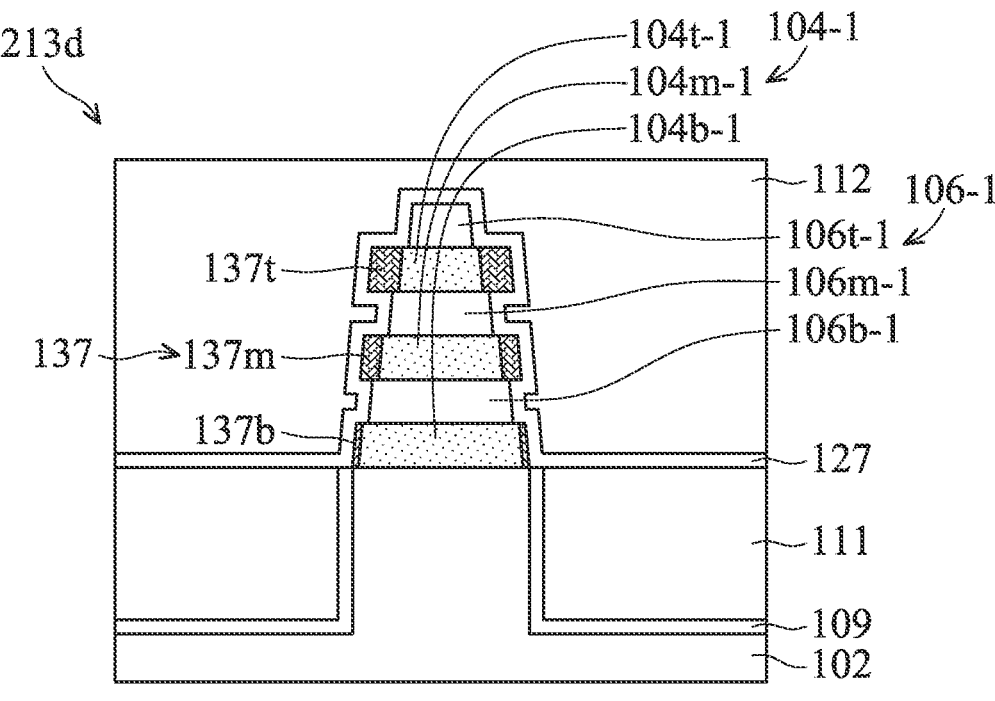
Figures 2, 5C:
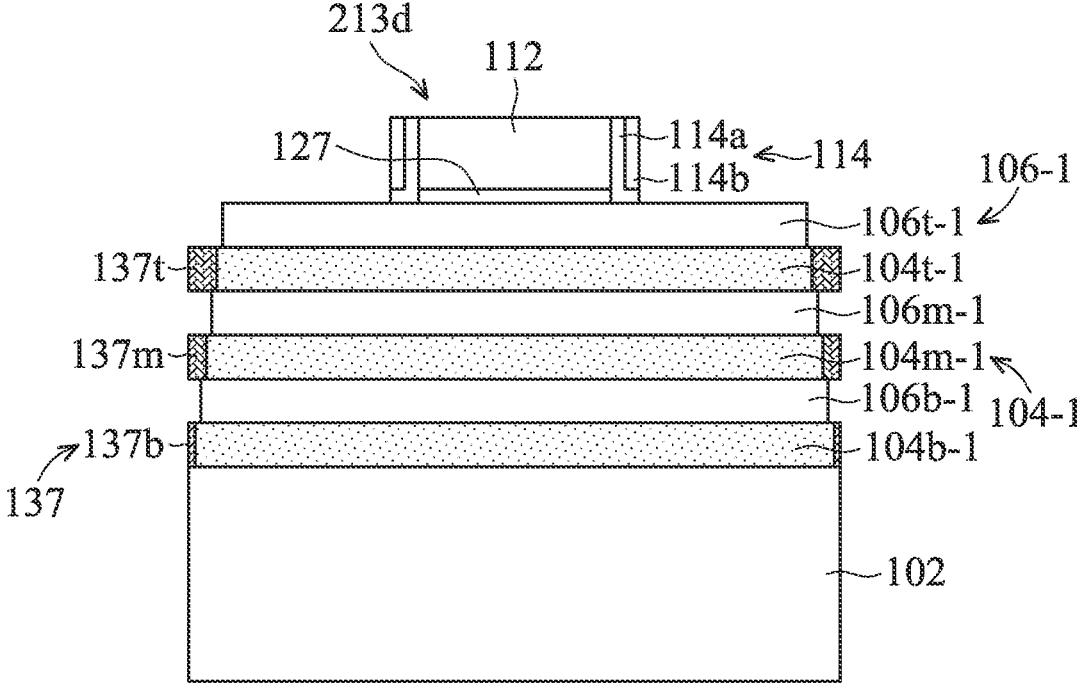
Figures 3, 5C:
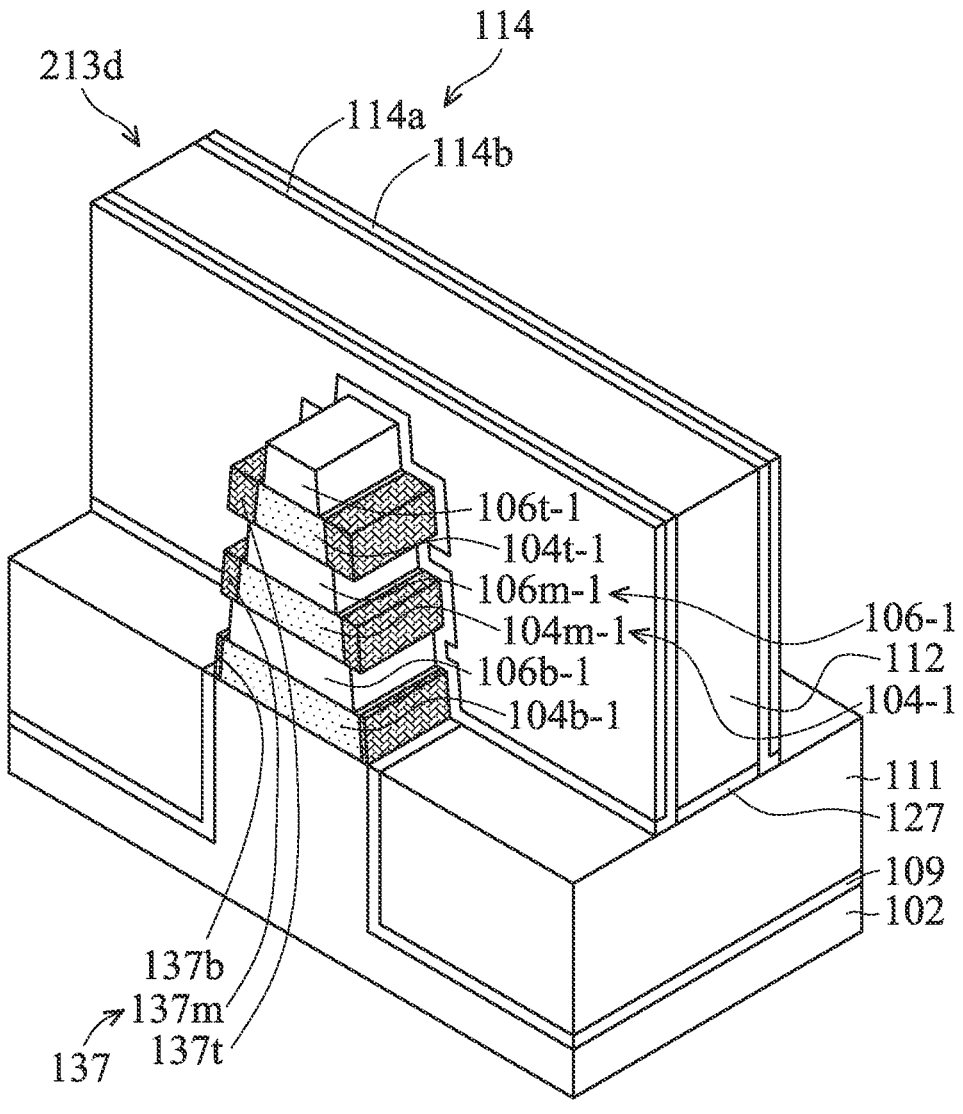
Figures 1, 5D:
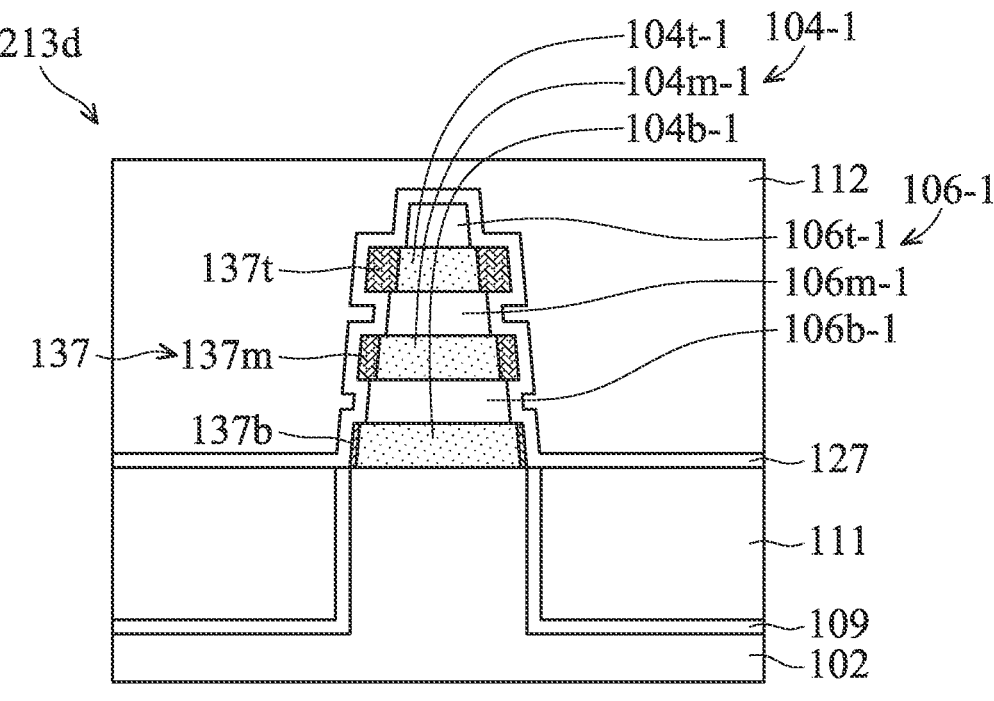
Figures 2, 5D:
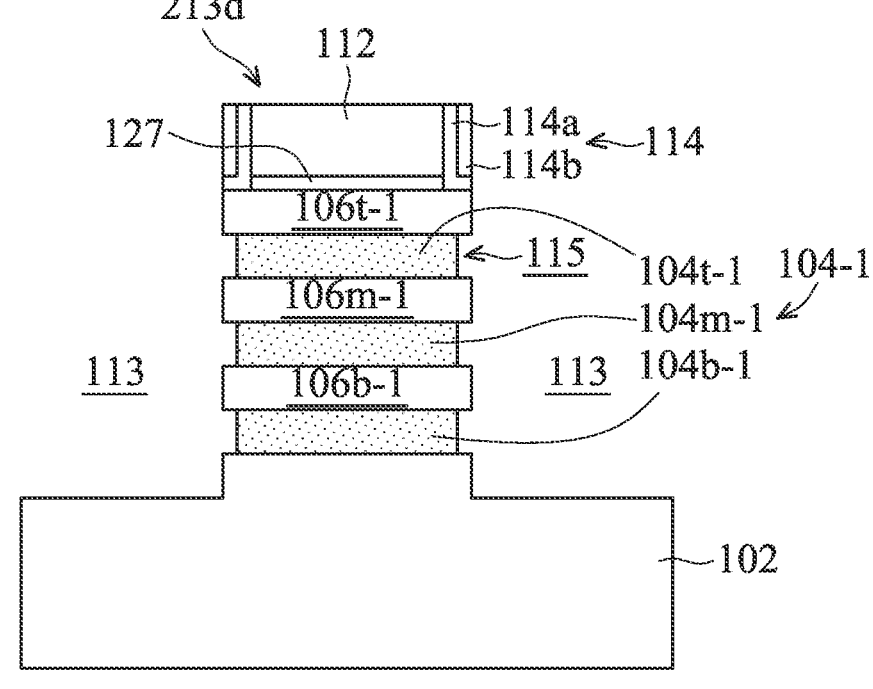
Figures 1, 5E:
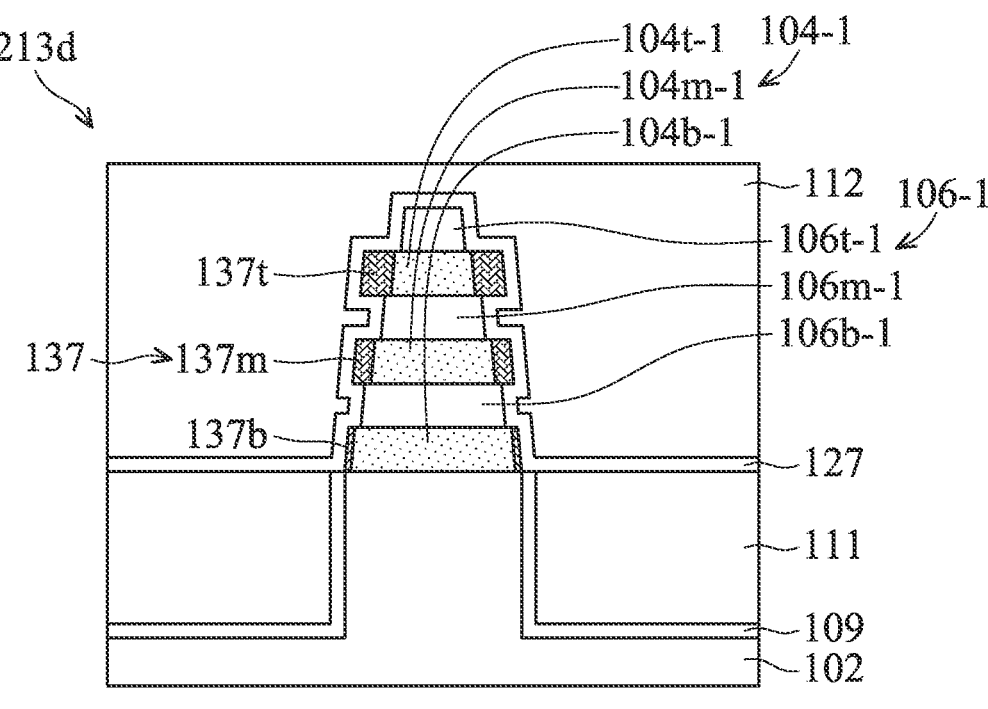
Figures 2, 5E:
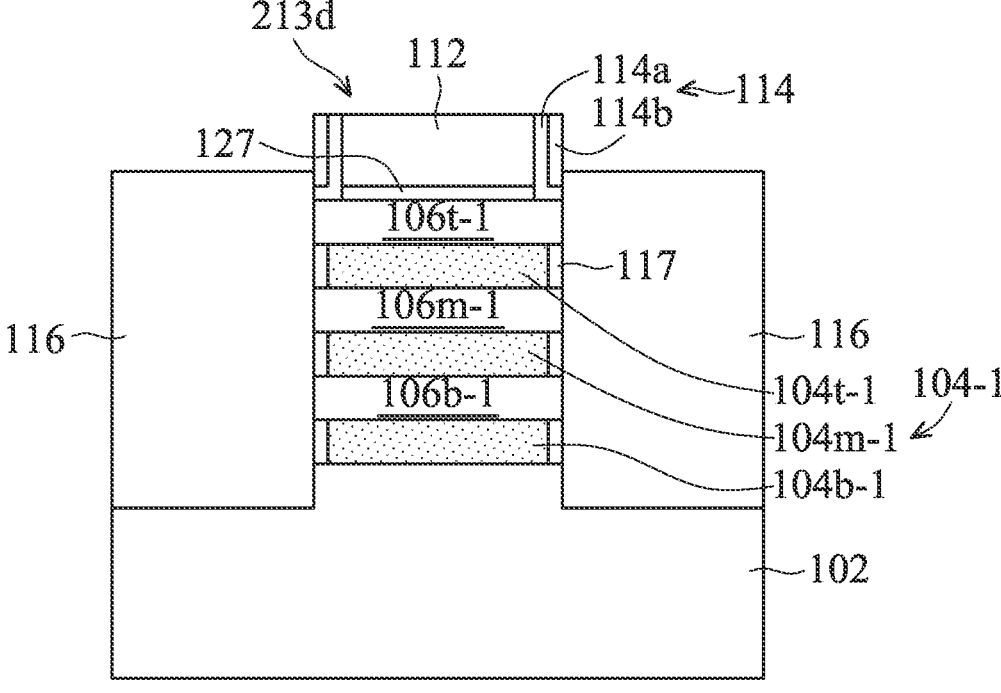

Next, source/drain recesses 113 are formed on opposite sides of the dummy gate structure 213d, and recesses 115 are formed at opposite sides of the first semiconductor layers 104-1, as shown in FIGS. 5D-1 and 5D-2 in accordance with some embodiments. Afterwards, inner spacers 117 are formed in the recesses 115, and the source/drain epitaxial structures 116 are formed in the source/drain recesses 113, as shown in FIGS. 5E-1 and 5E-2 in accordance with some embodiments.

Figures 1, 5F:
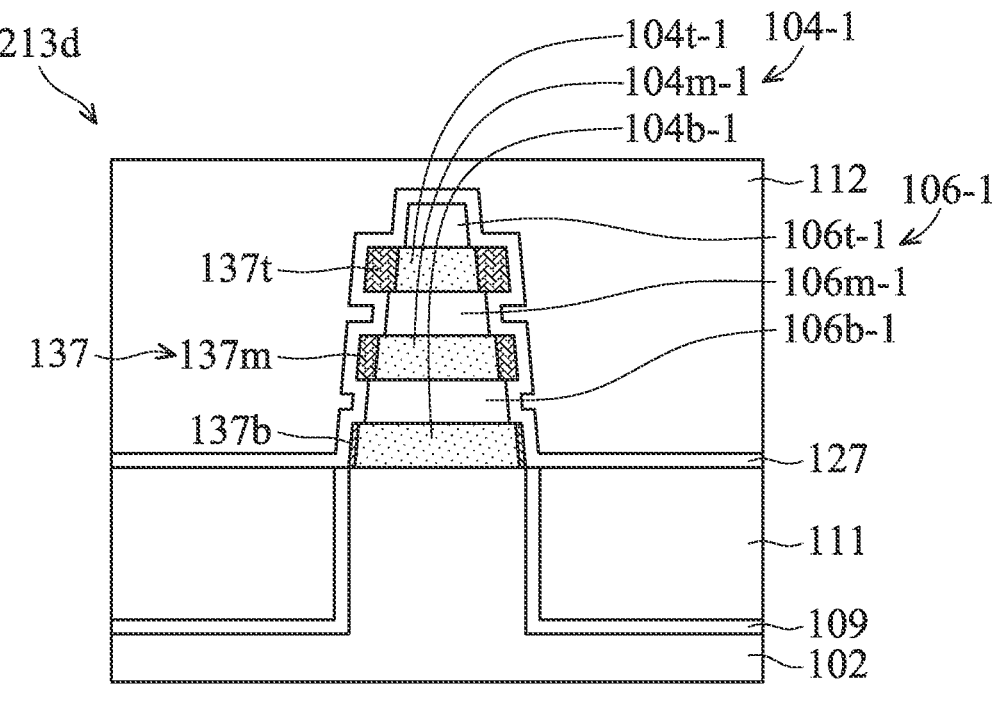
Figures 2, 5F:
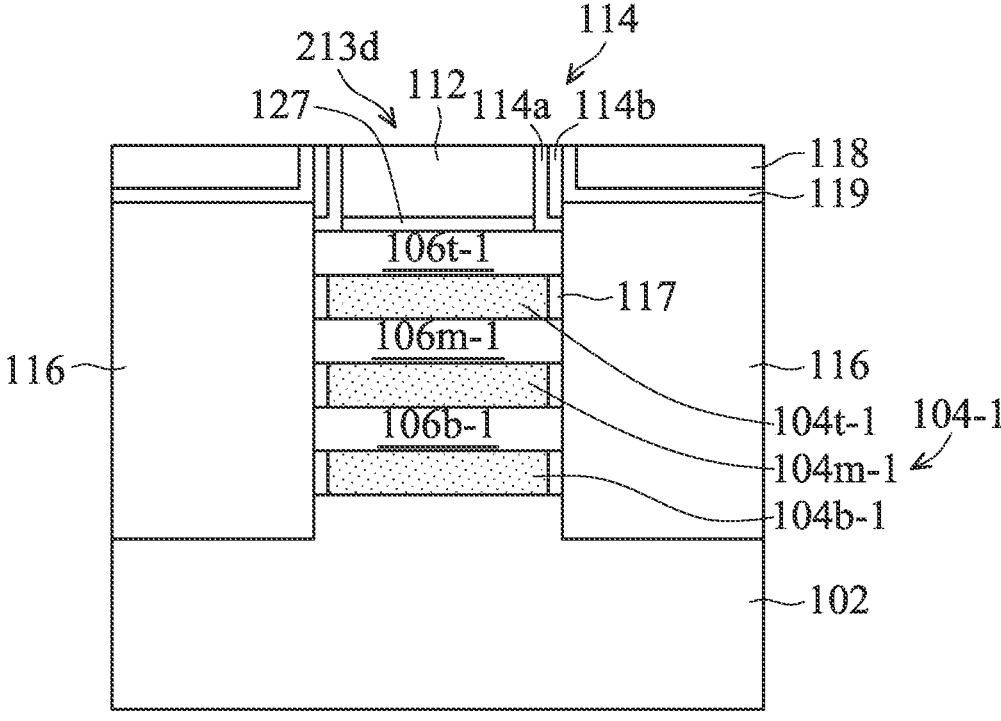

Afterwards, an etch stop layer 119 is formed over the source/drain epitaxial structure 116, and an ILD structure 118 is formed over the etch stop layer 119, as shown in FIGS. 5F-1 and 5F-2 in accordance with some embodiments.

Figures 1, 5G:
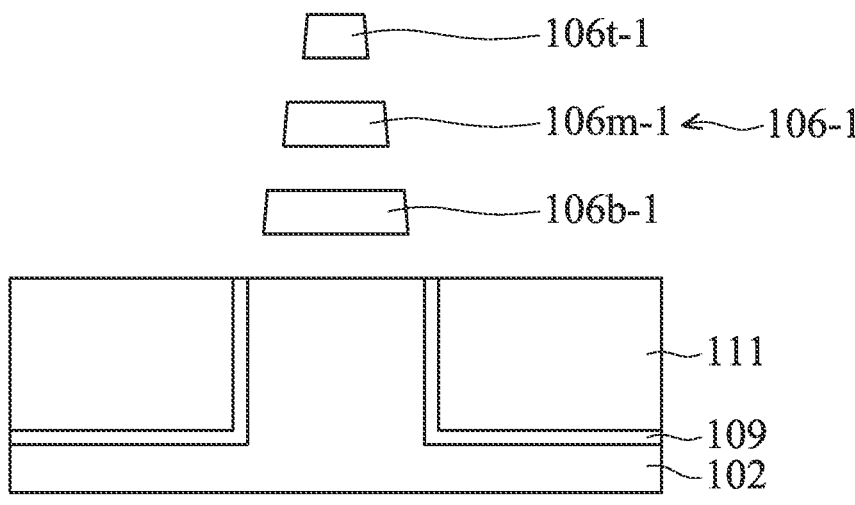
Figures 2, 5G:
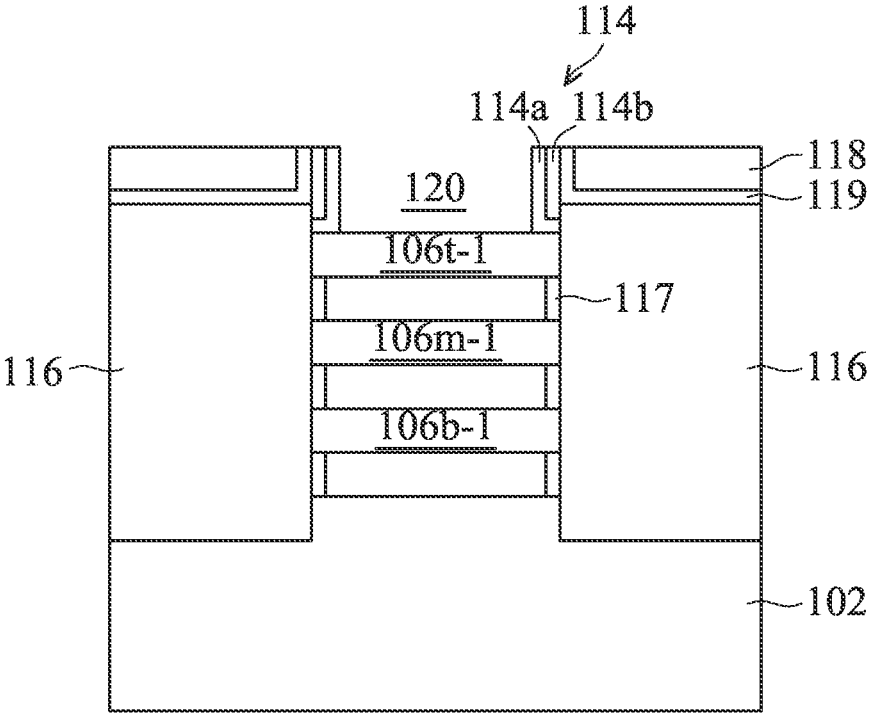

Next, the dummy gate structure 213d is removed, as shown in FIGS. 5G-1 and 5G-2 in accordance with some embodiments. Therefore, a trench 120 is formed between the spacer layers 114 over the fin structure 110, and the fin structure 110 is exposed from the trench 120.

After the trench 120 is formed, openings are formed between the second semiconductor layers 106-1, as shown in FIGS. 5G-1 and 5G-2 in accordance with some embodiments. The remaining second semiconductor layers 106-1 (also referred to as nanostructures 106-1) may be formed as channel regions of the semiconductor device structure 10d. In some embodiments, each of the nanostructures 106-1 has tapered sidewalls. In some embodiments, each of the nanostructures 106-1 has an upward trapezoid shape in the cross-sectional view. In some embodiments, the bottom surface area of the bottom nanostructure 106b-1, the middle nanostructure 106m-1, and the top nanostructure 106t-1 is greater than the top surface area of the bottom nanostructure 106b-1, the middle nanostructure 106m-1, and the top nanostructure 106t-1, respectively.

Figures 1, 5H:
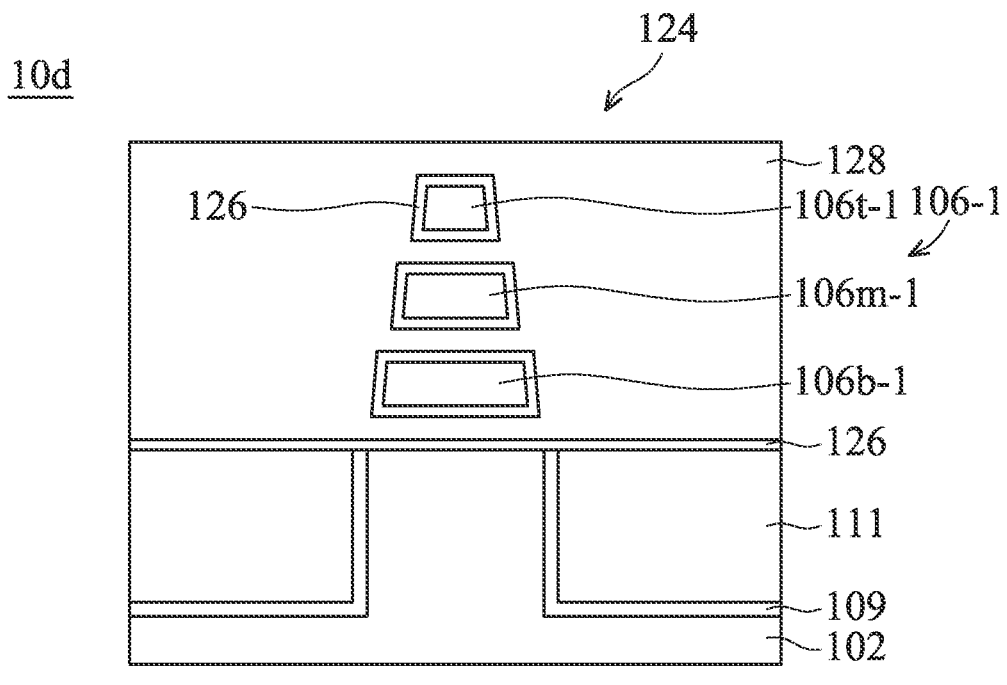
Figures 2, 5H:
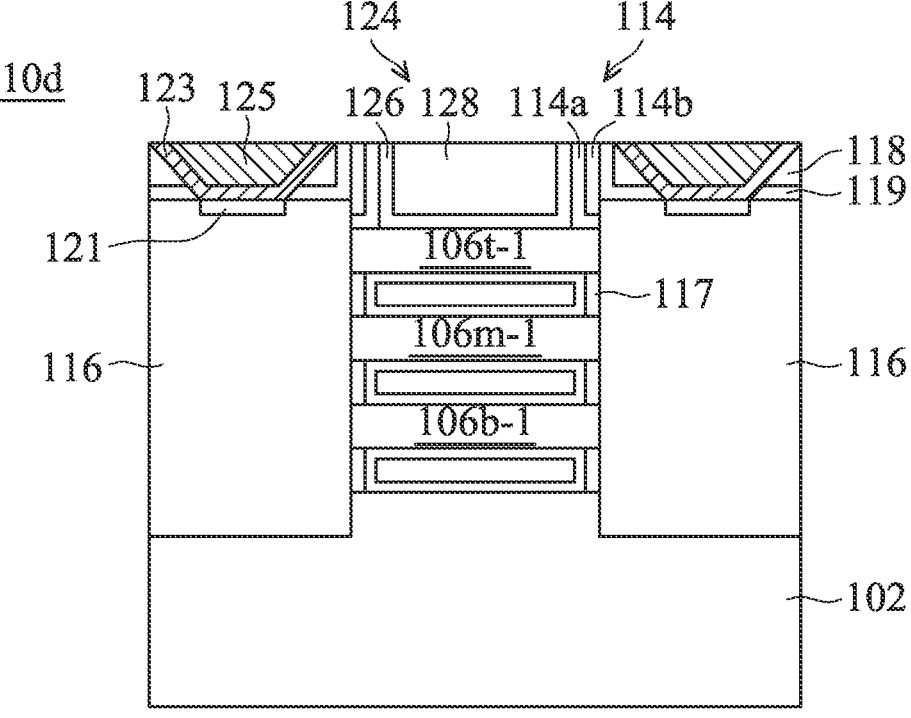

Next, a gate structure 124 including an interfacial layer and a high-k dielectric layer 126, and a gate electrode 128 is formed surrounding the nanostructures 106, as shown in FIGS. 5H-1 and 5H-2 in accordance with some embodiments. In addition, the contact structure 125 is over the source/drain epitaxial structure 116, as shown in FIG. 5H-2 in accordance with some embodiments.

The processes and materials for forming the dummy gate structure 213d, the inner spacers 117, the source/drain epitaxial structures 116, the etch stop layer 119, the ILD structure 118, the gate structure 124, the gate electrode 128, and the contact structure 125 as shown in FIGS. 5E-1, 5E-2, 5F-1, 5F-2, 5G-1, 5G-2, 5H-1 and 5H-2 may be the same as, or similar to, those used to form the dummy gate structure 213a, the inner spacers 117, the source/drain epitaxial structures 116, the etch stop layer 119, the ILD structure 118, the gate structure 124, the gate electrode 128, and the contact structure 125 in the previous embodiments. For the purpose of brevity, the descriptions of these processes are not repeated herein.

With wider bottom nanostructure 106b-1 and narrower top nanostructure 106t-1, the drive current may be higher and the total resistance may be lower while the device area remains. The nanostructures 106-1 profile may be achieved by an oxidation process and a wet etching process. Since the silicon oxides 136 formed over the sidewalls of the second semiconductor layers 106-1 have different thickness, the nanostructures 106-1 may have different width. Since the fin structure 110 has tapered sidewalls, the nanostructures 106-1 may have tapered sidewalls.

Many variations and/or modifications may be made to the embodiments of the disclosure. FIGS. 6A-1, 6A-2, 6B-1, 6B-2, 6C-1, 6C-2, 6D-1, 6D-2, 6E-1, 6E-2, 6F-1, and 6F-2 are cross-sectional representations of various stages of forming a semiconductor device structure 10e, in accordance with some embodiments of the disclosure. Some processes or devices are the same as, or similar to, those described in the embodiments above, and therefore the descriptions of these processes and devices are not repeated herein.

Figures 1, 2, 6A:
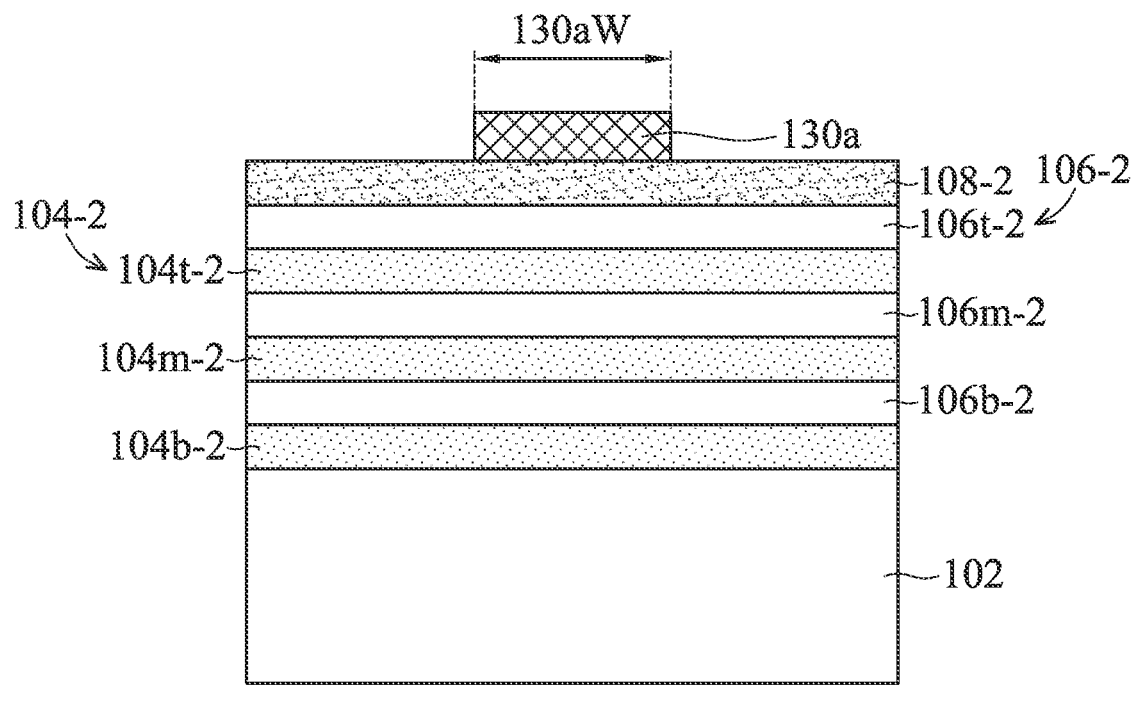
Figures 3, 6A:
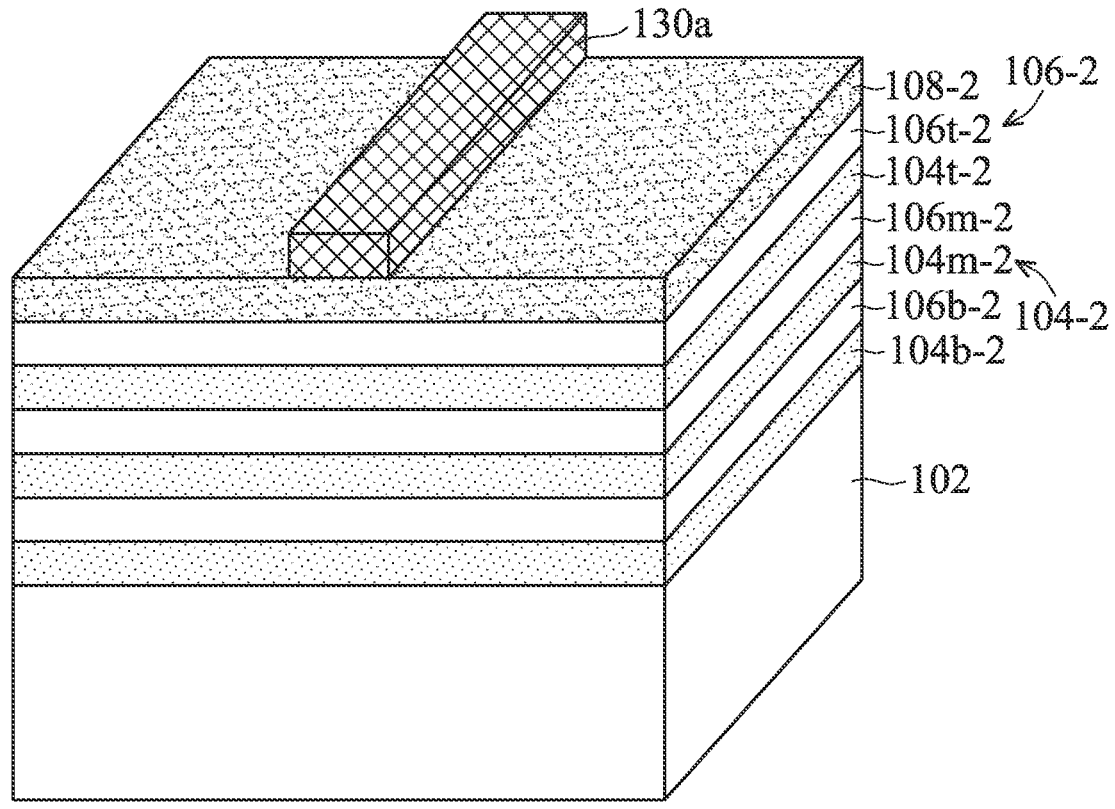
Figures 1, 6B:
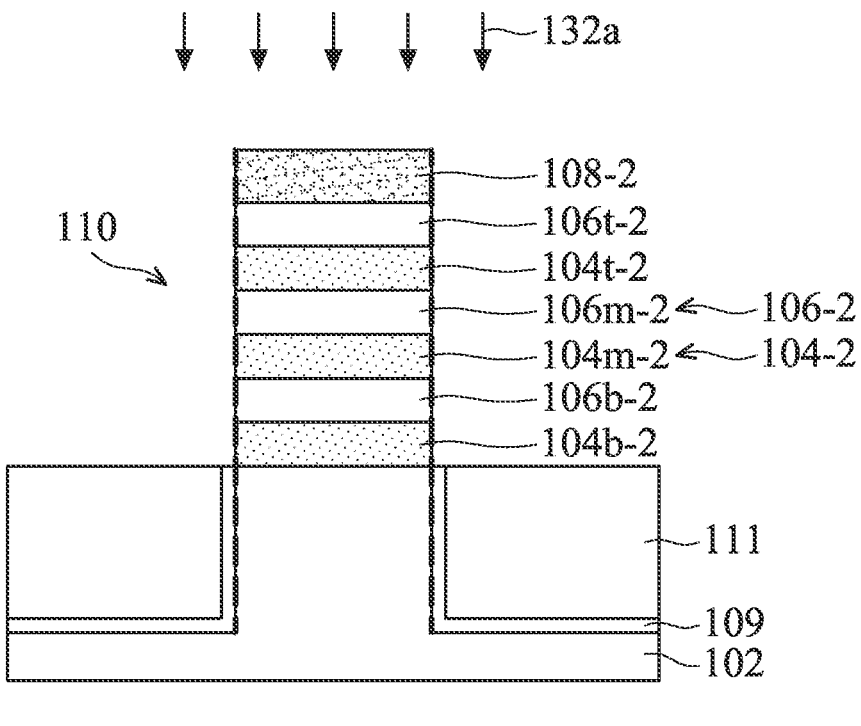
Figures 2, 6B:
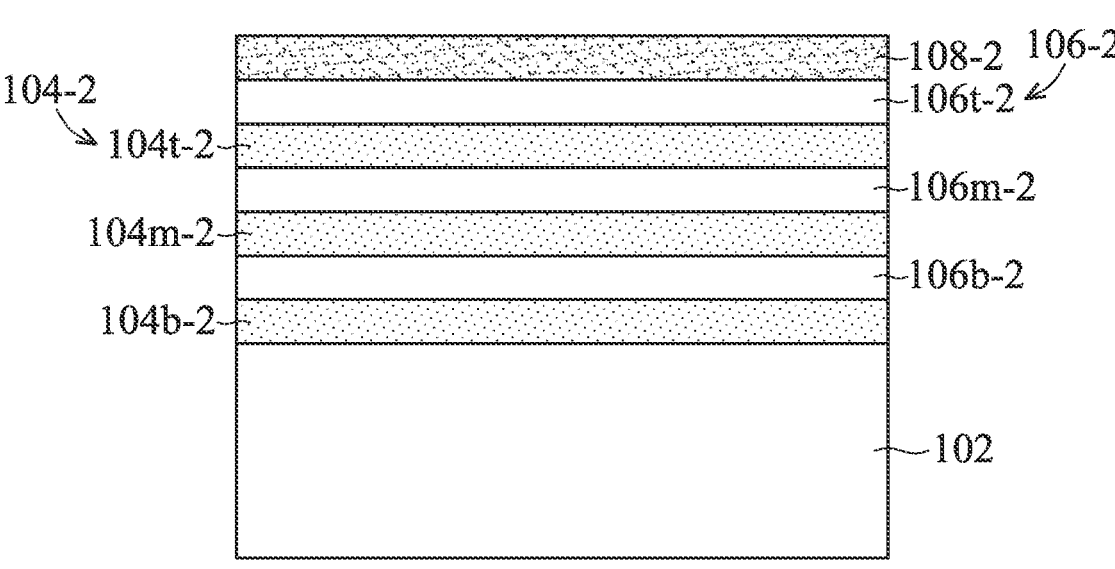
Figures 3, 6B:
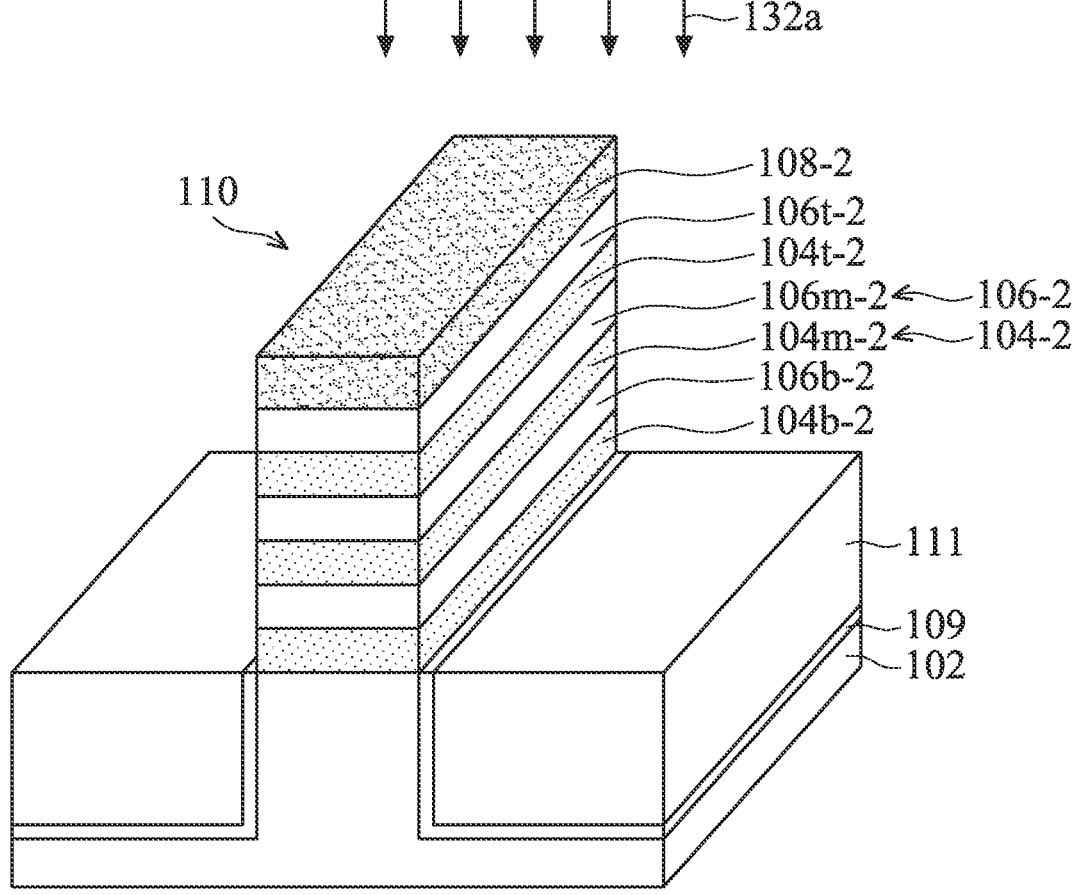

A semiconductor stack including first semiconductor layers 104-2 and second semiconductor layers 106-2 may be formed over the substrate 102, and a pad layer 108-2 may be formed over the semiconductor stack. The first semiconductor layers 104-2 and second semiconductor layers 106-2 may be similar to, or the same as, the first semiconductor layers 104-1 and the second semiconductor layers 106-1 described previously. A patterned first mask layer 130a is formed over the first semiconductor layers 104-2, the second semiconductor layers 106-2, and the pad layer 108-2, as shown in FIGS. 6A-1, 6A-2 and 6A-3 in accordance with some embodiments. As shown in FIG. 6A-1, the patterned first mask layer 130a has a top width 130aW. Next, an etching process 132a is performed to form a fin structure 110, as shown in FIGS. 6B-1, 6B-2, 6B-3 in accordance with some embodiments. The fin structure 110 may have vertical side-walls after the etching process 132*a* is performed. The etching process 132*a* may be a dry etching process. The dry etching process 132*a* may include multiple etching processes similar to the etching process used to form the fin structure 110 shown in FIG. 2A-1 described previously.

Figures 1, 6C:
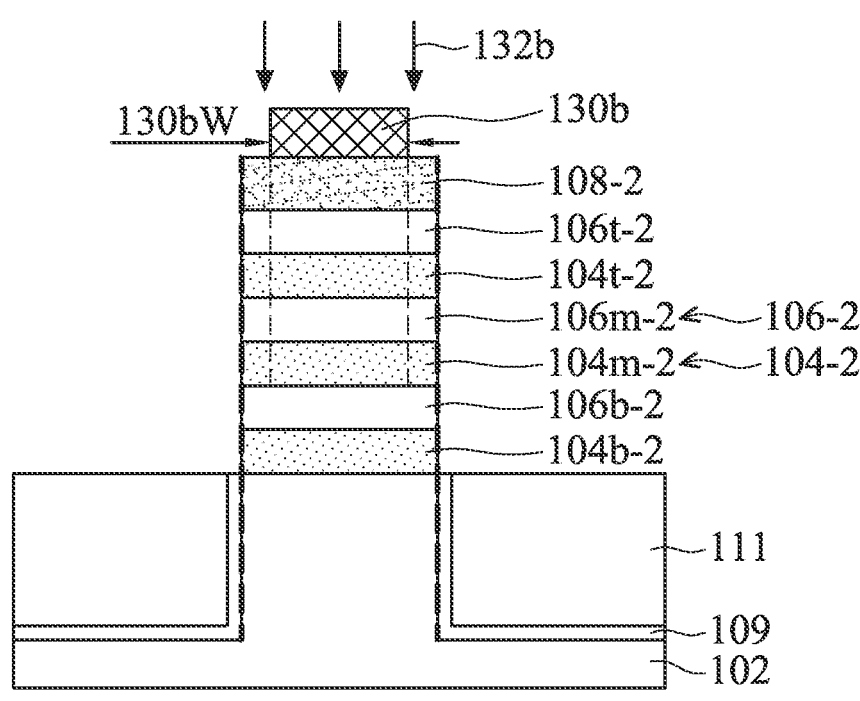
Figures 2, 6C:
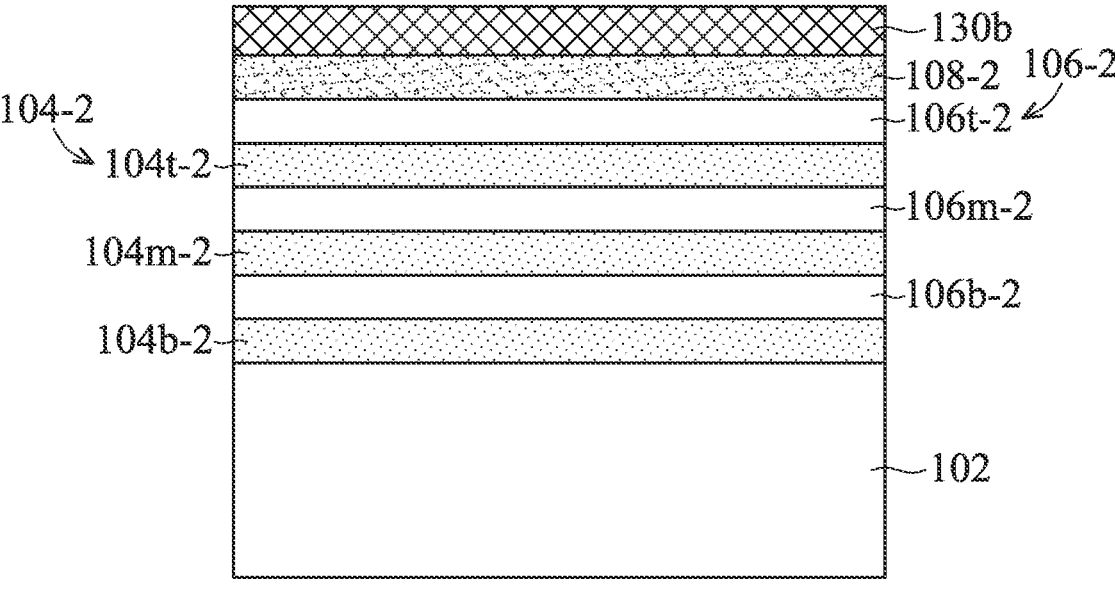
Figures 3, 6C:
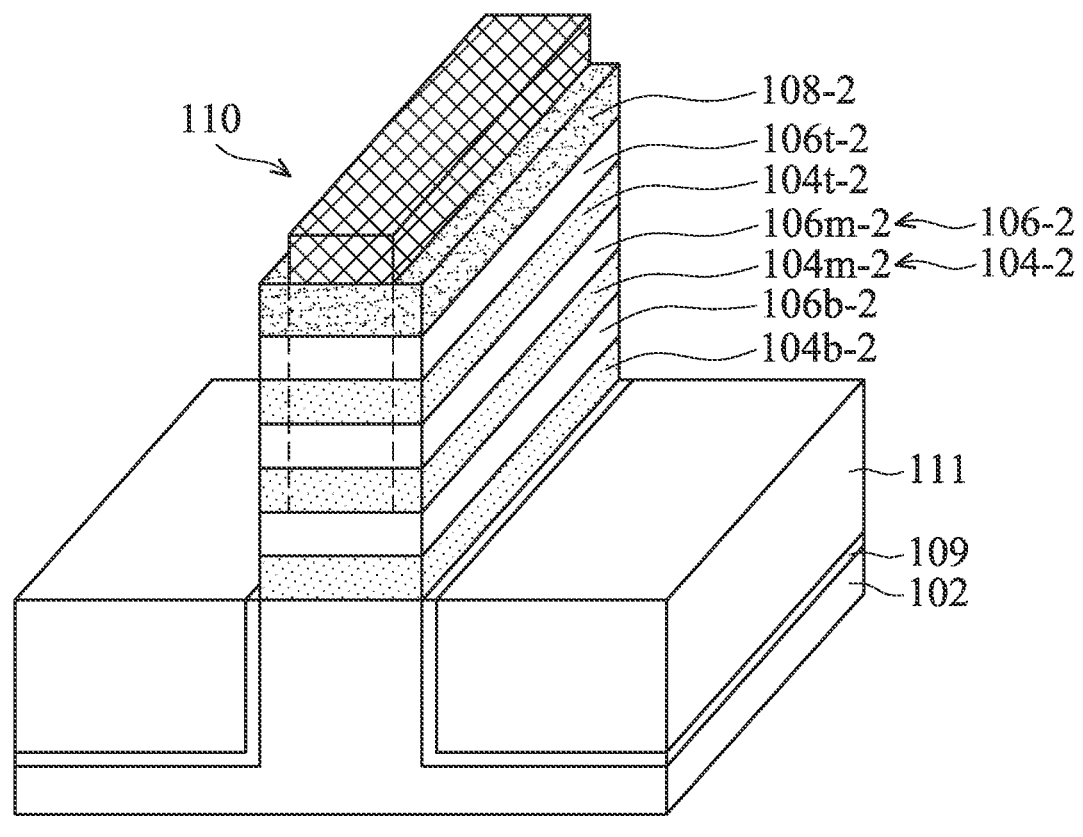

Next, a patterned second mask layer 130*b* is formed over the fin structure 110, as shown in FIGS. 6C-1, 6C-2 and 6C-3 in accordance with some embodiments. As shown in FIGS. 6C-1, the patterned second mask layer 130*b* has a top width 130*b*W. In some embodiments, the first mask layer 130*a* is wider than the second mask layer 130*b*. The fin structure 110 may be relatively wide, thereby allowing enough space for the patterned second mask layer 130*b* to be formed thereon. In some embodiments, the top width 130*a*W of the patterned first mask layer 130*a* is greater than the critical dimension.

Afterwards, an etching process 132*b* is performed on the middle second semiconductor layer 106*m*-2 and the top second semiconductor layer 106*t*-2, while the bottom second semiconductor layer 106*b*-2 remains, as shown in FIGS. 6D-1, 6D-2, and 6D-3 in accordance with some embodiments. The first top width 130*a*W of the patterned first mask layer 130*a* may be formed by a single patterning process, and the top width 130*b*W of the patterned second mask layer 130*b* may be formed by a double patterning process. That is, the shape of the fin structure 110 is modified by the etching process 132*a* and 132*b* in accordance with some embodiments.

Figures 1, 6D:
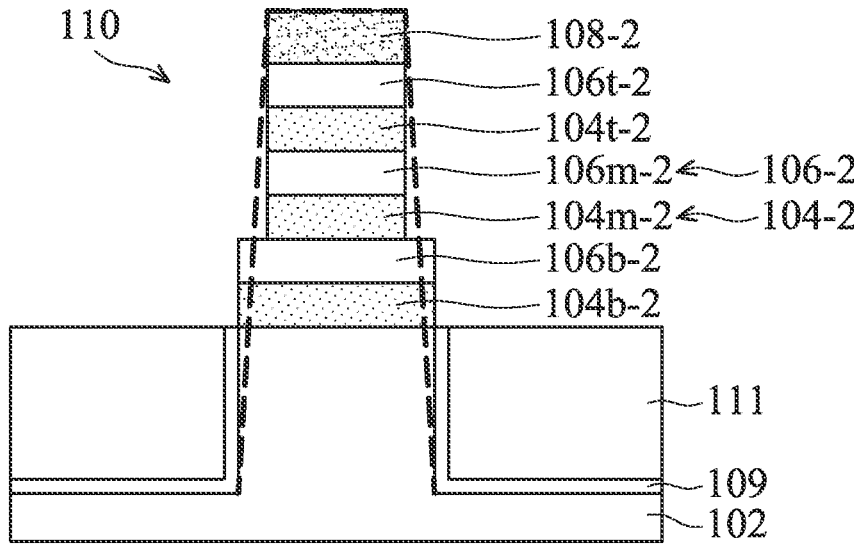
Figures 2, 6D:
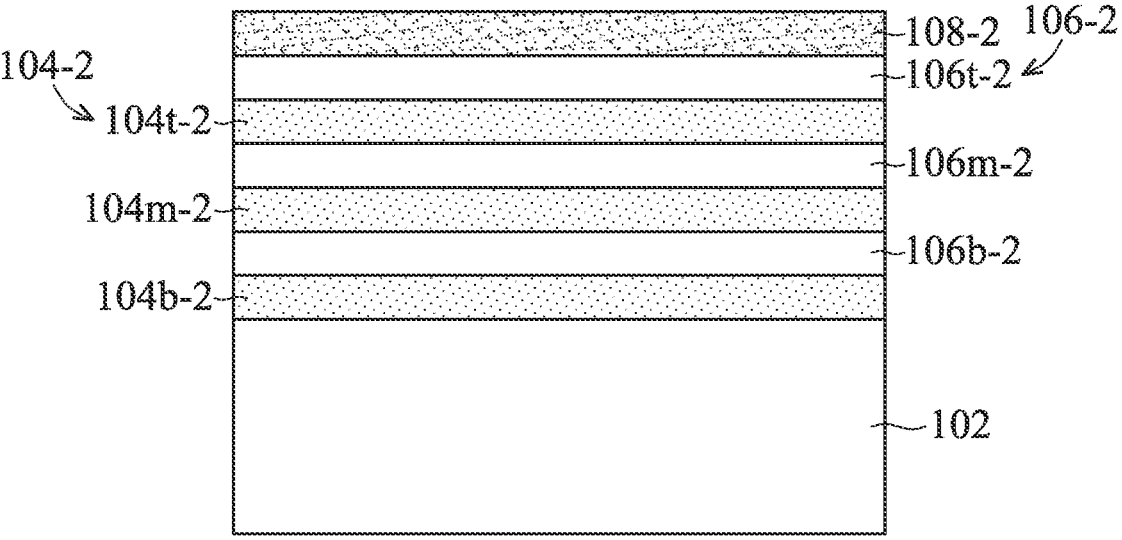
Figures 3, 6D:
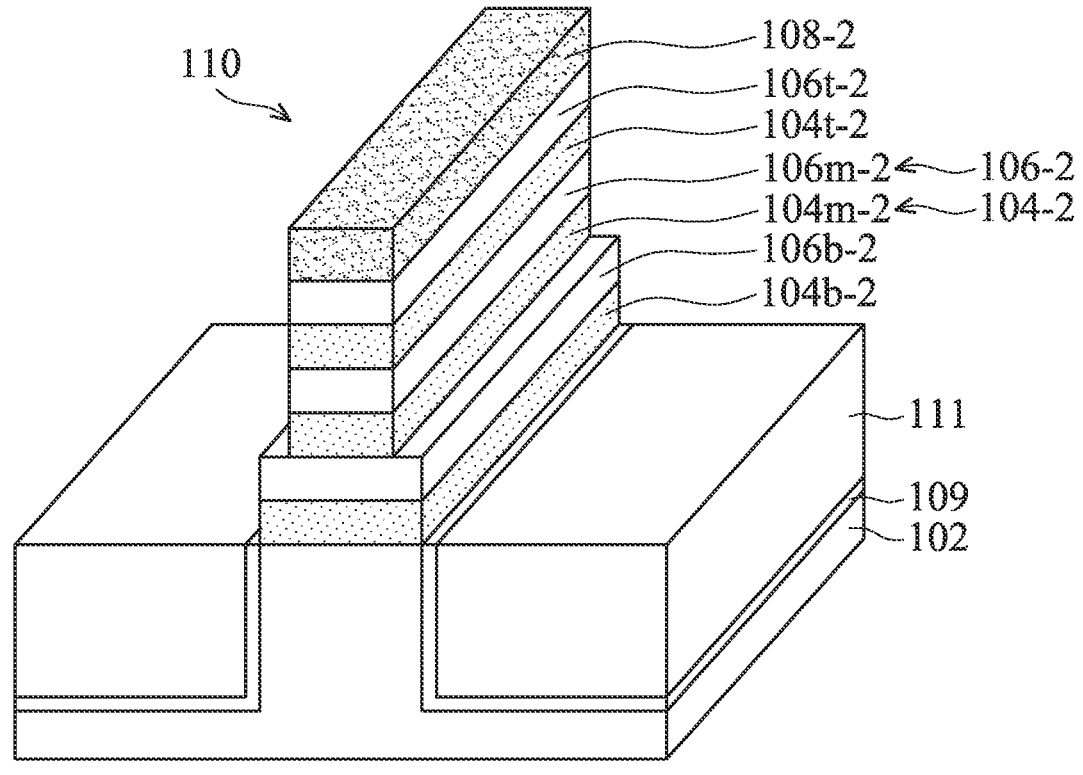

It should be noted that the dashed line in FIG. 6D-1 only presents the trend of the sidewalls of fin structure 110. In some embodiments, the top second semiconductor layer 106*t*-2, the middle second semiconductor layer 106*m*-2, and the bottom second semiconductor layer 106*b*-2 have vertical sidewalls after the etching process 132*a* and 132*b*.

In the etching process 132*b*, outer portion of the upper fin structure 110 is removed. In some embodiments, outer portion of the middle second semiconductor layer 106*m*-2 and the outer portion of the top second semiconductor layer 106*t*-2 are removed while outer portion of the bottom second semiconductor layer 106*b*-2 remains. Therefore, the bottom second semiconductor layer 106*b*-2 is wider than the middle second semiconductor layer 106*m*-2, and the middle second semiconductor layer 106*m*-2 has a substantially equal width than the top second semiconductor layer 106*t*-2. The etching process 132*b* may be a dry etching process. The dry etching process 132*b* may include one or more etching processes.

The duration of the etching process 132*b* may be less than the duration of the etching process 132*a*, and therefore the etching process 132*b* only consumes the outer portions of the middle second semiconductor layer 106*m*-2 and the top second semiconductor layer 106*t*-2.

Figures 1, 6E:
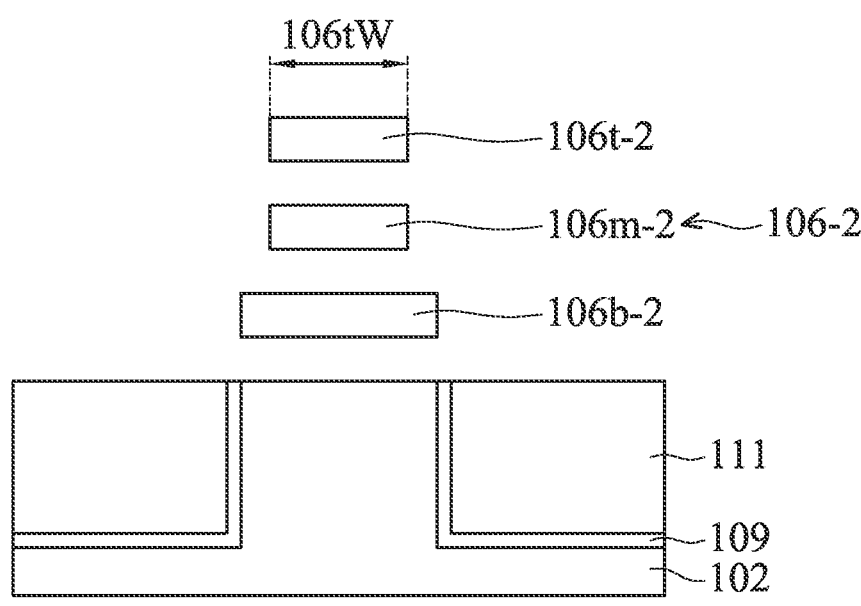
Figures 2, 6E:
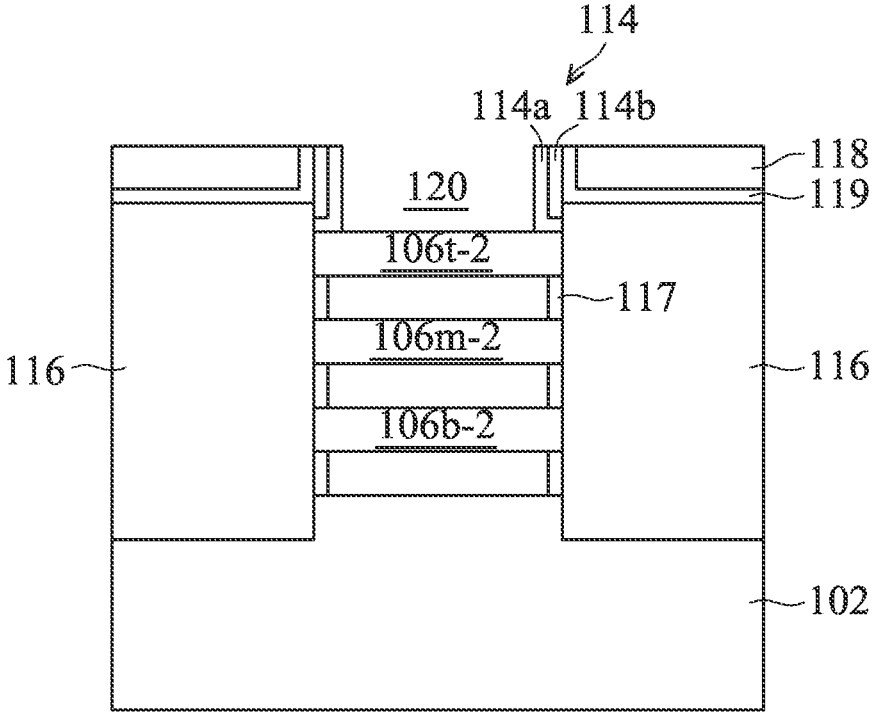

A dummy gate structure (not shown), the inner spacers 117, the source/drain epitaxial structures 116, the etch stop layer 119, and the ILD structure 118 as shown in FIGS. 6E-1 and 6E-2 may be formed using the same or similar processes/materials as those used to form the corresponding elements above. For the purpose of brevity, the descriptions of these processes are not repeated herein.

Figures 1, 6F:
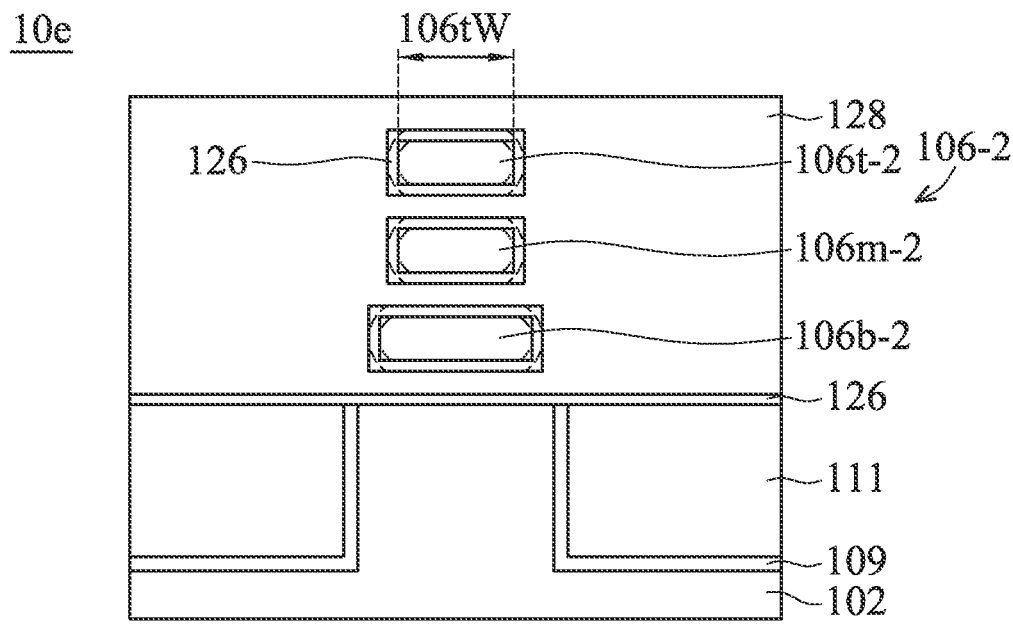
Figures 2, 6F:
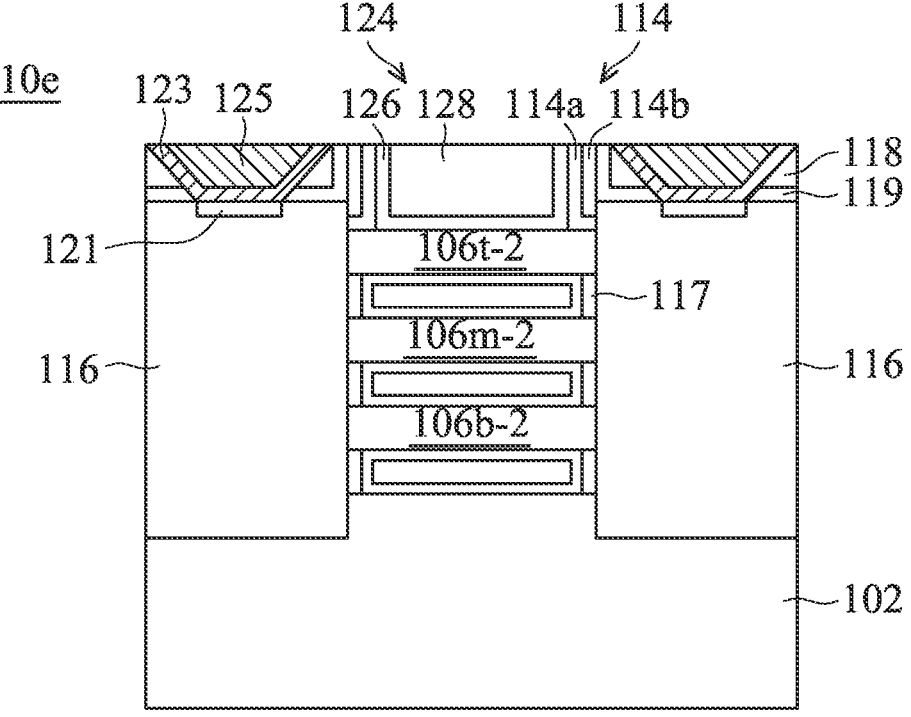

Next, the first semiconductor layers 104-2 are removed, and nanostructures 106-2 are formed, as shown in FIGS. 6E-1 and 6E-2 in accordance with some embodiments. Afterwards, a gate structure 124 including the dielectric layer 126 and a gate electrode 128 are formed surrounding the nanostructures 106-2, as shown in FIGS. 6F-1 and 6F-2 in accordance with some embodiments. The processes and materials for removing the first semiconductor layers 104-2 and forming the gate structure 124 may be the same as, or similar to, those used to remove the first semiconductor layers 104-1 and to form the gate structure 124 in the previous embodiments. For the purpose of brevity, the descriptions of these processes are not repeated herein.

In some embodiments, the top nanostructure 106*t*-2 has a top width 106*t*W. In some embodiments, the top width 130*a*W of the first mask layer 130*a* shown in FIG. 6A-1 is wider than the top width 106*t*W of the top nanostructure 106*t*-2 as shown in FIG. 6F-1 since the top nanostructure 106*t*-2 is further etched in the second etching process 132*b*.

It should be noted that, although there are two etching processes 132*a*/132*b* shown in FIGS. 6A-1 to 6F-1, 6A-2 to 6F-2 and 6A-3 to 6C-3, various etching processes may be performed. For example, an additional mask layer may be used to only further remove the outer portion of the top second semiconductor layer 106*t*-2. Therefore, the bottom nanostructure 106*b*-2 is wider than the middle nanostructure 106*m*-2, and the middle nanostructure 106*m*-2 is wider than the top nanostructure 106*t*-2. As long as the bottom nanostructure 106*b*-2 is wider than or has an width substantially equal to the middle nanostructure 106*m*-2, and the middle nanostructure 106*m*-2 is wider than or has an width substantially equal to the top nanostructure 106*t*-2, and the bottom nanostructure 106*b*-2 and the top nanostructure 106*t*-2 have different widths, better device performance may be achieved.

In some embodiments, the nanostructures 106-2 have rounded corners, as shown in dashed lines in FIG. 6F-1. The details of forming nanostructures 106-2 with rounded corners may be discussed in the following embodiments.

With wider bottom nanostructure 106*b*-2 and narrower top nanostructure 106*t*-2, the drive current may be higher and the total resistance may be lower while the device area remains. The nanostructures 106-2 profile may be achieved by multiple etching processes with multiple mask layers 130*a*/130*b* with different widths.

Figures 1, 7A:
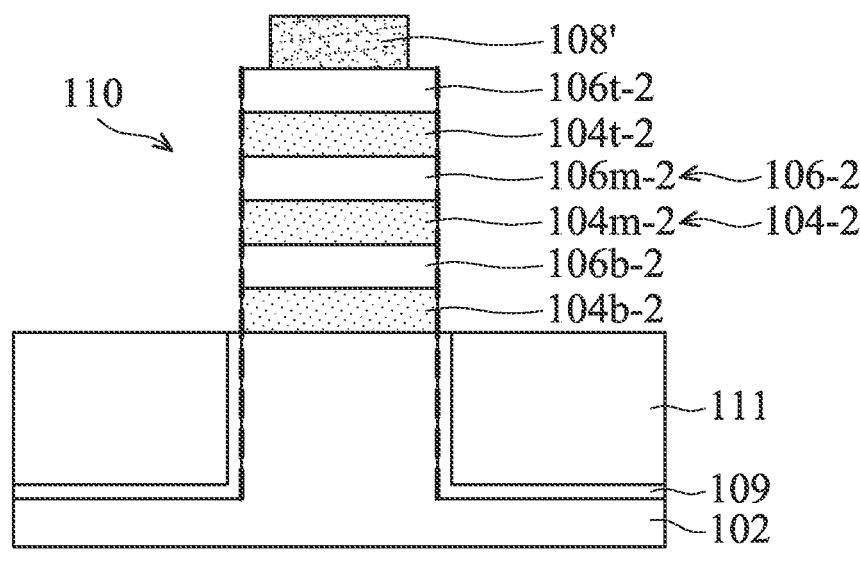
Figures 2, 7A:
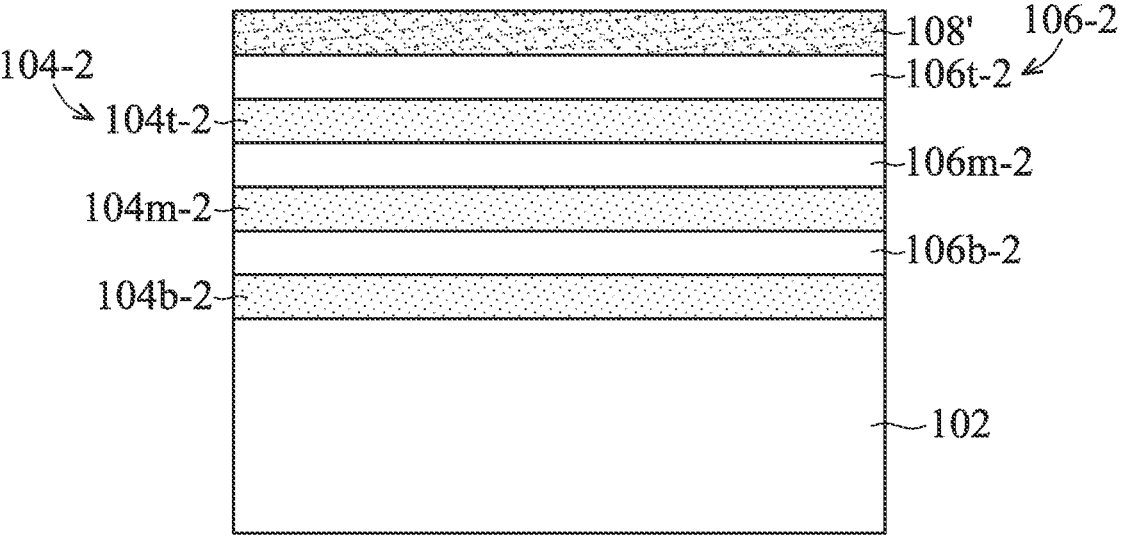
Figures 3, 7A:
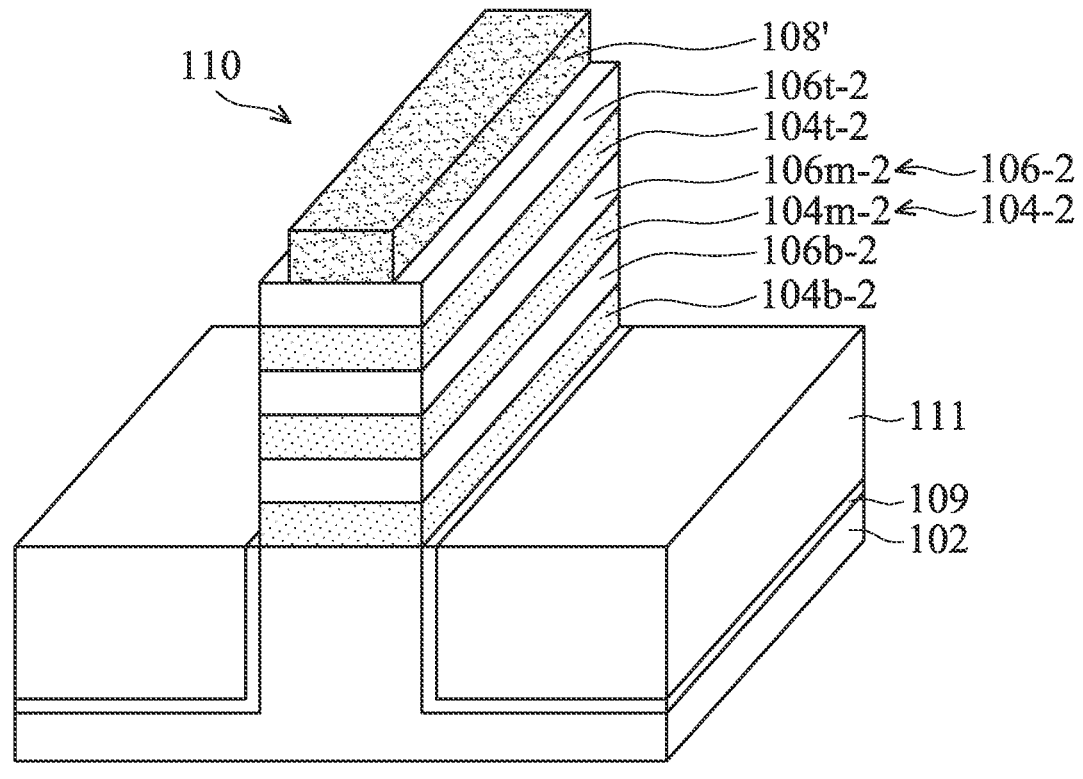
Figures 1, 7B:
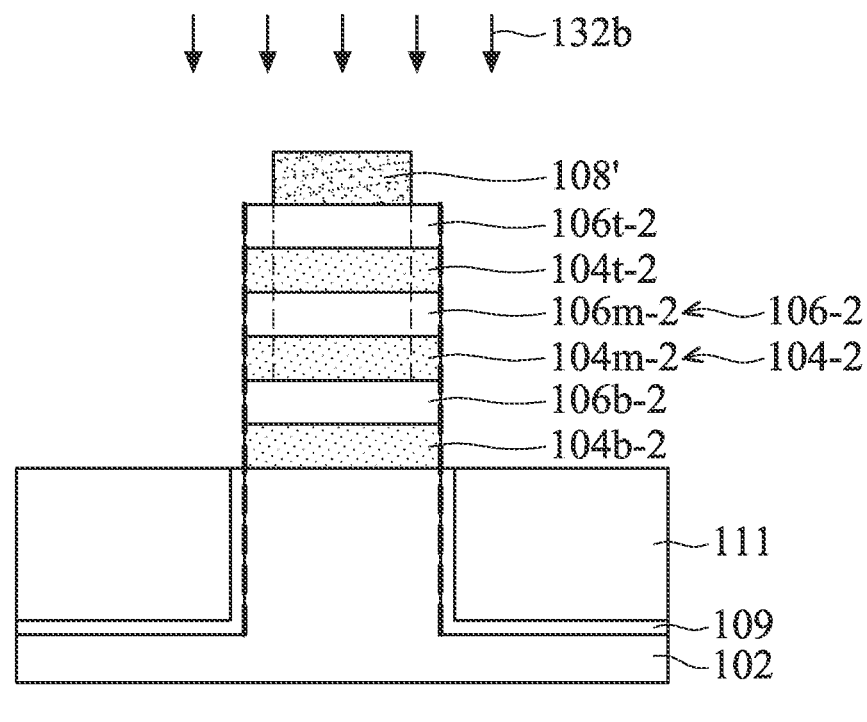
Figures 2, 7B:
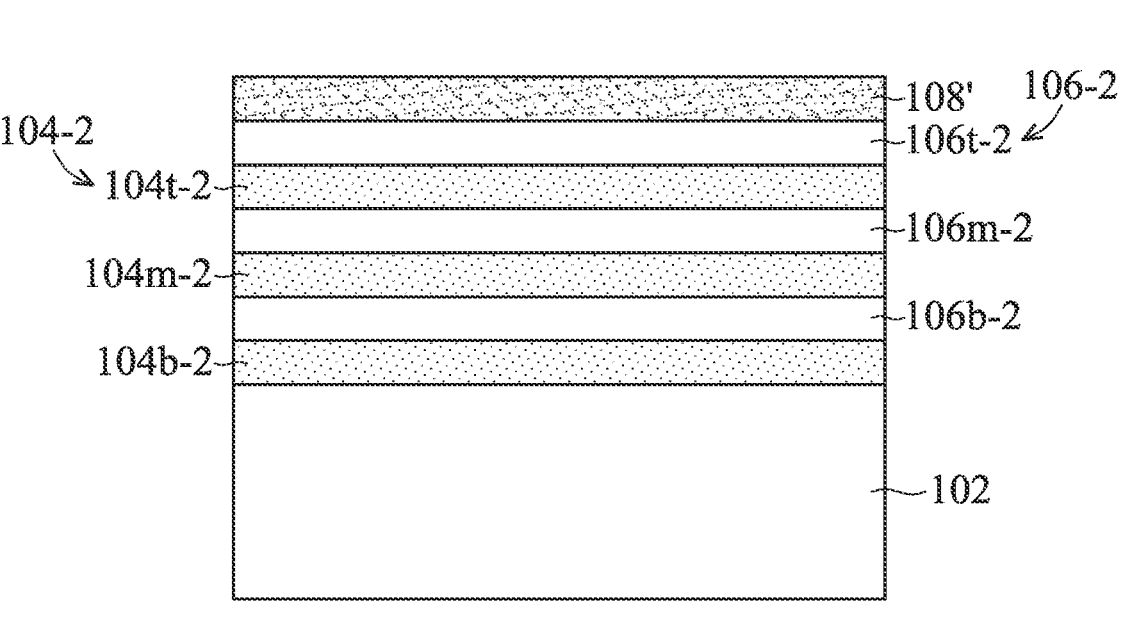
Figures 3, 7B:
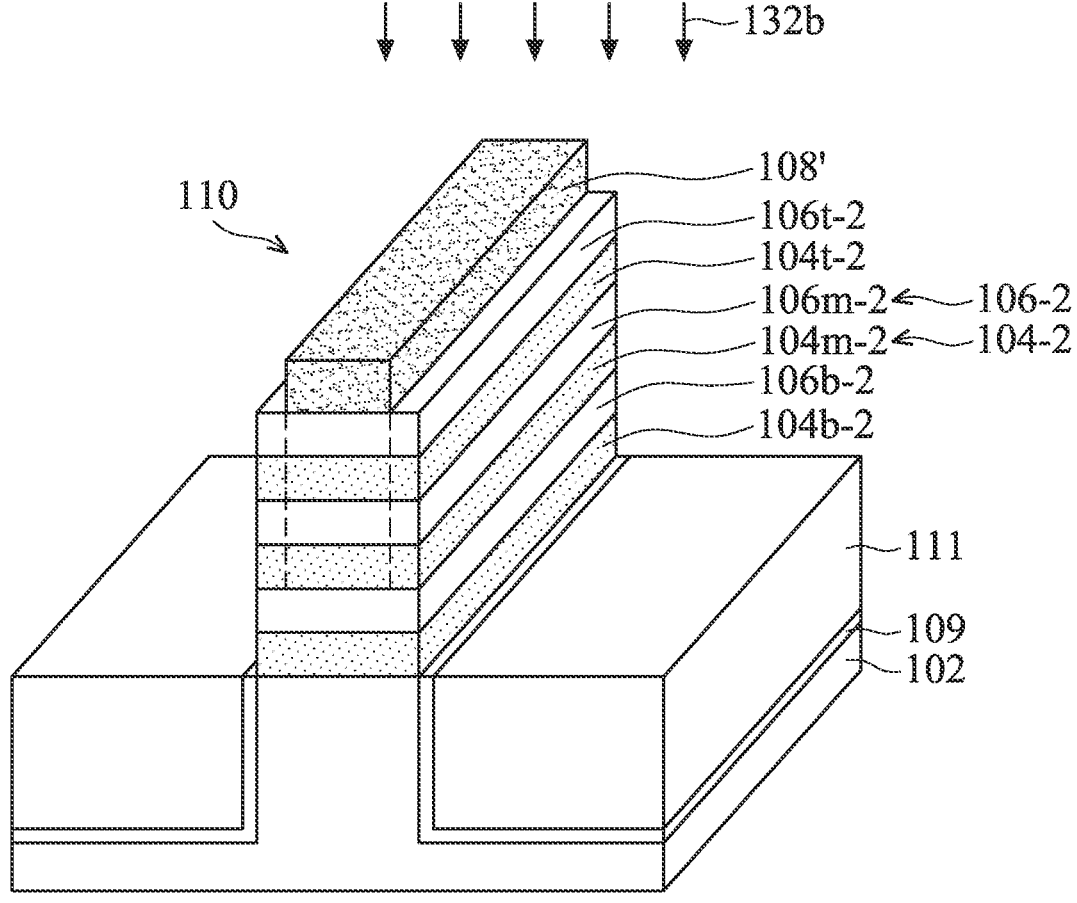
Figures 1, 7C:
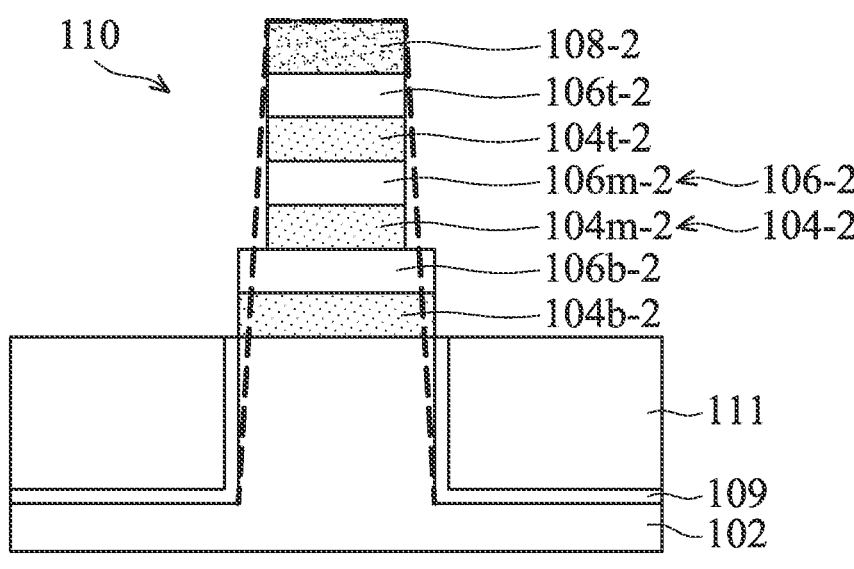
Figures 2, 7C:
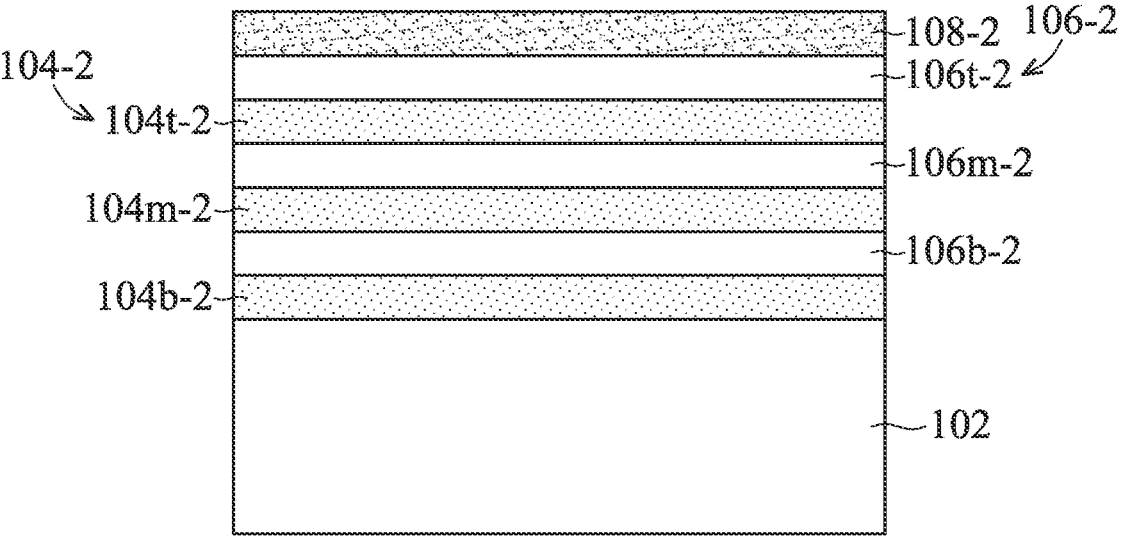
Figures 3, 7C:
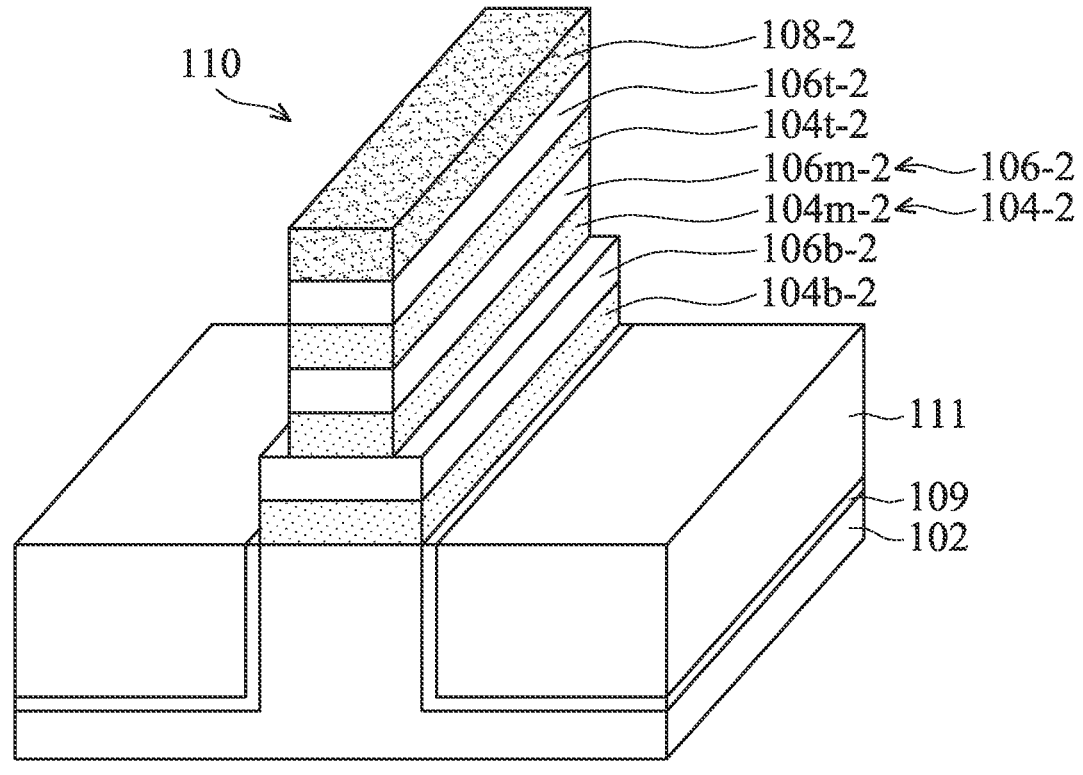

Many variations and/or modifications may be made to the embodiments of the disclosure. FIGS. 7A-1, 7A-2, 7B-1, 7B-2, 7C-1, 7C-2, 7D-1, 7D-2, 7E-1 and 7E-2 are cross-sectional representations of various stages of forming a semiconductor device structure 10*f*, in accordance with some embodiments of the disclosure. FIGS. 7A-3, 7B-3 and 7C-3 are perspective representations of various stages of forming a semiconductor device structure 10*f*, and assume a structure such as that discussed above with reference to FIGS. 2B-1, 2B-2, and 2B-3 has been formed, wherein like reference numerals refer to like elements. Accordingly, after performing the processes described above to form the structure illustrated in FIGS. 2B-1, 2B-2, and 2B-3, a patterned pad layer 108' is formed over the fin structure 110 by the trimming process, as shown in FIGS. 7A-1, 7A-2 and 7A-3 in accordance with some embodiments. In some embodiments, the fin structure 110 is wider than the patterned pad layer 108'.

Afterwards, an etching process 132*b* is performed by using the patterned pad layer 108' as a mask layer. The middle second semiconductor layer 106*m*-2 and the top second semiconductor layer 106*t*-2 may be further etched while the bottom second semiconductor layer 106*b*-2 remains. The shape of the fin structure 110 is modified by the etching process 132*a* and 132*b*, as shown in FIGS. 7B-1, 7B-2, 7B-3, 7C-1, 7C-2 and 7C-3 in accordance with some embodiments.

In the etching process 132*b*, outer portion of the upper fin structure 110 is removed. In some embodiments, outer portion of the middle second semiconductor layer 106*m*-2 and the outer portion of the top second semiconductor layer 106t-2 are removed while outer portion of the bottom second semiconductor layer 106b-2 remains. Therefore, the bottom second semiconductor layer 106b-2 is wider than the middle second semiconductor layer 106m-2, and the middle second semiconductor layer 106m-2 has a substantially equal width than the top second semiconductor layer 106t-2.

By using the patterned pad layer 108' as the second mask layer to further etching the upper fin structure 110, it may be easier to control the dimension of the second mask layer.

The etching process 132b may be a dry etching process. The dry etching process 132b may include one or more etching processes. The duration of the etching process 132b may be less than the duration of the etching process 132a, therefore the etching process 132b only consumes the outer portions of the middle second semiconductor layer 106m-2 and the top second semiconductor layer 106t-2.

Figures 1, 7D:
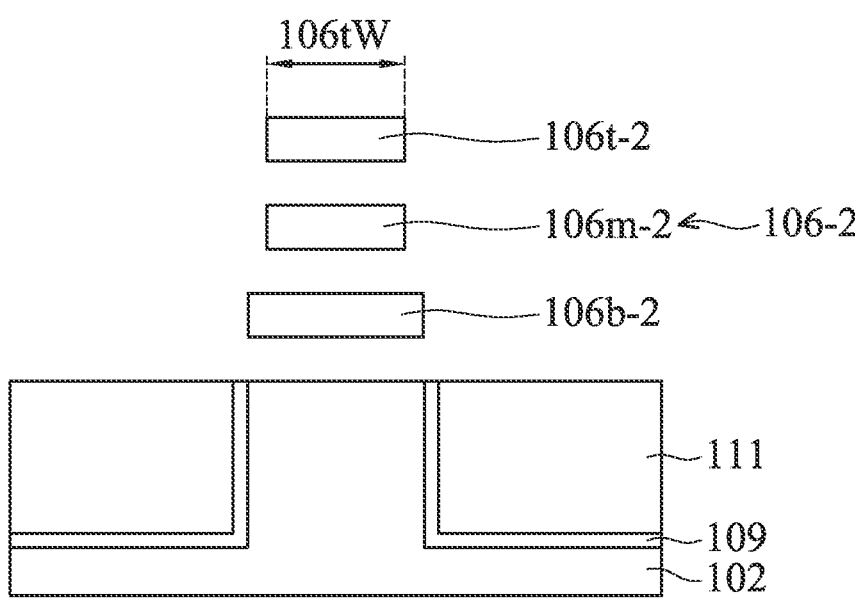
Figures 2, 7D:
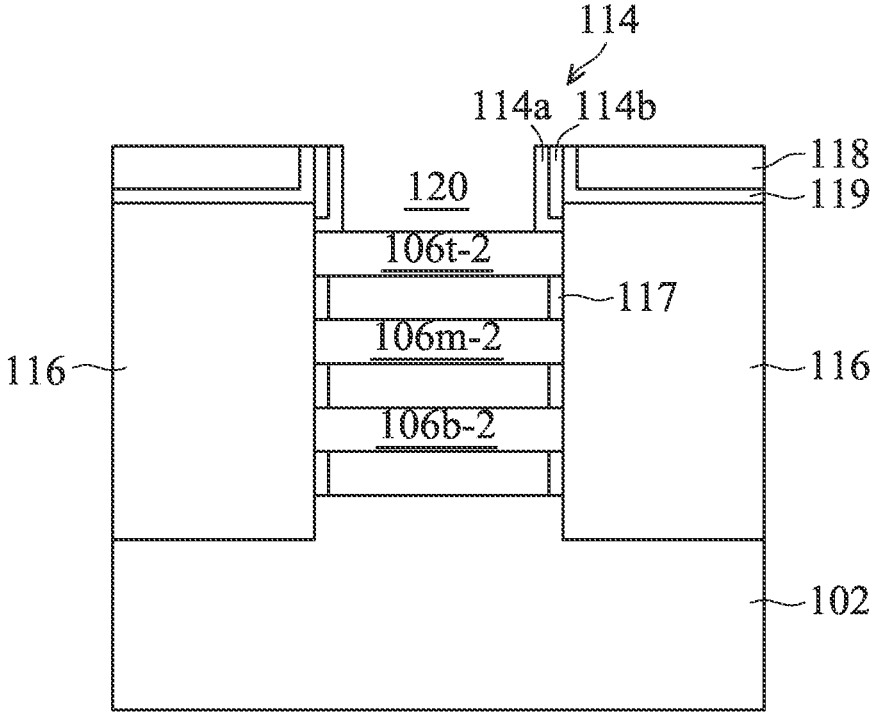

A dummy gate structure (not shown), the inner spacers 117, the source/drain epitaxial structures 116, the etch stop layer 119, and the ILD structure 118 as shown in FIGS. 7D-1 and 7D-2 may be formed using the same or similar processes/materials as those used to form the corresponding elements above. For the purpose of brevity, the descriptions of these processes are not repeated herein.

Figures 1, 7E:
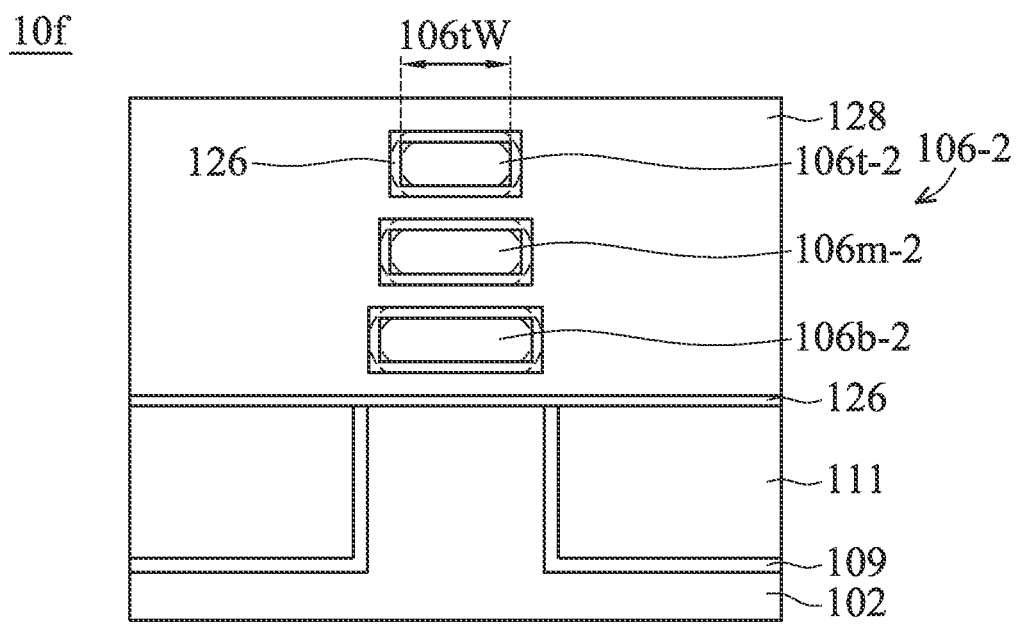
Figures 2, 7E:
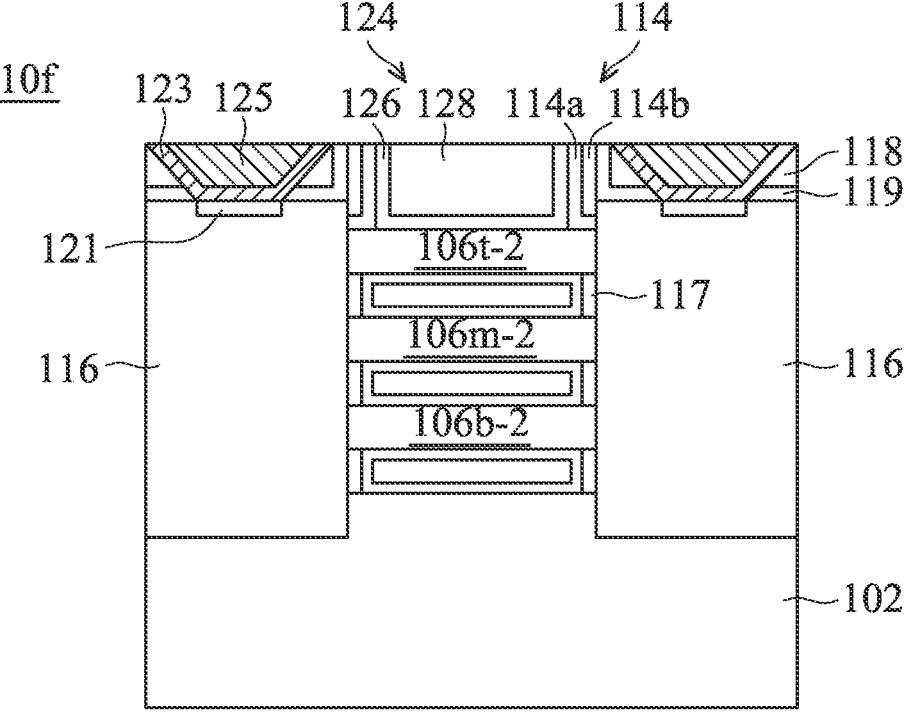

Next, the dummy gate structure and the first semiconductor layers 104-2 are removed, and nanostructures 106-2 are formed, as shown in FIGS. 7D-1 and 7D-2 in accordance with some embodiments. Afterwards, a gate structure 124 including a dielectric layer 126 and a gate electrode 128 are formed surrounding the nanostructures 106-2, as shown in FIGS. 7E-1 and 7E-2 in accordance with some embodiments. The processes and materials for removing the first semiconductor layers 104-2 and forming the gate structure 124 may be the same as, or similar to, those used to remove the first semiconductor layers 104-2 and to form the gate structure 124 in the previous embodiments. For the purpose of brevity, the descriptions of these processes are not repeated herein.

With wider bottom nanostructure 106b-2 and narrower top nanostructure 106t-2, the drive current may be higher and the total resistance may be lower while the device area remains. The nanostructures 106-2 profile may be achieved by trimming the pad layer 108' as a second mask layer to further etching the upper fin structure 110. The shape of the fin structure 110 may be easier to control.

Figures 1, 8:
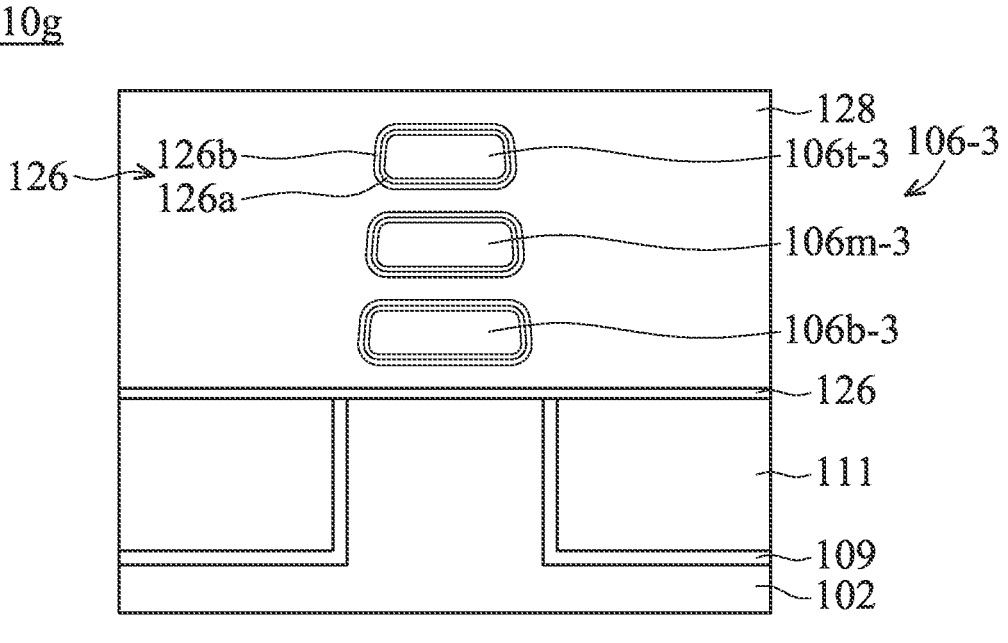
Figures 2, 8:
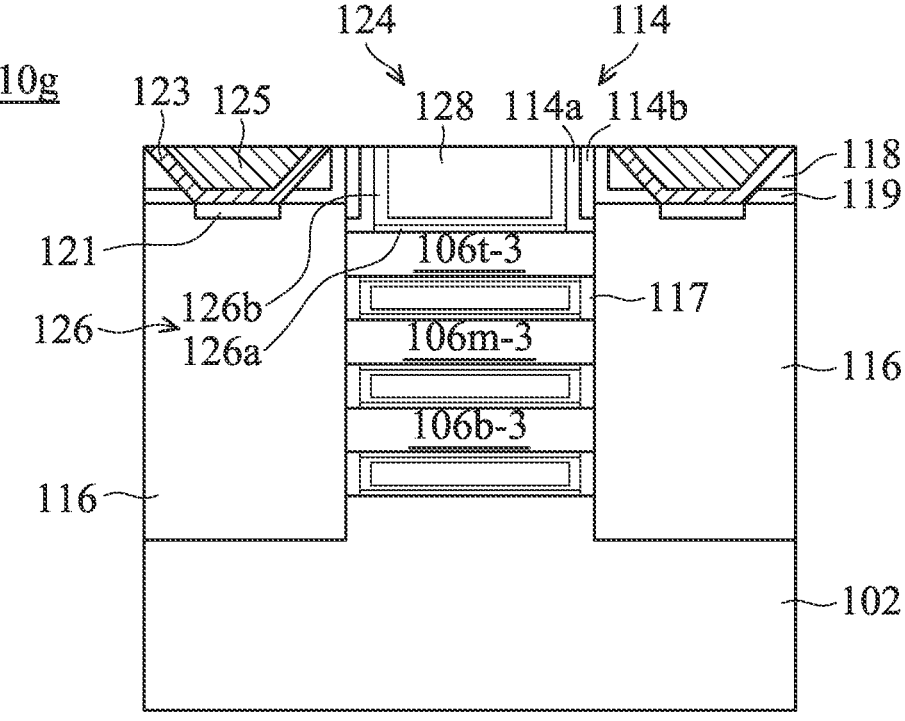

Many variations and/or modifications may be made to the embodiments of the disclosure. FIGS. 8-1 and 8-2 are cross-sectional representations of a semiconductor device structure 10g, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8-1 in accordance with some embodiments, the nanostructures 106-3 have round corners.

The processes similar to those shown in FIGS. 5A-1 to 5G-1, 5A-2 to 5G-2 and 5A-3 to 5C-3 may be performed, and a gate structure 124 is formed around nanostructures 106-3, as shown in FIGS. 8-1 and 8-2. In some embodiments, the gate structure 124 includes the dielectric layer 126, and the dielectric layer 126 includes an interfacial layer 126a and a high-k gate dielectric layer 126b. The nanostructures 106-3 may have round corners caused by the oxide deposition process forming the interfacial layer 126a. The oxidation occurs at the corners first, so the corner may be rounded after the oxidation process.

It should be noted that, although the nanostructures 106-3 shown in FIG. 8-1 have an upward trapezoid shape with round corners in the cross-sectional view, the nanostructures 106-3 may also have a rectangle shape with round corners, depending on the process forming the nanostructures 106-3. As long as the bottom nanostructure 106b-3 is wider than or has an width substantially equal to the middle nanostructure 106m-3, and the middle nanostructure 106m-3 is wider than or has an width substantially equal to the top nanostructure 106t-3, and the bottom nanostructure 106b-3 and the top nanostructure 106t-3 have different widths, better device performance may be achieved.

With wider bottom nanostructure 106b-3 and narrower top nanostructure 106t-3, the drive current may be higher and the total resistance may be lower while the device area remains. The nanostructures 106-3 may have round corners.

As described previously, by optimizing the etching process of forming the fin structure 110, the bottom nanostructures (e.g. the bottom nanostructures 106b-1, 106b-2 and 106b-3) are wider than the top nanostructures (e.g. the top nanostructures 106t-1, 106t-2 and 106t-3). Therefore, the drive current may be higher, and the total resistance may be lowered due to wider bottom nanostructures and middle nanostructures. In some embodiments as shown in FIGS. 2B-1, the fin structure 110 is formed by an oxidation process and an etching process, and the silicon germanium oxide 137 is removed before forming the nanostructures 106-1. In some embodiments as shown in FIGS. 3A-1, the silicon germanium oxides 137 formed during the oxidation process are removed before forming the dummy gate structure 213b. In some embodiments as shown in FIG. 4A-1, the silicon germanium oxides 137 formed during the oxidation process are partially removed during removing the silicon oxides 136 and are completely removed before forming the dummy gate structure 213c. In some embodiments as shown in FIG. 5A-1, the fin structure 110 has tapered sidewalls. In some embodiments as shown in FIGS. 6A-1 and 6C-1, the wider nanostructure 106b-2 and narrower top nanostructure 106t-2 are formed by multiple mask layers 130a and 130b. In some embodiments as shown in FIGS. 7A-1 and 7B-1, the wider nanostructure 106b-2 and narrower top nanostructure 106t-2 are formed by the mask layer 130a and the patterned pad layer 108'. In some embodiments as shown in FIG. 8-1, the nanostructures 106-3 have round corners.

Embodiments of a semiconductor device structure and a method for forming the same are provided. The method for forming the semiconductor device structure may include forming a wider bottom nanostructure and a narrower top nanostructure. With bottom nanostructure wider than the top nanostructure, the drive current may be higher, and the total resistance may be lowered.

In some embodiments, a method for forming a semiconductor device structure is provided. The method for forming a semiconductor device structure includes forming alternating first semiconductor layers and second semiconductor layers stacked over a substrate. The method for forming a semiconductor device structure also includes etching the first semiconductor layers and the second semiconductor layers to form a fin structure. The method for forming a semiconductor device structure also includes oxidizing sidewalls of the first semiconductor layers to form first oxidized portions of the first semiconductor layers and oxidizing sidewalls of the second semiconductor layers to form second oxidized portions of the second semiconductor layers. The method for forming a semiconductor device structure also includes removing the second oxides over the sidewalls of the second semiconductor layers. After removing the second oxidized portions, an upper layer of the second semiconductor layers is narrower than a lower layer of the second semiconductor layers. The method for forming a semiconductor device structure also includes removing the first semiconductor layers to form a gate opening between the second semiconductor layers. The method for forming a semiconductor device structure also includes forming a gate structure in the gate opening, the gate structure surrounding the second semiconductor layers.

In some embodiments, a method for forming a semiconductor device structure is provided. The method for forming a semiconductor device structure includes forming a bottom second semiconductor layer, a middle second semiconductor layer, and a top second semiconductor layer with first semiconductor layers formed therebetween over a substrate. The method for forming a semiconductor device structure also includes patterning the bottom second semiconductor layer, the middle second semiconductor layer, the top second semiconductor layer, and the first semiconductor layers to form a fin structure. The first mask layer has a first width. The method for forming a semiconductor device structure also includes diminishing the top second semiconductor layer to have a second width. The second width is smaller than the first width. The method for forming a semiconductor device structure also includes forming a dummy gate structure across the fin structure. The method for forming a semiconductor device structure also includes forming source/drain epitaxial structures on opposite sides of the dummy gate structure. The method for forming a semiconductor device structure also includes removing the dummy gate structure and the first semiconductor layers. The method for forming a semiconductor device structure also includes forming a gate structure surrounding the second semiconductor layers.

In some embodiments, a semiconductor device structure is provided. The semiconductor device structure includes a bottom nanostructure, a middle nanostructure, and a top nanostructure formed over a substrate. The semiconductor device structure further includes a gate structure wrapped around the bottom nanostructure, the middle nanostructure, and the top nanostructure. The semiconductor device structure further includes spacer layers formed over opposite sides of the gate structure. The semiconductor device structure further includes source/drain epitaxial structures formed over opposite sides of the gate structure. The bottom nanostructure is wider than the middle nanostructure, and the middle nanostructure and the top nanostructure has substantially a same width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, the method comprising:
    forming alternating first semiconductor layers and second semiconductor layers stacked over a substrate;

etching the first semiconductor layers and the second semiconductor layers to form a fin structure;
    oxidizing sidewalls of the first semiconductor layers to form first oxidized portions of the first semiconductor layers and oxidizing sidewalls of the second semiconductor layers to form second oxidized portions of the second semiconductor layers, wherein the second oxidized portion of the second semiconductor layers on a sidewall of an upper layer of the second semiconductor layers is thicker than the second oxidized portion of the second semiconductor layers on a sidewall of a lower layer of the second semiconductor layers;
    removing the second oxidized portions of the second semiconductor layers, wherein, after removing the second oxidized portions, the upper layer of the second semiconductor layers is narrower than the lower layer of the second semiconductor layers;
    removing the first semiconductor layers to form a gate opening between the second semiconductor layers; and
    forming a gate structure in the gate opening, the gate structure surrounding the second semiconductor layers.

2. The method of claim 1, further comprising:
    removing the first oxidized portions of the first semiconductor layers, wherein after removing the first oxidized portions, an upper layer of the first semiconductor layers is narrower than a lower layer of the first semiconductor layers.

3. The method of claim 1, further comprising:
    forming a dummy gate structure covering the fin structure before removing the first semiconductor layers; and
    removing the first oxidized portions of the first semiconductor layers, wherein the dummy gate structure is in direct contact with the first oxidized portions of the first semiconductor layers.

4. The method of claim 3, wherein an extending portion of the dummy gate structure is sandwiched between the first oxidized portions.

5. The method of claim 1, further comprising:
    removing the first oxidized portions of the first semiconductor layers; and
    forming a dummy gate structure covering the fin structure after removing the first oxidized portions of the first semiconductor layers.

6. The method of claim 1, further comprising:
    partially removing the first oxidized portions of the first semiconductor layers while removing the second oxidized portions of the second semiconductor layers;
    after the second oxidized portions of the second semiconductor layers are completely removed, fully removing the first oxidized portions of the first semiconductor layers; and
    forming a dummy gate structure covering the fin structure after fully removing the first oxidized portions of the first semiconductor layers.

7. The method of claim 1, wherein after removing the second oxidized portions, the second semiconductor layers have tapered sidewalls.

8. The method of claim 1, further comprising:
    forming an isolation structure around a base portion of the fin structure, wherein the upper layer of the second semiconductor layers is narrower than the base portion of the fin structure.

9. The method of claim 8, further comprising:
    partially removing the isolation structure before removing the first semiconductor layers.

10. The method of claim 9, further comprising:

forming a liner layer around the base portion of the fin structure before forming the isolation structure, wherein a top surface of the isolation structure is lower than a top surface of the liner layer.

11. A method for forming a semiconductor device structure, comprising:

forming a bottom second semiconductor layer, a middle second semiconductor layer, and a top second semiconductor layer with first semiconductor layers formed therebetween over a substrate;

patterning the bottom second semiconductor layer, the middle second semiconductor layer, the top second semiconductor layer, and the first semiconductor layers using a first mask layer to form a fin structure, wherein the first mask layer has a first width along a first line after patterning;

after patterning to form the fin structure, thinning the top second semiconductor layer to have a second width after thinning, wherein thinning reduces a width of the top second semiconductor layer, wherein the second width is smaller than the first width along a second line parallel to the first line, wherein after thinning the width of the top second semiconductor layer is less than a width of the bottom second semiconductor layer, wherein the first mask layer remains while thinning the top second semiconductor layer;

after thinning, forming a dummy gate structure across the fin structure, wherein a longitudinal axis of the dummy gate structure is parallel to the first line and the second line;

forming source/drain epitaxial structures on opposite sides of the dummy gate structure;

removing the dummy gate structure and the first semiconductor layers; and forming a gate structure surrounding the second semiconductor layers.

12. The method of claim 11, wherein thinning the top second semiconductor layer comprises:

after patterning the bottom second semiconductor layer, the middle second semiconductor layer, the top second semiconductor layer, forming a second mask layer over the top second semiconductor layer, wherein the top second semiconductor layer is diminished using the second mask layer; and etching the top second semiconductor layer.

13. The method of claim 12, wherein the first mask layer is wider than the second mask layer.

14. The method of claim 11, wherein the middle second semiconductor layer has an equal width as the top second semiconductor layer or the bottom second semiconductor layer, wherein the bottom second semiconductor layer and the top second semiconductor layer have different widths.

15. The method of claim 11, further comprising:

forming a pad layer over the top second semiconductor layer; and removing the pad layer after patterning the bottom second semiconductor layer, the middle second semiconductor layer, the top second semiconductor layer to form the fin structure.

16. The method of claim 15, wherein thinning the top second semiconductor layer comprises:

prior to removing the pad layer, trimming the pad layer to form a trimmed pad layer after patterning the bottom second semiconductor layer, the middle second semiconductor layer, the top second semiconductor layer; and etching the top second semiconductor layer using the trimmed pad layer as a mask.

17. The method of claim 11, further comprising:

after patterning to form the fin structure, thinning the middle second semiconductor layer to have a third width, wherein the third width is smaller than the first width along a third line parallel to the first line, wherein the first mask layer remains while thinning the middle second semiconductor layer, wherein thinning the top second semiconductor layer comprises forming a first oxidized portion, wherein thinning the middle second semiconductor layer comprises forming a second oxidized portion, wherein the first oxidized portion is thicker than the second oxidized portion.

18. A method for forming a semiconductor device structure, the method comprising:

forming a stack of nanostructures over a substrate, the stack of nanostructures including a bottom nanostructure, a middle nanostructure over the bottom nanostructure, and a top nanostructure over the middle nanostructure, wherein the bottom nanostructure is wider than the middle nanostructure along a first direction, and the middle nanostructure and the top nanostructure have a same width along the first direction;

forming a gate structure wrapped around the bottom nanostructure, the middle nanostructure, and the top nanostructure, a longitudinal axis of the gate structure extending parallel to the first direction;

forming spacer layers formed over opposite sides of the gate structure; and forming a first source/drain epitaxial structure and a second source/drain epitaxial structure, the first source/drain epitaxial structure being on an opposite side of the gate structure than the second source/drain epitaxial structure, wherein the first source/drain epitaxial structure contacts each of the bottom nanostructure, the middle nanostructure and the top nanostructure, wherein the second source/drain epitaxial structure contacts each of the bottom nanostructure, the middle nanostructure and the top nanostructure.

19. The method of claim 18, wherein the bottom nanostructure, the middle nanostructure, and the top nanostructure have rounded corners in a cross-sectional view parallel to the longitudinal axis of the gate structure.

20. The method of claim 18, further comprising:

forming a base portion of a fin structure protruding from the substrate, wherein the stack of nanostructures is over the base portion of the fin structure; and forming an isolation structure on opposing sides of the base portion of the fin structure, wherein the base portion of the fin structure is wider than the top nanostructure.

* * * * *